United States Patent
Hiroshima et al.

(10) Patent No.: US 9,572,293 B2
(45) Date of Patent: Feb. 14, 2017

(54) PLACEMENT APPARATUS AND A SUCTION NOZZLE FOR AN OPTICAL COMPONENT

(71) Applicant: FUJITSU LIMITED, Kawasaki-shi, Kanagawa (JP)

(72) Inventors: Yoshiyuki Hiroshima, Nakano (JP); Naoki Nakamura, Hachioji (JP); Akiko Matsui, Meguro (JP); Tetsuro Yamada, Kawasaki (JP); Takahiro Ooi, Kawasaki (JP); Kohei Choraku, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 356 days.

(21) Appl. No.: 14/167,246

(22) Filed: Jan. 29, 2014

(65) Prior Publication Data
US 2014/0283380 A1 Sep. 25, 2014

(30) Foreign Application Priority Data
Mar. 25, 2013 (JP) .................................. 2013-062316

(51) Int. Cl.
*H05K 13/00* (2006.01)
*H05K 13/04* (2006.01)
*H05K 3/34* (2006.01)

(52) U.S. Cl.
CPC ........ *H05K 13/0408* (2013.01); *H05K 13/046* (2013.01); *H05K 3/3436* (2013.01);
(Continued)

(58) Field of Classification Search
CPC ............... H01L 21/67; H01L 21/67144; H01L 2021/67; H01L 2021/67144; H05K 3/3436; H05K 13/0408; H05K 13/046; H05K 2201/10121; H05K 2203/166; Y10T 29/49131
See application file for complete search history.

(56) References Cited

U.S. PATENT DOCUMENTS 5,628,660 A * 5/1997 Onitsuka ............ H05K 13/0408
228/105
5,667,129 A * 9/1997 Morita ............... H05K 13/0413
228/102

(Continued)

FOREIGN PATENT DOCUMENTS

JP 2002-009380 A 1/2002
JP 2002-164700 A 6/2002
(Continued)

OTHER PUBLICATIONS

Notification of Reasons for Refusal dated Nov. 22, 2016 corresponding to Japanese Patent Application No. 2013-062316 and English translation thereof.

*Primary Examiner* — Carl Arbes
(74) *Attorney, Agent, or Firm* — Squire Patton Boggs (US) LLP

(57) ABSTRACT

A placement apparatus for an optical component includes: a suction nozzle that includes a nozzle main body having a suction surface having a suction port, an optical component being sucked to the suction port, a plurality of nozzle electrodes disposed on the suction surface, each of the nozzle electrodes being brought into contact with a corresponding one of a plurality of component electrodes provided on the optical component so as to establish electrical conduction between each of the plurality of nozzle electrodes and a corresponding one of the plurality of component electrodes.

14 Claims, 50 Drawing Sheets

(52) U.S. Cl.
CPC ............. *H05K 2201/10121* (2013.01); *H05K 2203/166* (2013.01); *Y10T 29/49131* (2015.01)

(56) References Cited

U.S. PATENT DOCUMENTS

| | | |
|---|---|---|
| 2005/0213620 A1 | 9/2005 | Oda et al. |
| 2006/0209910 A1 | 9/2006 | Fukunaga |
| 2008/0040917 A1* | 2/2008 | Narita ............... H01L 21/67132 29/740 |
| 2010/0325884 A1 | 12/2010 | Nishino et al. |

FOREIGN PATENT DOCUMENTS

| | | |
|---|---|---|
| JP | 2003-188451 A | 7/2003 |
| JP | 2005-285889 A | 10/2005 |
| JP | 2007-141972 A | 6/2007 |
| JP | 2011-9654 A | 1/2011 |
| WO | WO 2005/029658 A1 | 3/2005 |

* cited by examiner

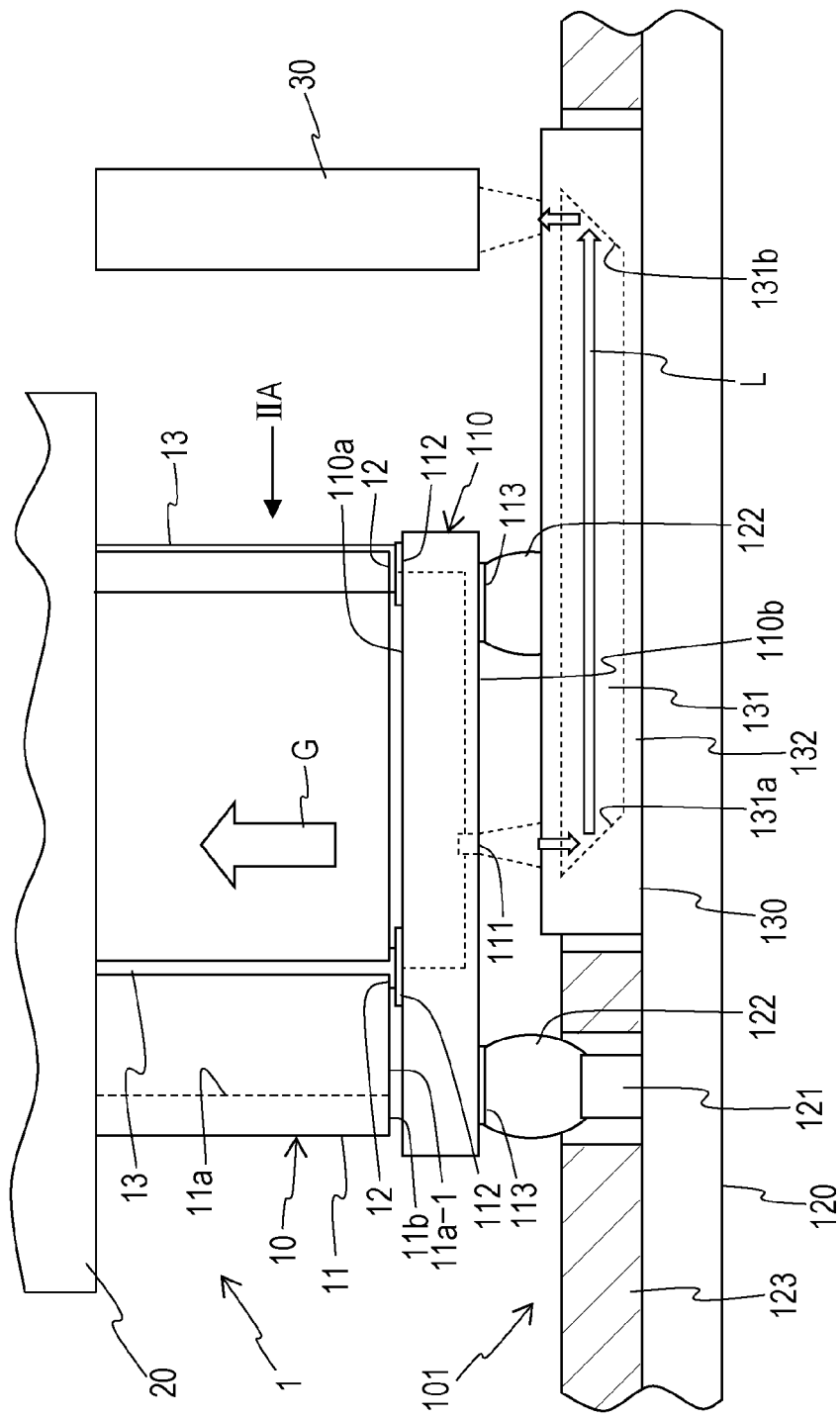

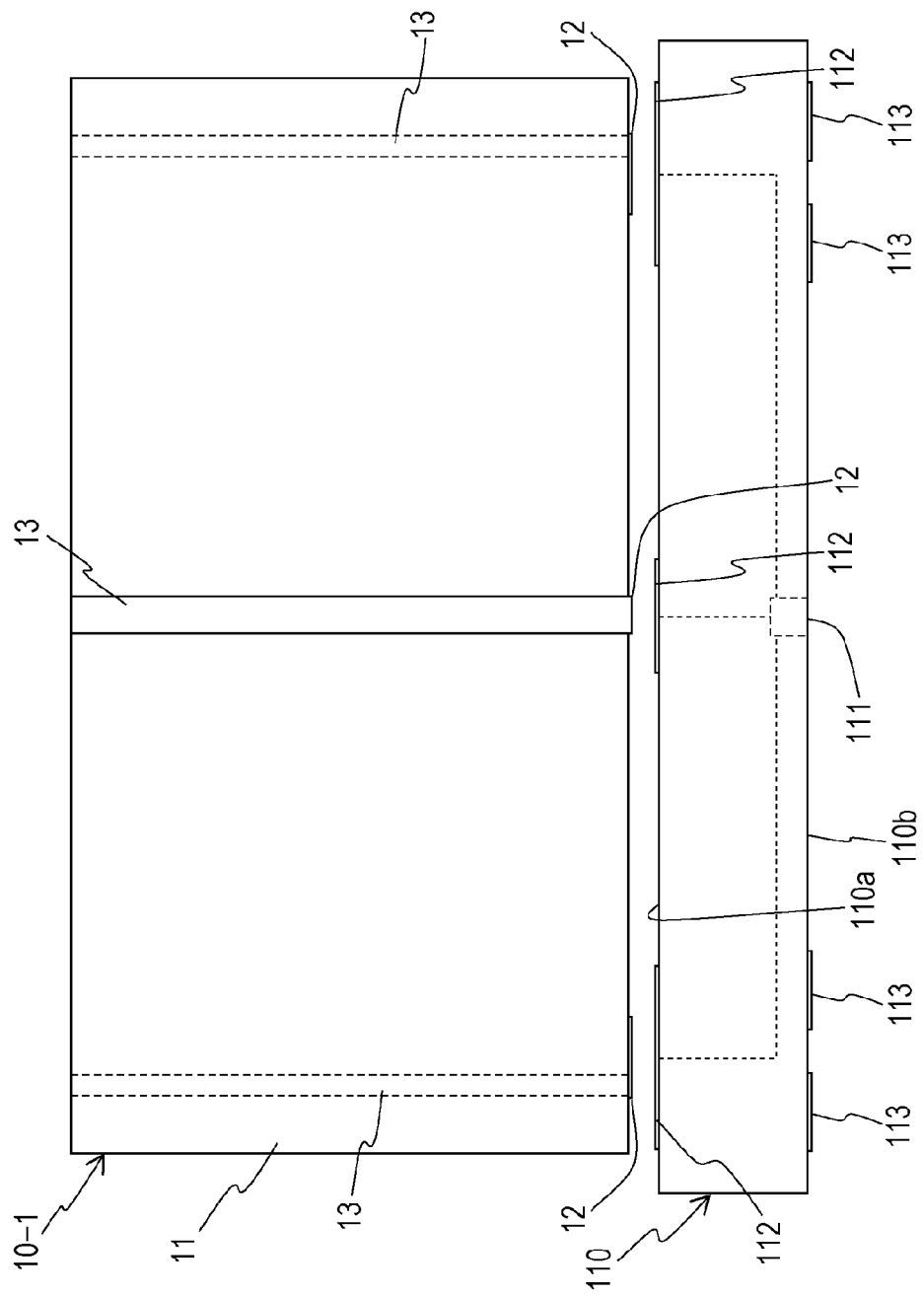

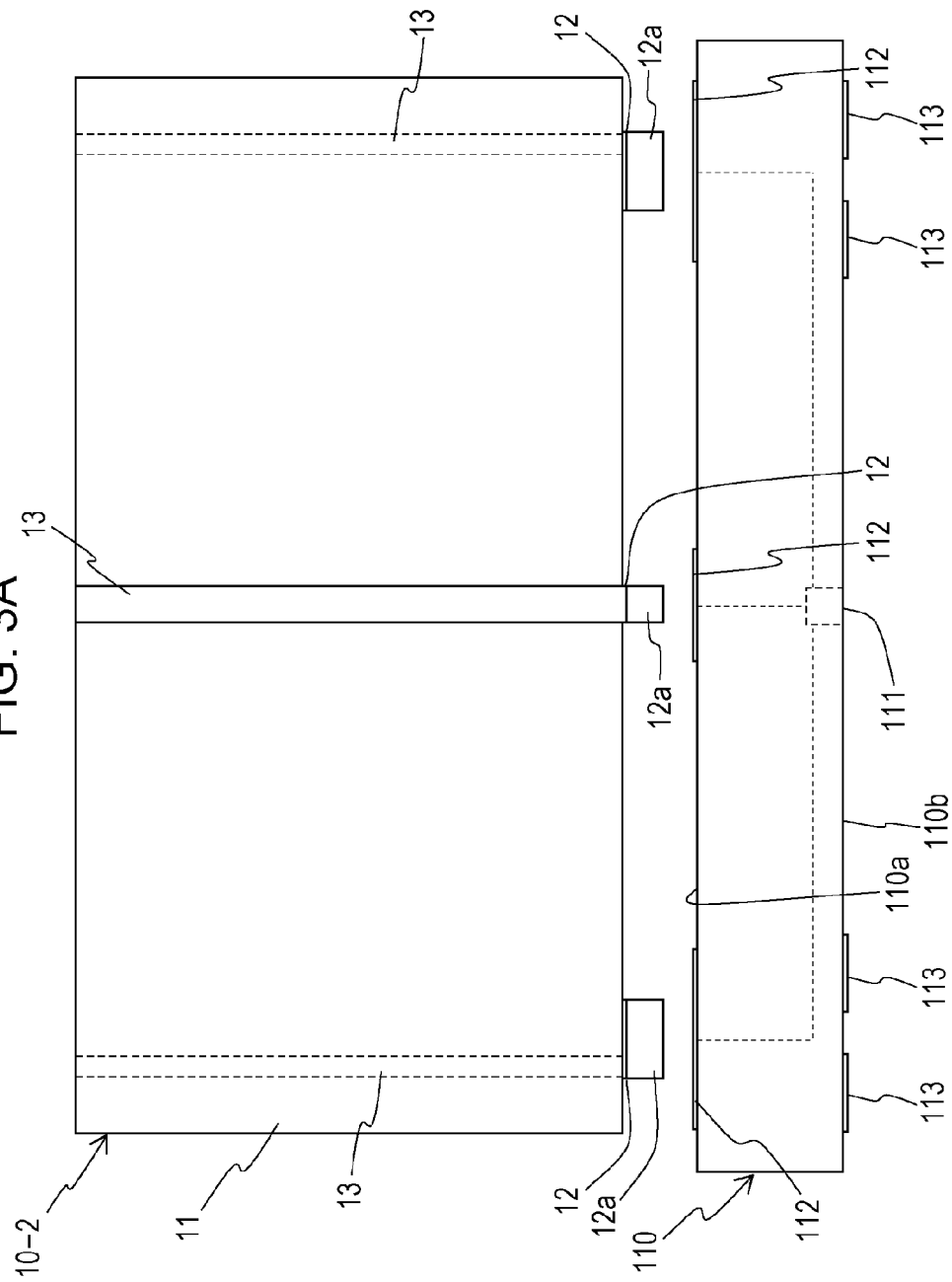

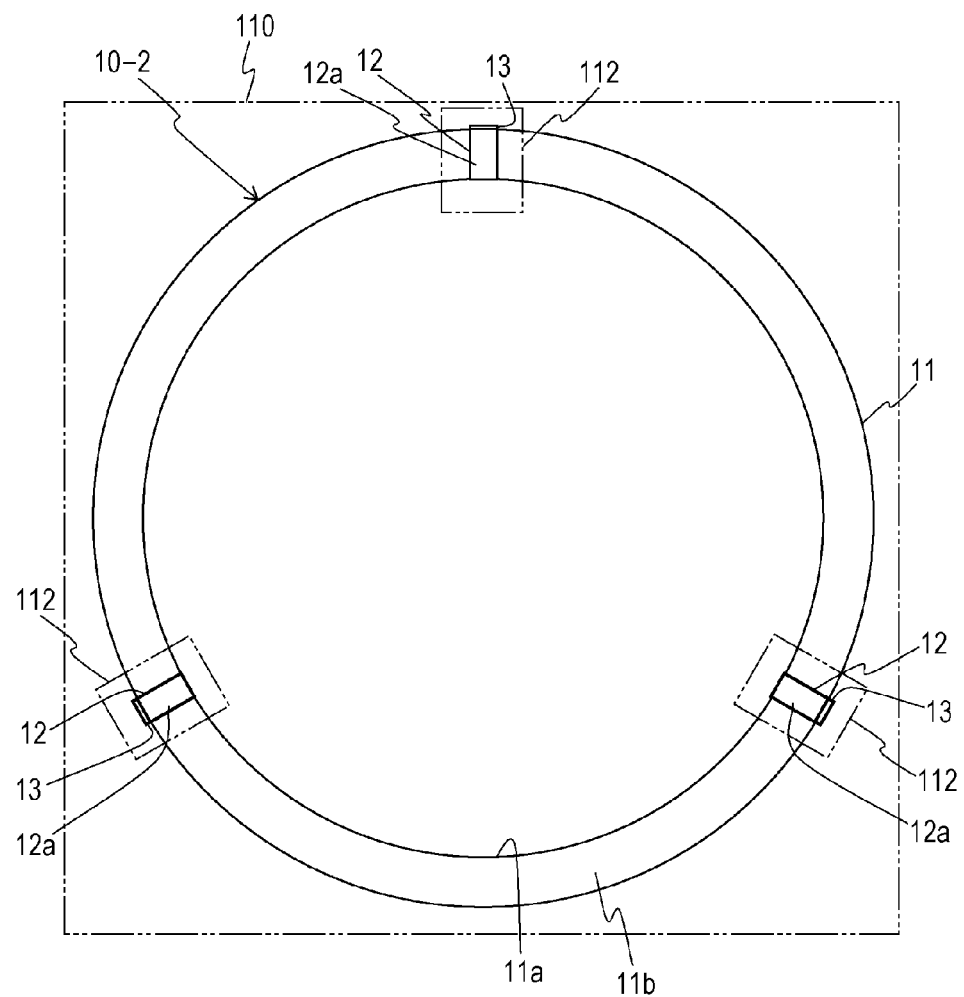

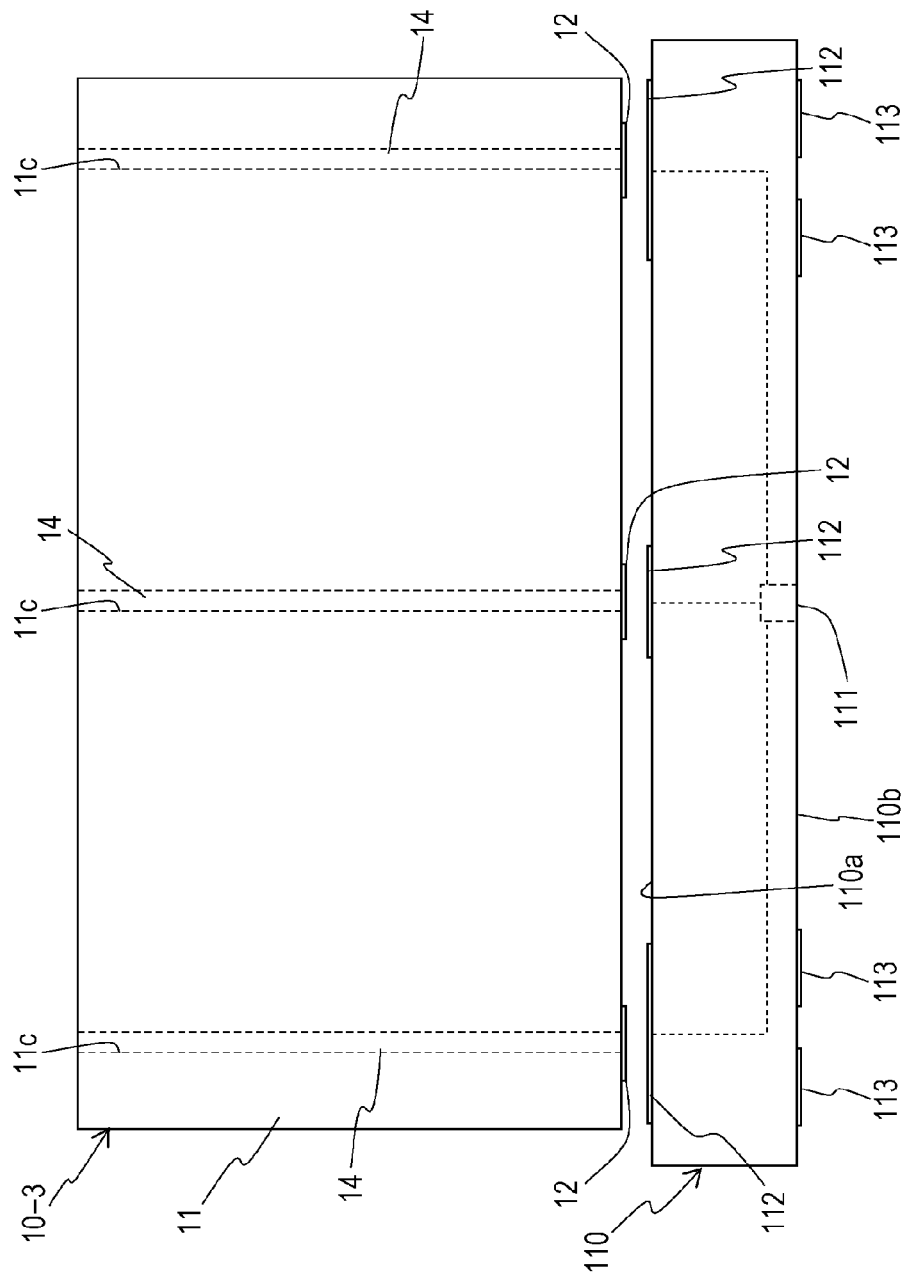

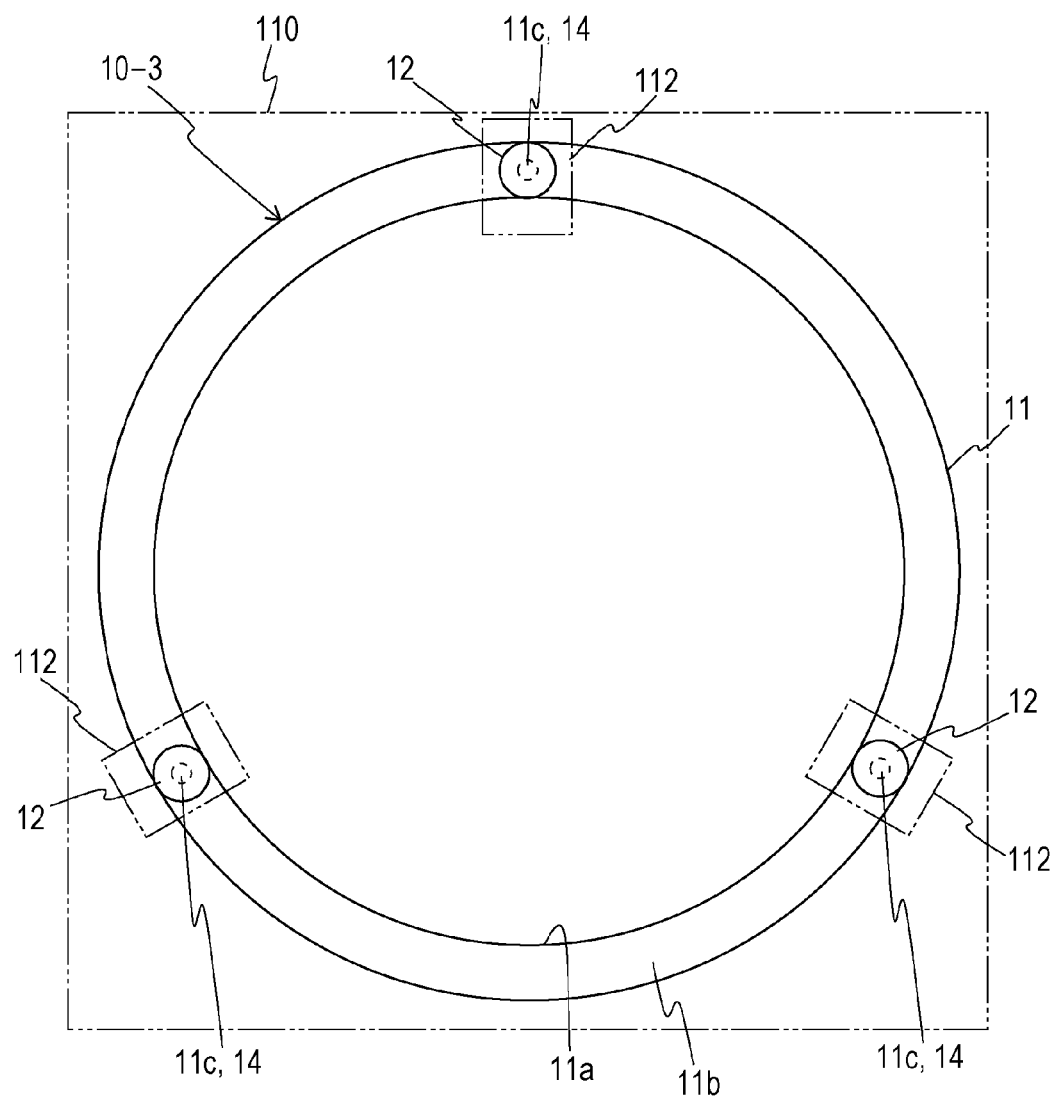

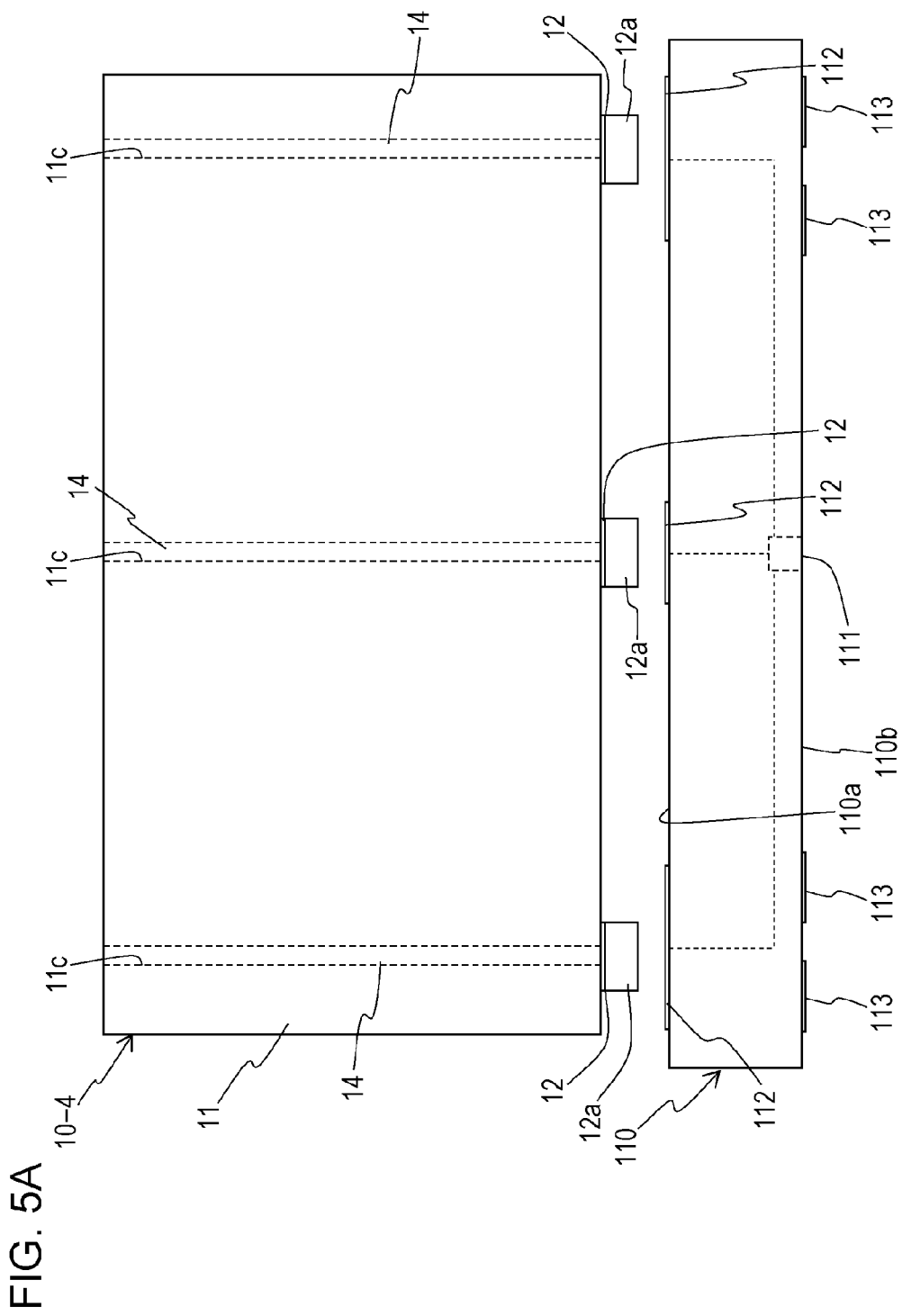

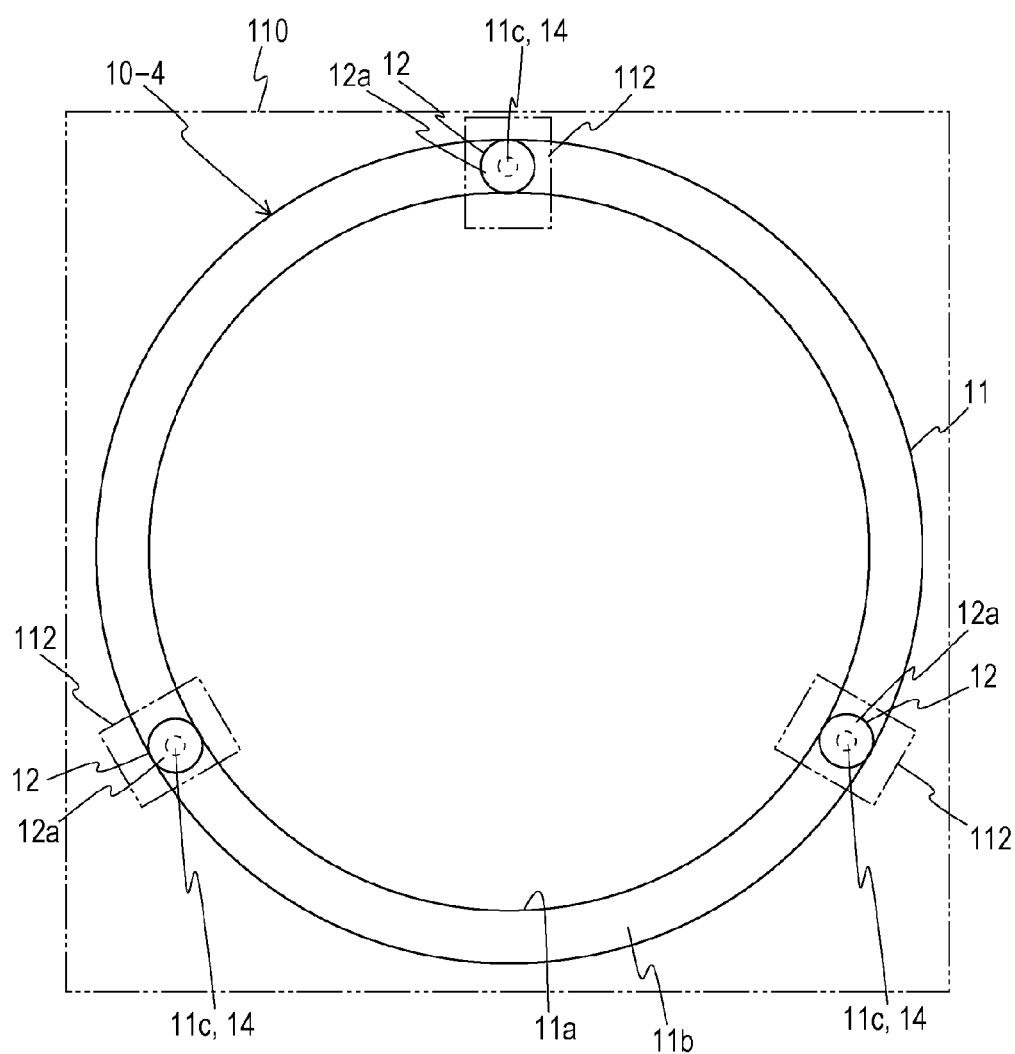

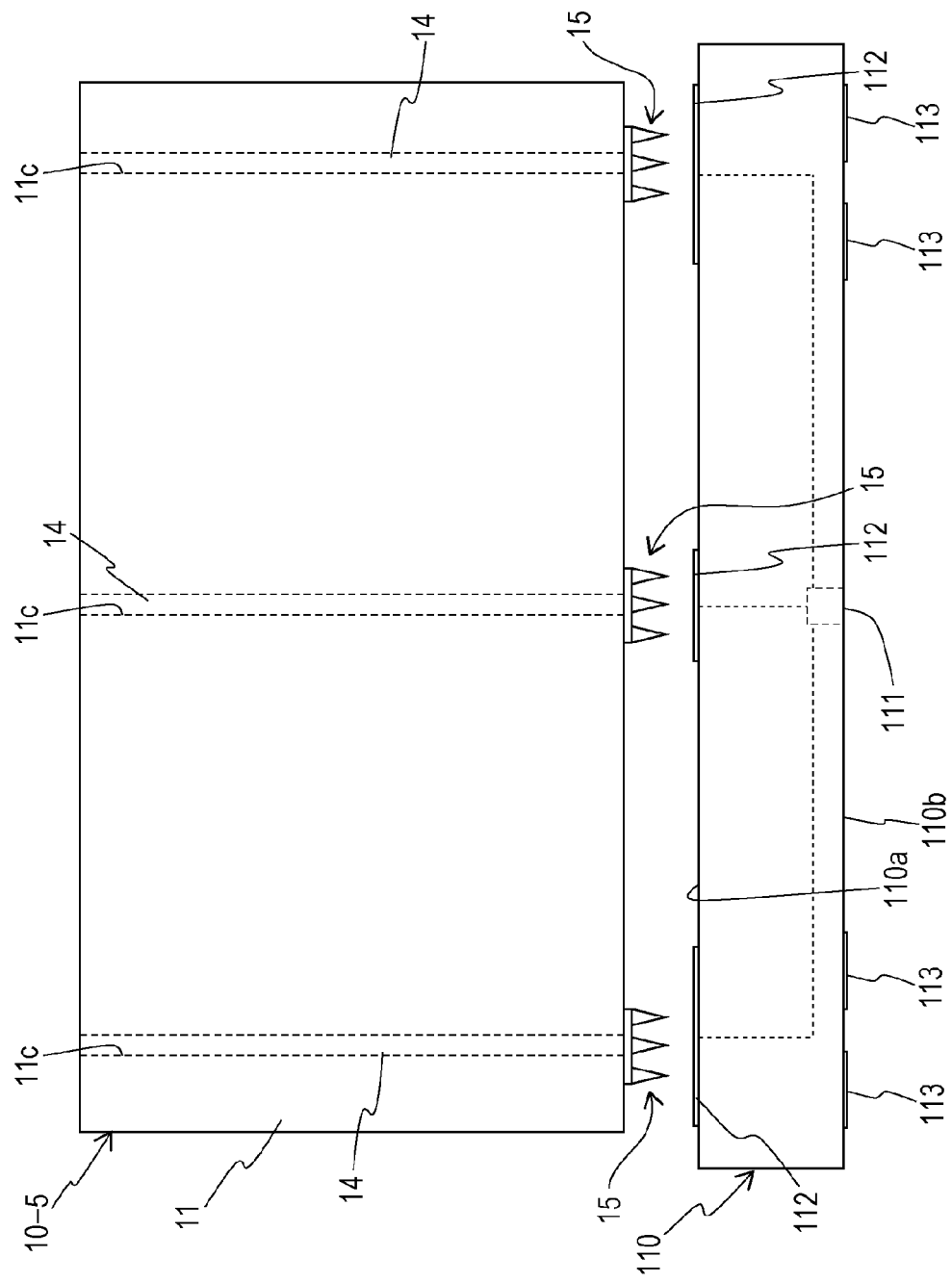

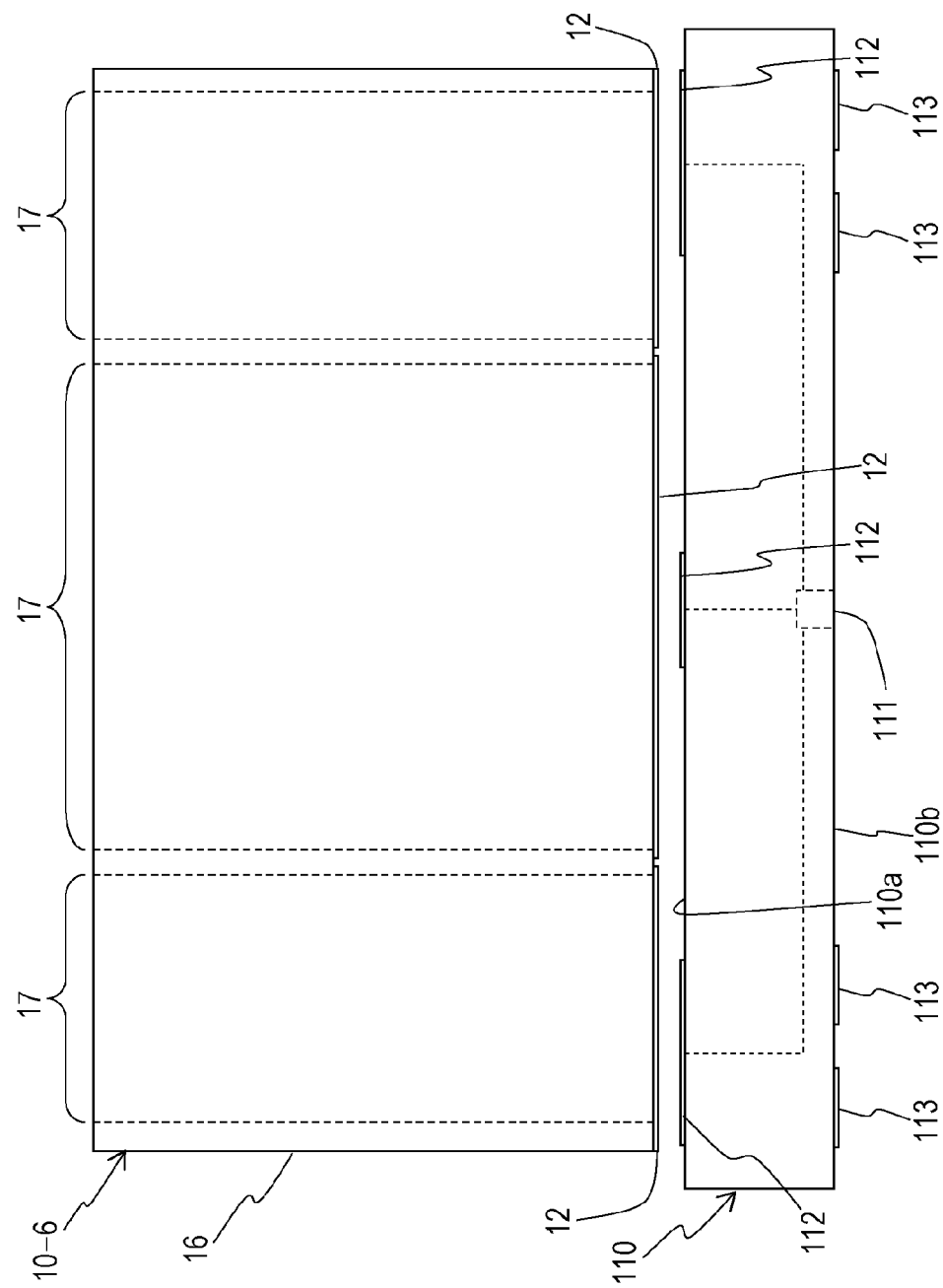

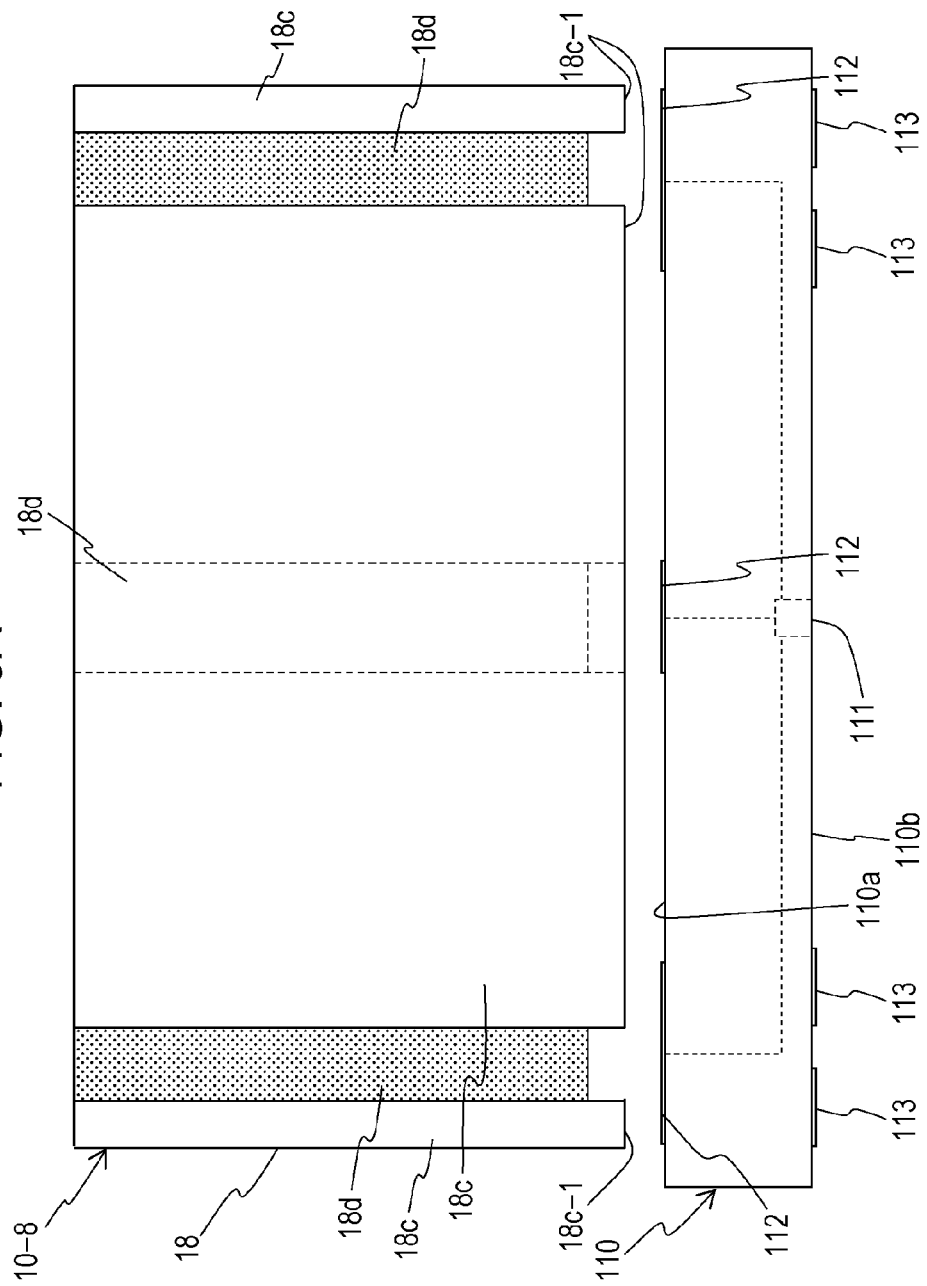

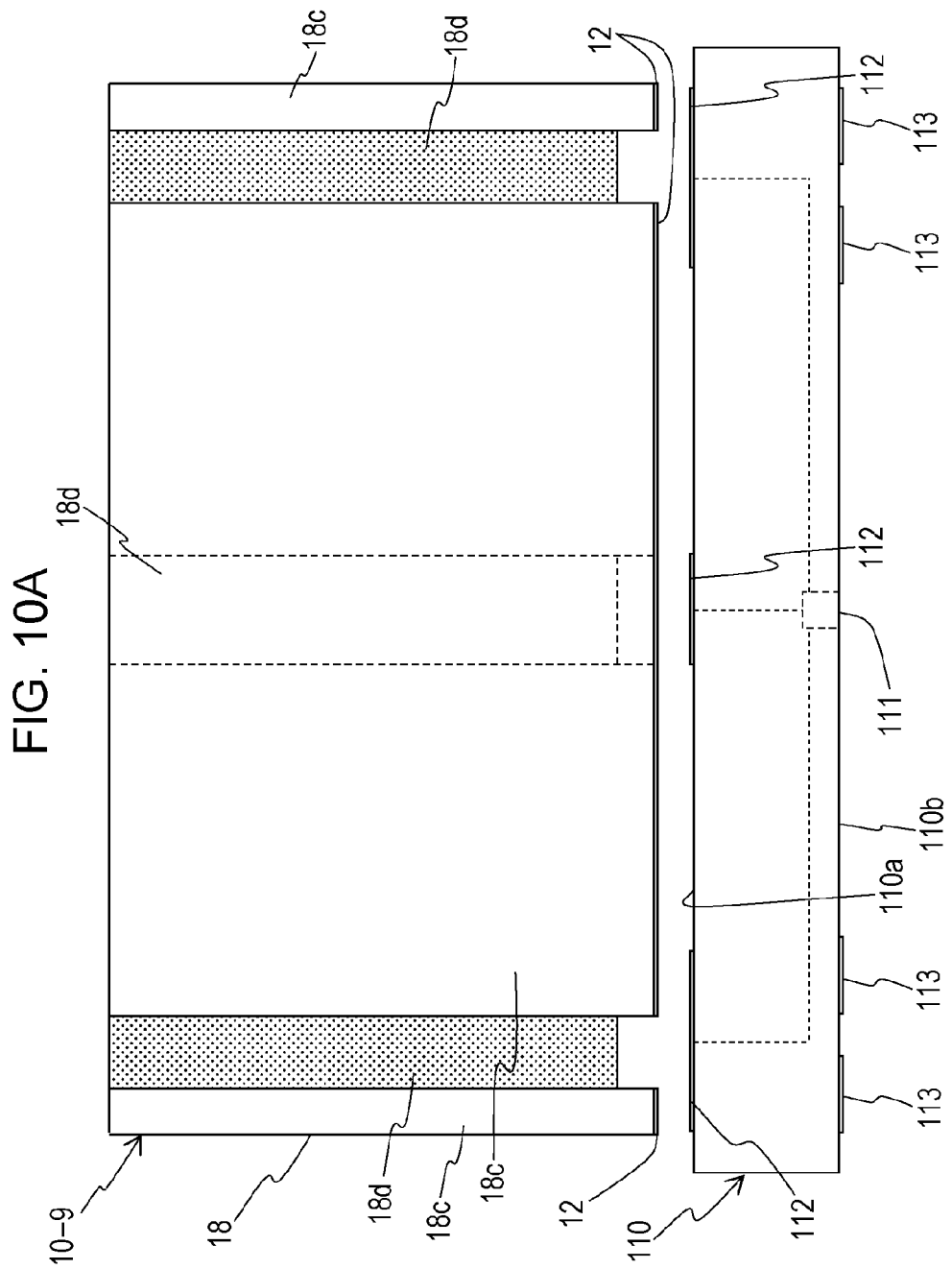

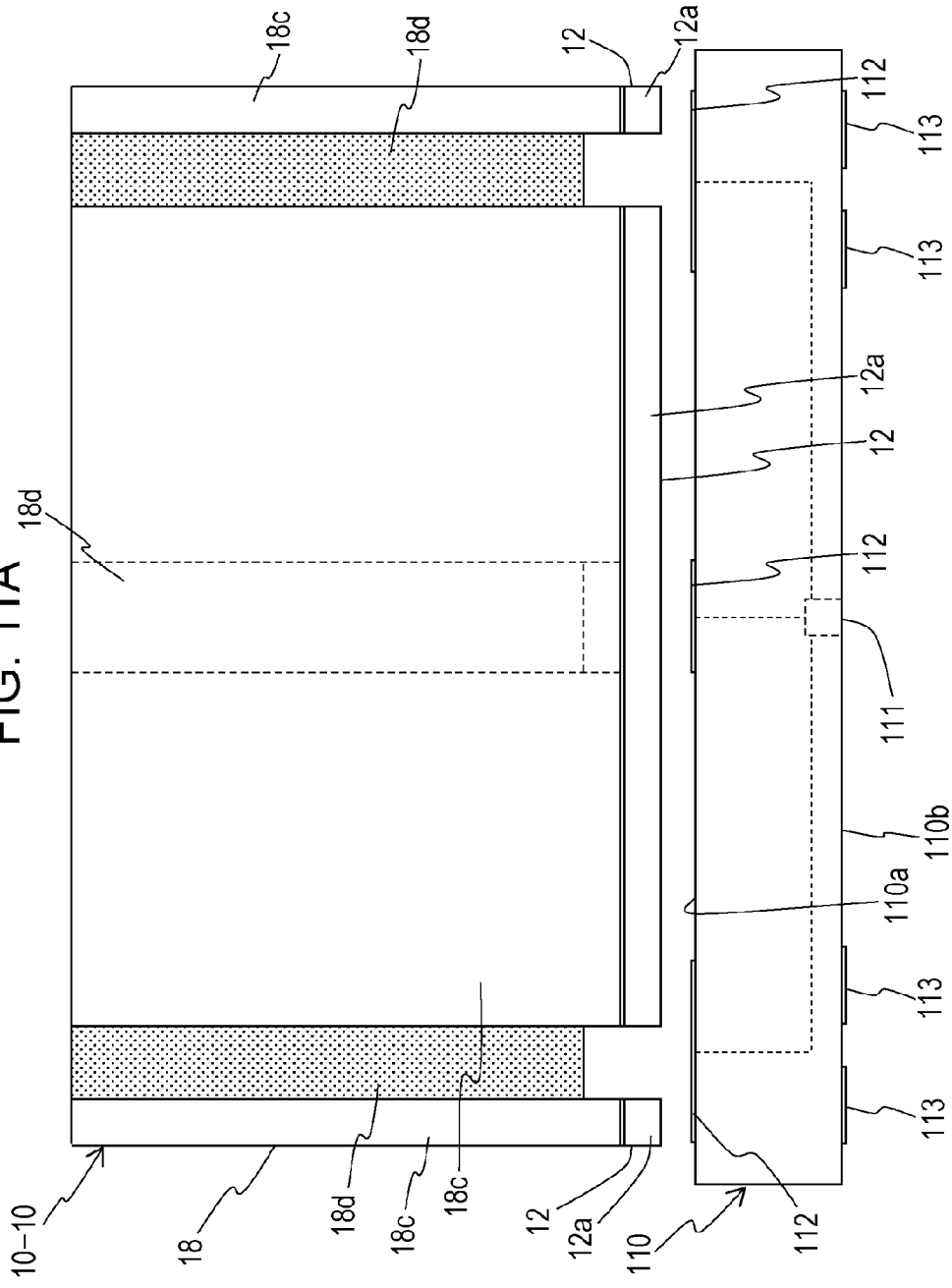

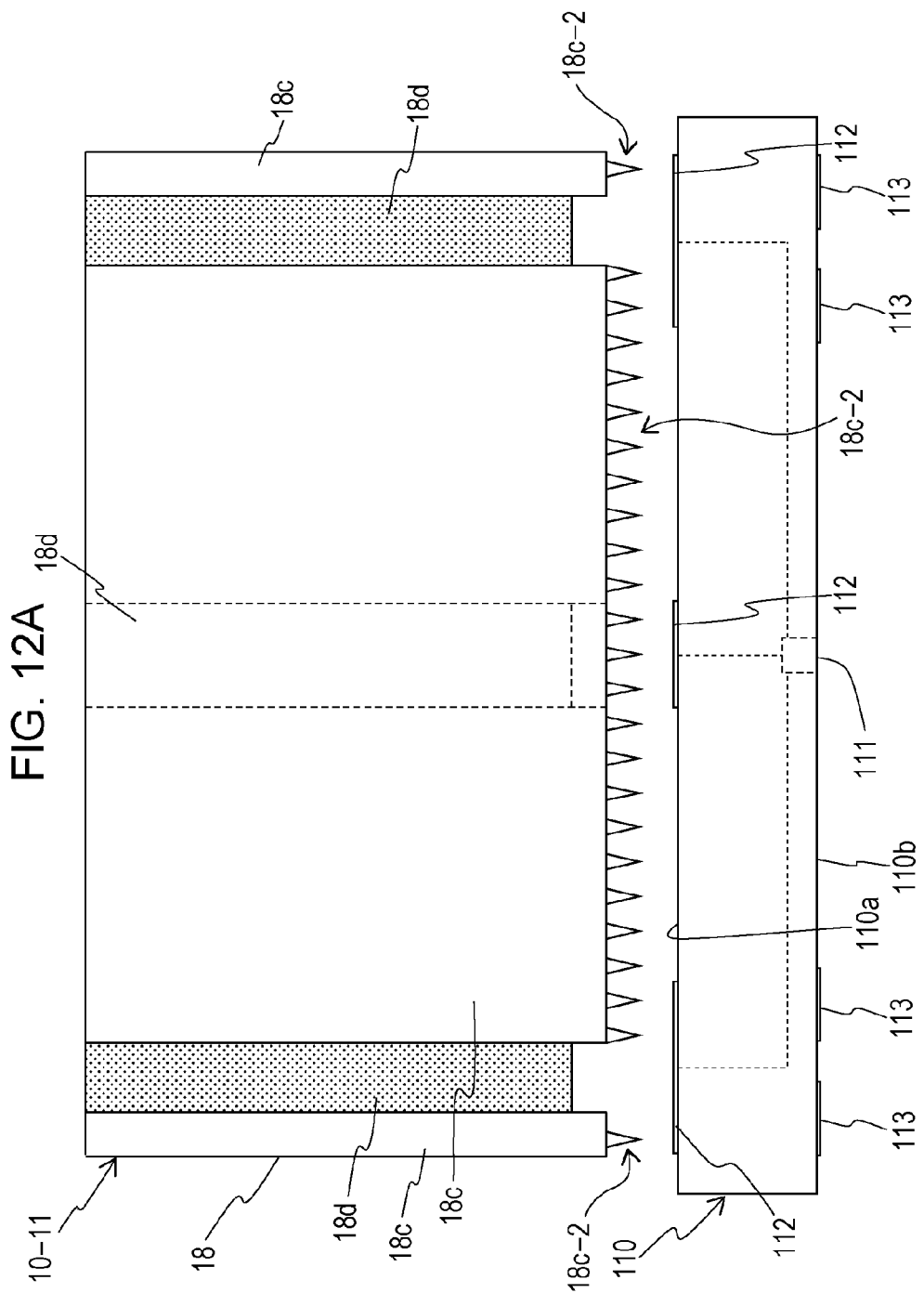

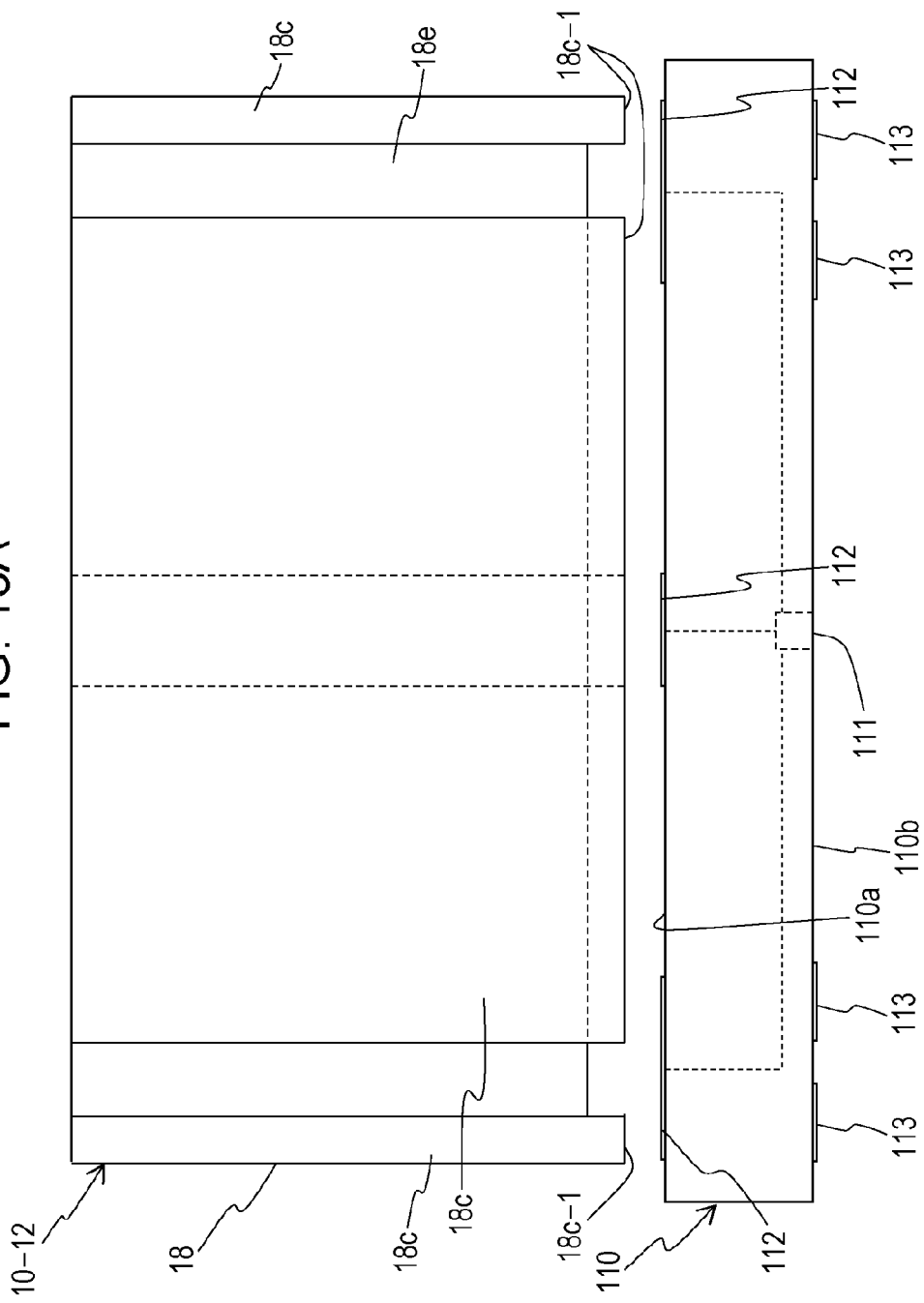

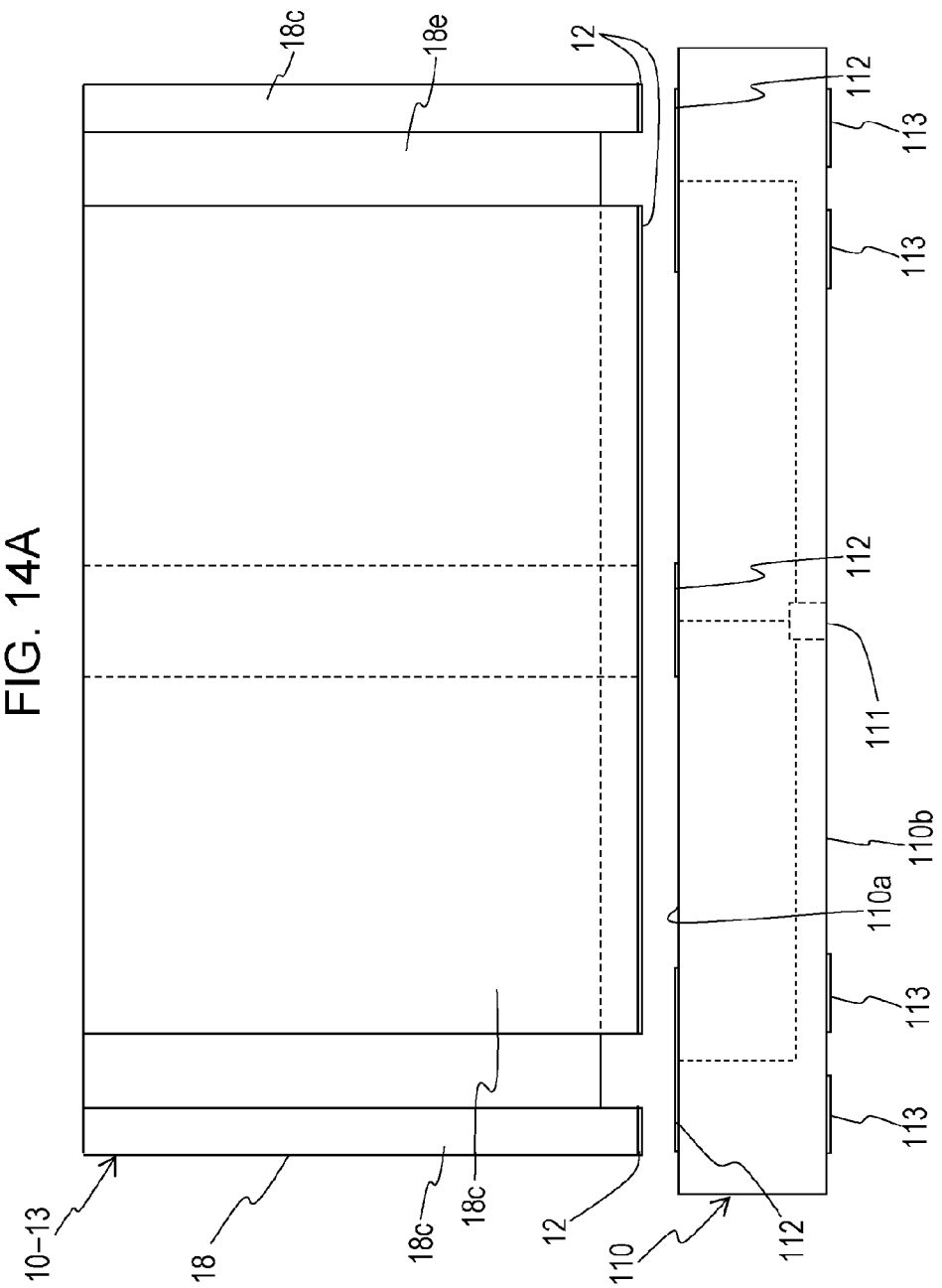

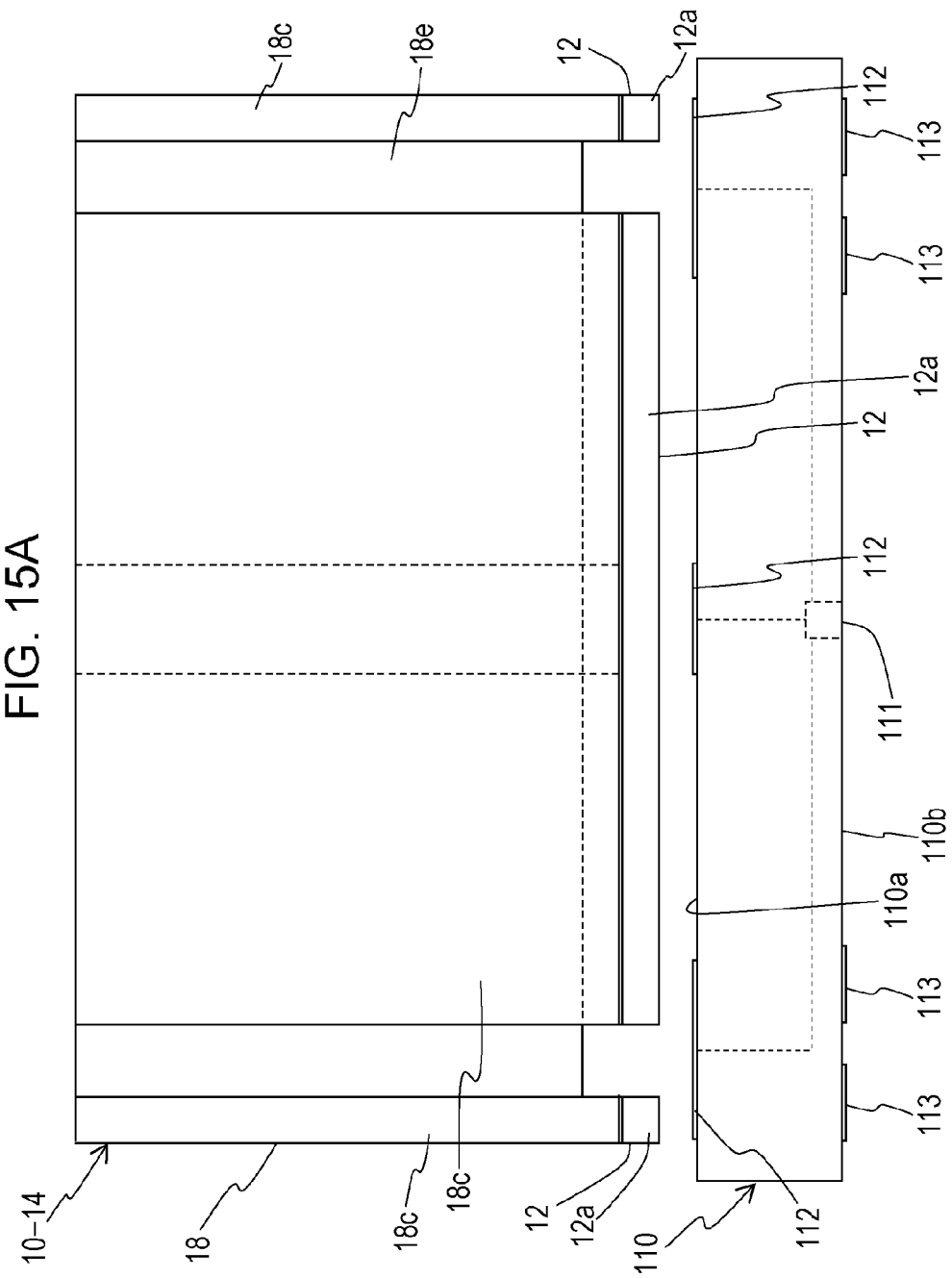

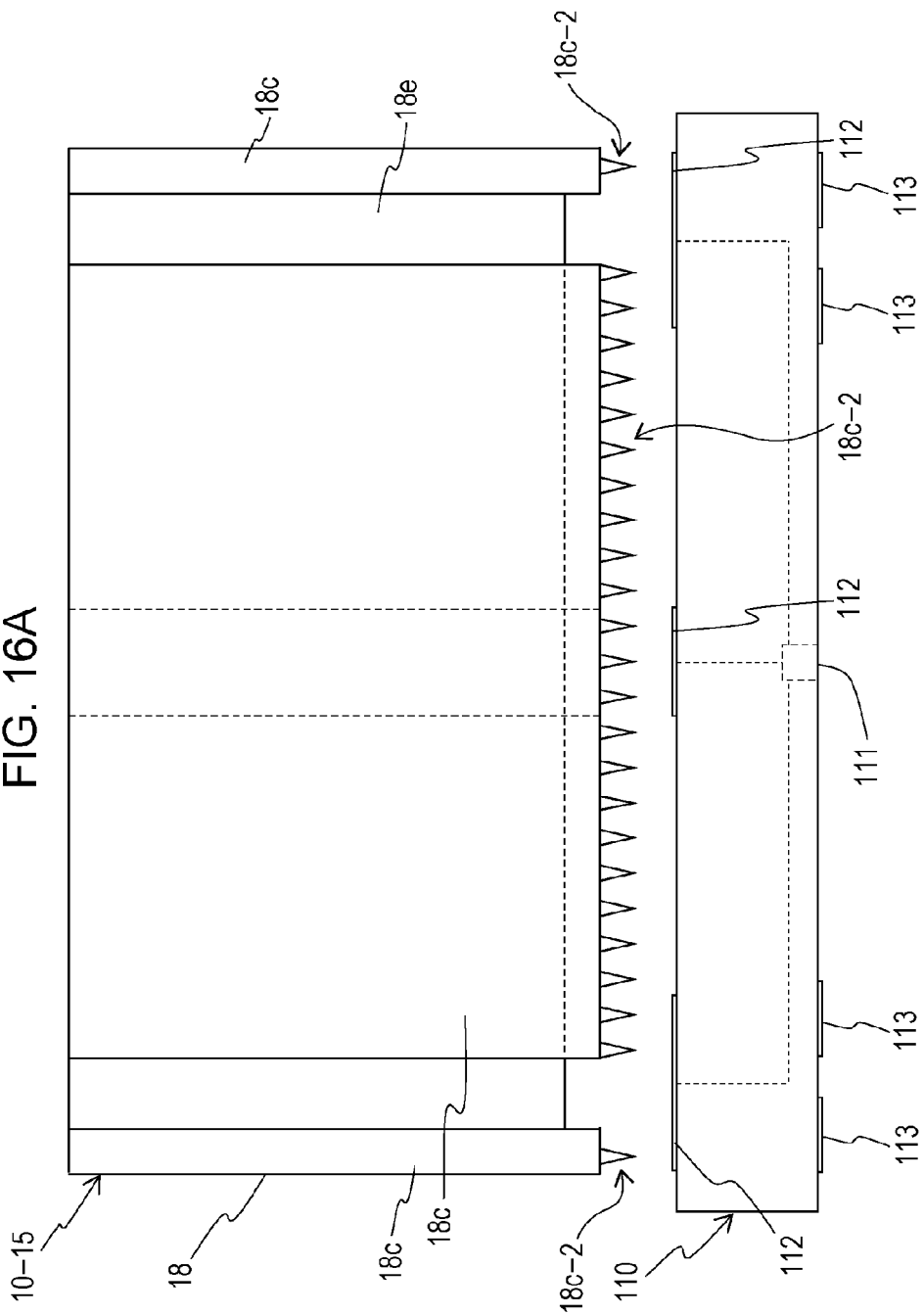

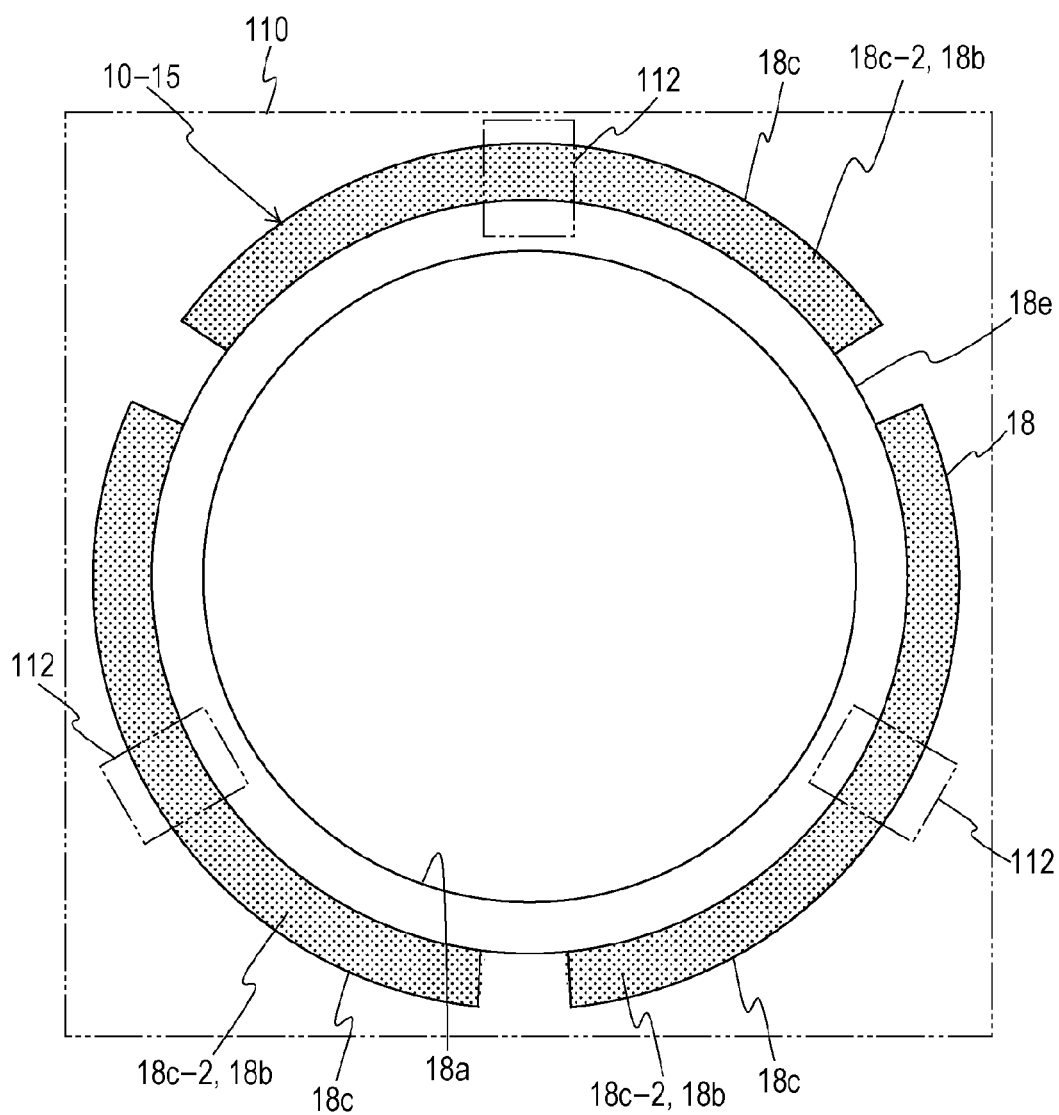

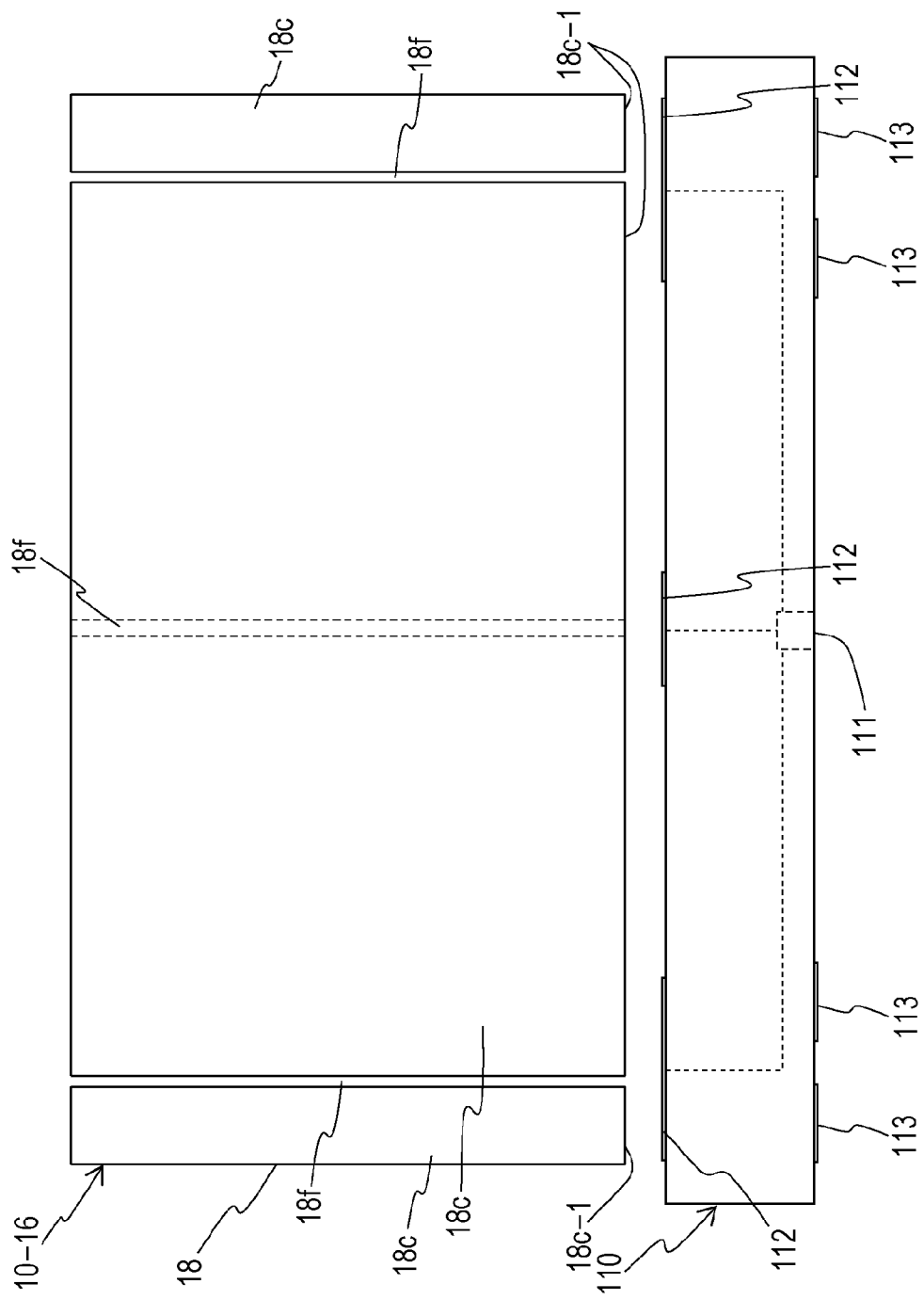

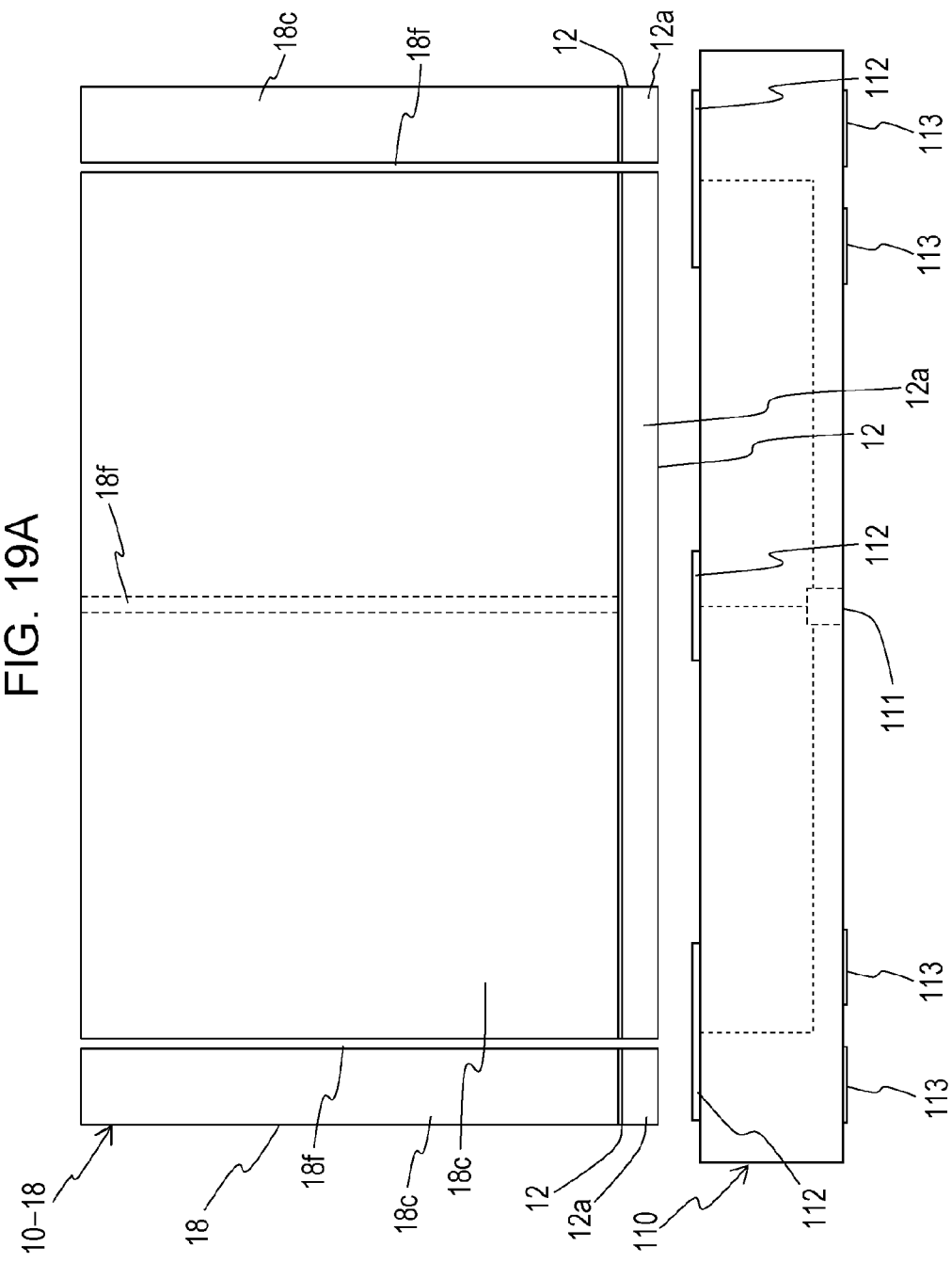

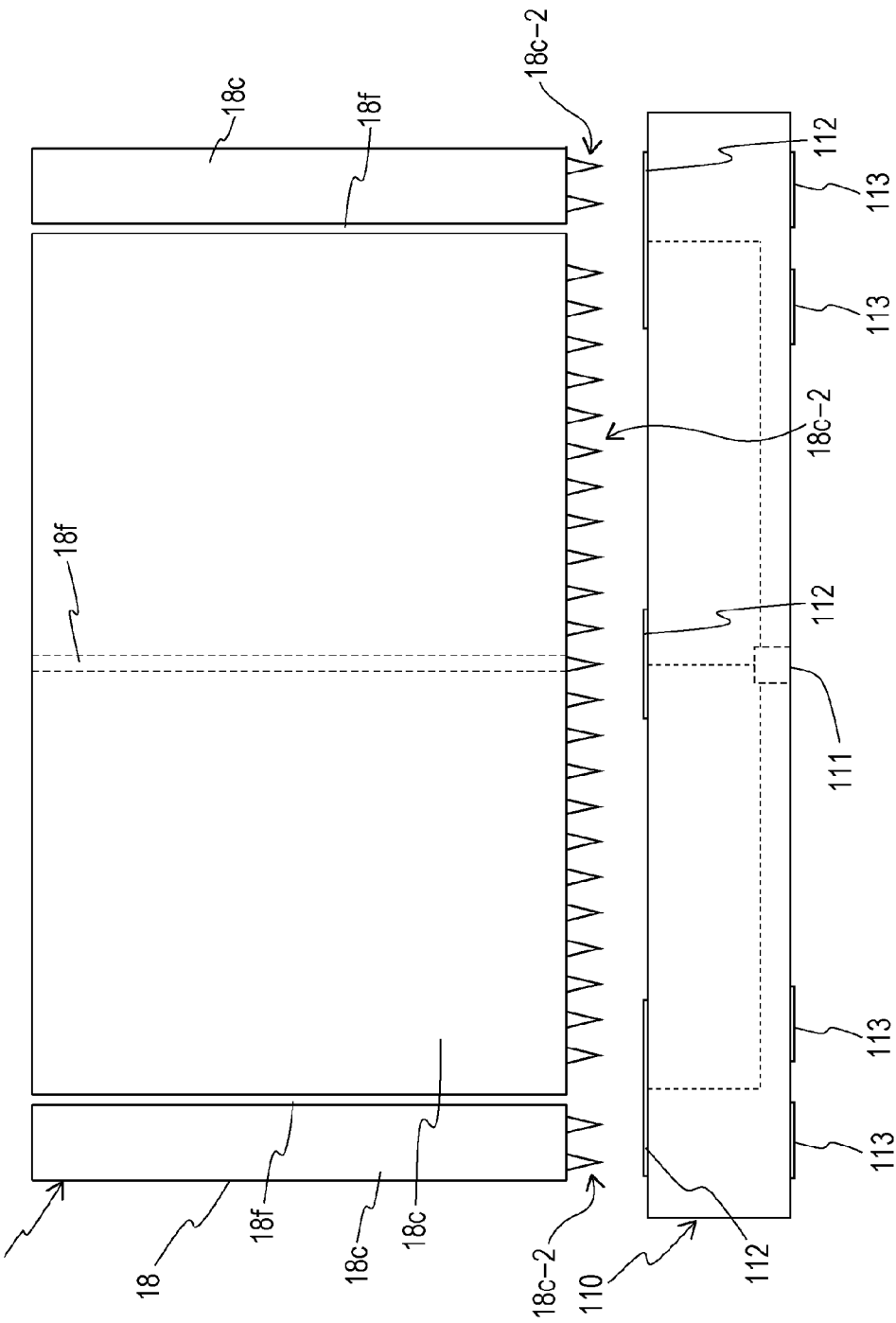

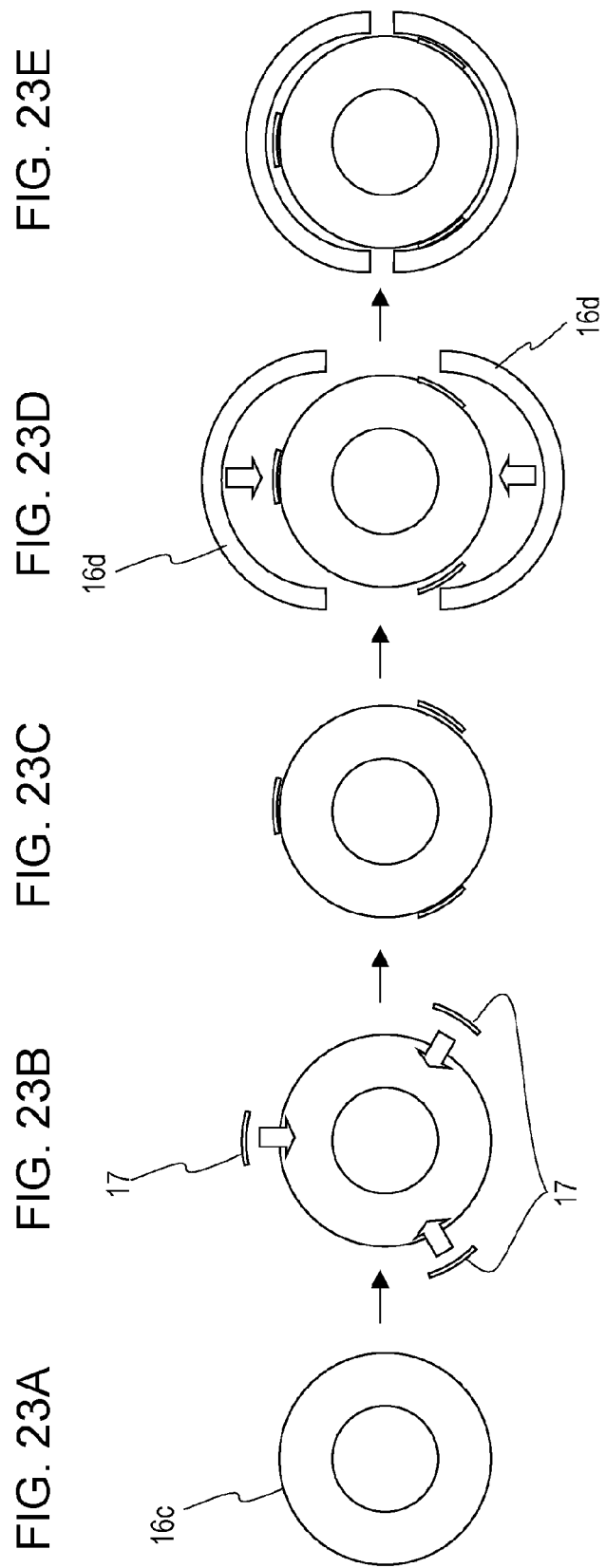

- S2-1: APPLY JOINING MATERIAL
- S2-2: SUCK COMPONENT
- S2-3: SUPPLY POWER
- S2-4: RECOGNIZE LIGHT EMISSION
- S2-5: RECOGNIZE POSITION
- S2-6: MOVE COMPONENT
- S2-7: PLACE COMPONENT
- S2-8: SUPPLY POWER
- S2-9: COMPONENT EMITS LIGHT
- S2-10: OPTICAL AXIS ALIGNMENT
- S2-11: REFLOW
- S2-12: COMPLETED

PLACEMENT APPARATUS AND A SUCTION NOZZLE FOR AN OPTICAL COMPONENT

CROSS-REFERENCE TO RELATED APPLICATION

This application is based upon and claims the benefit of priority of the prior Japanese Patent Application No. 2013-062316, filed on Mar. 25, 2013, the entire contents of which are incorporated herein by reference.

FIELD

The embodiment discussed herein is related to a placement apparatus for an optical component that places an optical component, a suction nozzle for an optical component to which the optical component are sucked, and a method of producing an electronic device equipped with the optical component.

BACKGROUND

A related art printed circuit board in which an optical waveguide is incorporated includes an optical element such as a vertical cavity surface emitting laser (VCSEL) or an optical module that includes the optical element.

The optical waveguide receives light emitted from the optical element at a 45-degree mirror (entrance) thereof formed at an end of a core such that the 45-degree mirror is inclined relative to the core by 45-degree. The light received at the 45-degree mirror (entrance) exits the optical waveguide from a 45-degree mirror (exit) formed at the other end of the core. Thus, an optical interconnect is realized.

An optical component is placed at a target position on a board, by, for example, being sucked by a pick and place machine, by being sucked by a flip chip bonder, or by being clamped by a mechanical chuck.

In general, a light emitting component is very small, and accordingly, use of passive alignment, in which an image of something serving as a mark on the component is recognized so as to position the component, is limited. Thus, a method so-called active alignment is used, in which the component is caused to emit light, a position where the amount of light is the largest is recognized (alignment), and the component is placed at the recognized position.

Nowadays, as transmission rates and transmission distances are increasing, in order to suppress optical losses, the diameter of the core of the optical waveguide is decreasing. The diameter of the core is, for example, 30 to 50 μm. When the diameter of the core is set to such a size, it is desirable that the positioning accuracy be equal to or less than about ±3 to 5 μm so that the light does not fail to strike the 45-degree mirror.

In order to suppress optical losses caused by the 45-degree mirror as much as possible, it is desirable that an angle of an optical path between the core and the optical component relative to the core be almost exactly 90-degree. For this purpose, it is desirable that there be no inclination of the component (mounting inclination).

Regarding the above-described active alignment, in a known technique, a sucked component is brought into contact with a power supply member, thereby supplying power to the component so as to cause the component to emit light (see, for example, Japanese Laid-open Patent Publication No. 2003-188451, International Publication Pamphlet No. WO 2005/029658, and Japanese Laid-open Patent Publication No. 2011-9654).

There also is a known technique, in which power is supplied to a light emitting element with a mounting tool used for suction, a probe, and the like (see, for example, Japanese Laid-open Patent Publication No. 2002-9380).

In a known technique not using suction, active alignment is performed by supplying power to an optical element through a clamp that holds a sub-mount, in which the optical element is placed (see, for example, Japanese Laid-open Patent Publication No. 2005-285889).

In order to realize high positional accuracy of an optical component relative to a board, in a known method, a light emitting optical component is placed, for example, by a flip chip bonder having a capability of placing a component with high placement positional accuracy. In a flip chip bonder, the optical component is uniformly pressed at its upper surface. This allows the horizontality of the optical component to be maintained to some degree. However, in order to achieve, for example, a positional accuracy of 3 to 5 μm, which is a desirable value for an optical interconnect, the flip chip bonder does not necessarily have capability sufficient to satisfy the above-described desirable value. Furthermore, also in the flip chip bonder, when a joining material is solidified, it is desirable that the optical axis of the optical component be determined while the optical component is held in a state in which a high horizontality of the optical component is maintained.

When a probe is brought into contact with a surface of the optical component to be sucked to a suction nozzle, a sufficient suction area is not allocated for sucking the optical component to the suction nozzle. When the suction area is not sufficiently allocated, it is difficult to apply a sufficient suction force. Furthermore, when the suction area is not sufficiently allocated, it is impossible to reliably maintain the high horizontality of the optical component due to non-uniform pressure while pressing the suction nozzle against the optical component. Nowadays, since the size of the optical component is decreasing, it becomes more difficult to allocate a sufficient suction area.

When a power supply member, for example, a probe, is brought into contact with the optical component so as supply power to the optical component, the sucked optical component may be removed due to the probe being brought into contact with the optical component. In order to avoid the removal of the sucked optical component, the probe may be slowly moved to and in contact with the optical component. However, in this case, contact operation takes time.

In a method in which the optical component is clamped by arms, it is difficult to uniformly press the optical component against the board from immediately above, and accordingly, it is difficult to obtain the horizontality of the optical component. When the optical component is secured to the board in a reflow process, the optical element becomes unclamped before joining material is solidified, that is, in a state in which the optical component is not joined to the board. In this state, in order to release the optical component from the clamp without a shift in position of the optical component, a significantly sophisticated arm and clamp mechanism is desired. When a mechanical chuck is used, placement time is increased compared to a case in which the optical component is sucked.

In an aspect of the embodiment, a placement apparatus for an optical component, a suction nozzle for an optical component, and a method of producing an electronic device are provided. With the placement apparatus, the suction nozzle, or the method, when adjusting a placement position, an optical component may be reliably sucked while light is emitted from or received by the optical component.

SUMMARY

According to an aspect of the invention, A placement apparatus for an optical component includes: a suction nozzle that includes a nozzle main body having a suction surface having a suction port, an optical component being sucked to the suction port, a plurality of nozzle electrodes disposed on the suction surface, each of the nozzle electrodes being brought into contact with a corresponding one of a plurality of component electrodes provided on the optical component so as to establish electrical conduction between each of the plurality of nozzle electrodes and a corresponding one of the plurality of component electrodes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a front view illustrating an electronic device and a placement apparatus for an optical component;

FIG. 2A is a first side view illustrating a suction nozzle and an optical component;

FIG. 3A is a second side view illustrating a suction nozzle and the optical component;

FIG. 3B is a second bottom view illustrating the suction nozzle;

FIG. 4A is a third side view illustrating a suction nozzle and the optical component;

FIG. 4B is a third bottom view illustrating the suction nozzle;

FIG. 5A is a fourth side view illustrating a suction nozzle and the optical component;

FIG. 5B is a fourth bottom view illustrating the suction nozzle;

FIG. 6A is a fifth side view illustrating a suction nozzle and the optical component;

FIG. 7A is a sixth side view illustrating a suction nozzle and the optical component;

FIG. 9A is an eighth side view illustrating a suction nozzle and the optical component;

FIG. 10A is a ninth side view illustrating a suction nozzle and the optical component;

FIG. 11A is a tenth side view illustrating a suction nozzle and the optical component;

FIG. 12A is an eleventh side view illustrating a suction nozzle and the optical component;

FIG. 13A is a twelfth side view illustrating a suction nozzle and the optical component;

FIG. 14A is a thirteenth side view illustrating a suction nozzle and the optical component;

FIG. 15A is a fourteenth side view illustrating a suction nozzle and the optical component;

FIG. 16A is a fifteenth side view illustrating a suction nozzle and the optical component;

FIG. 16B is a fifteenth bottom view illustrating the suction nozzle;

FIG. 17A is a sixteenth side view illustrating a suction nozzle and the optical component;

FIG. 19A is an eighteenth side view illustrating a suction nozzle and the optical component;

FIG. 20A is a nineteenth side view illustrating a suction nozzle and the optical component;

FIGS. 23A to 23E illustrate an example of a method of assembling nozzle main body illustrated in FIGS. 7A to 8B;

DESCRIPTION OF EMBODIMENT

Figure 2B:
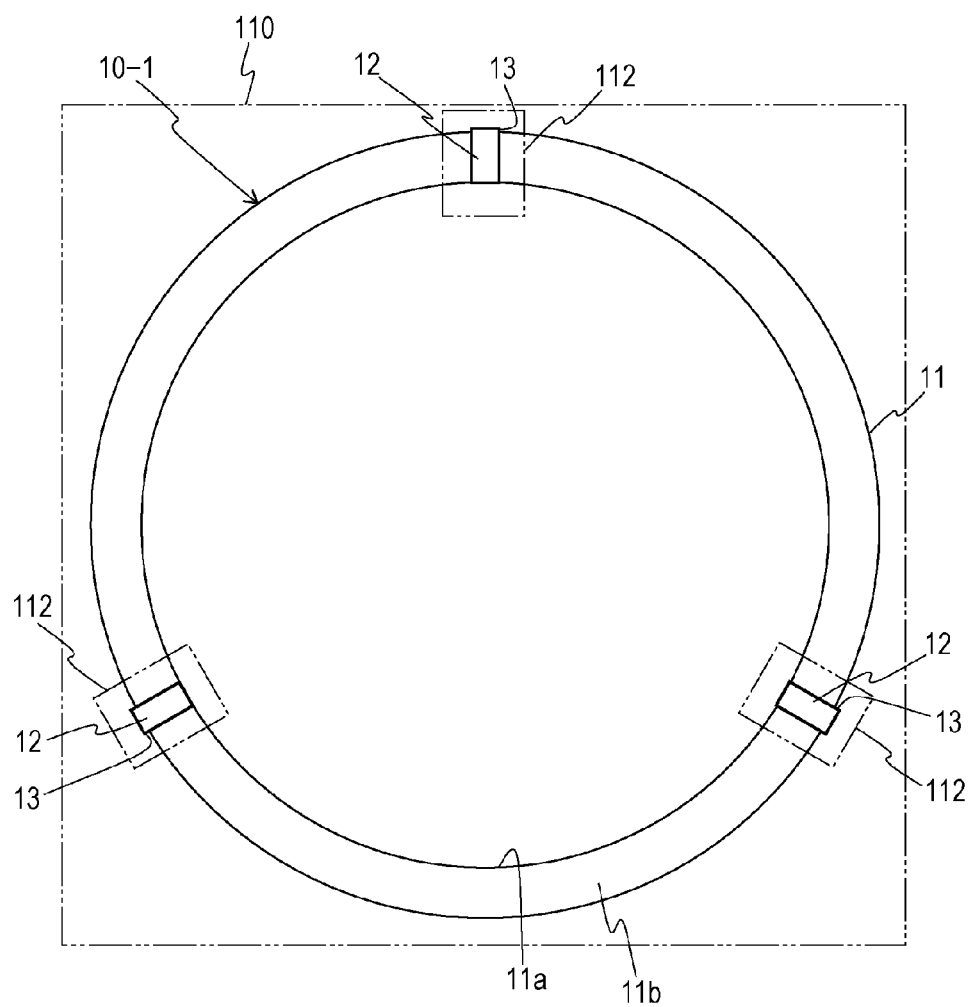
FIG. 2B is a first bottom view illustrating the suction nozzle.

A placement apparatus 1 for an optical component, a suction nozzle 10 for an optical component, and a method of producing an electronic device 101 according to an embodiment will be described below.

FIG. 1 is a front view illustrating the placement apparatus 1 for an optical component and the electronic device 101.

The placement apparatus 1 for an optical component includes the suction nozzle 10 for an optical component. The suction nozzle 10 is attached to, for example, a lower end of a placement apparatus main body 20. The placement apparatus main body 20 includes, for example, an attachment and a suction channel. The suction nozzle 10 is attached to the attachment. A suction gas G, which is sucked by a suction device such as a vacuum pump, flows through the suction channel.

The suction nozzle 10 includes a nozzle main body 11 and, for example, three nozzle electrodes 12.

The nozzle main body 11 has a suction surface 11b. A suction port 11a-1, to which an optical component 110 is sucked, is formed in the suction surface 11b. The suction port 11a-1 is an opening formed at the tip of a suction hole 11a, which is a channel through which the suction gas G flows. The nozzle main body 11 has a barrel shape having a hollow, which defines the suction hole 11a. Desirably, a large area of a first surface 110a of the optical component 110 is sucked to the suction surface 11b.

In the present embodiment, the barrel shape may be, for example, a cylindrical shape or a polygonal barrel shape, and the shapes of the outer and inner peripheral surfaces are not particularly limited as long as the suction hole is formed therein. The nozzle main body 11 may have a plurality of suction holes or a number of fine suction holes instead of a single suction hole 11a.

Although the details will be described later, the three nozzle electrodes 12, among which potential differences exist, are each brought into contact with a corresponding one of a plurality of first component electrodes 112 provided on the optical component 110 so as to establish electrical conduction between each of the three nozzle electrodes 12 and a corresponding one of the plurality of first component electrodes 112. Thus, with the suction nozzle 10, power that causes an optical element 111 to emit light may be supplied at the same time as the optical component 110 is sucked.

The suction surface 11b includes the suction port 11a-1 and a region surrounding the suction port 11a-1. The nozzle electrodes 12 are disposed in the region surrounding the suction port 11a-1 of the suction surface 11b.

The nozzle electrodes 12 are spaced apart from one another on the suction surface 11b. The number of the nozzle electrodes 12 is not limited to three. It is sufficient that two nozzle electrodes 12, between which a potential difference exits, for power supply be provided. When three or more nozzle electrodes 12 are provided, it is desirable that the additional nozzle electrodes 12 be used to control power supply.

Wires 13 are disposed, for example, on the outer peripheral surface of the nozzle main body 11. There are, for example, three wires 13, which are electrically connected to the nozzle electrodes 12.

In the present embodiment, an example of an electrically connected state is a state in which one member (for example, wire 13) is in contact with the other member (for example, nozzle electrode 12).

Another example of the electrically connected state is a state in which one member and the other member are electrically connected to each other through another member such as an electrically conductive adhesive. Still another example of the electrically conductive state is a state in which one member and the other member are integral with each other.

The plurality of wires 13 are spaced apart from one another. The wires 13 may be disposed on the inner peripheral surface of the nozzle main body 11. Although the details will be described later, the nozzle main body 11 may function as the nozzle electrodes or the wires.

The electronic device 101 includes the optical component 110 and a board 120.

The optical component 110 includes the optical element 111, a plurality of first component electrodes 112, and a plurality of second component electrodes 113. The optical component 110 is sucked to the suction nozzle 10 at the first surface 110a thereof.

The optical element 111 is disposed in a second surface 110b, which is a rear surface of the first surface 110a. The optical element 111 is, for example, a light emitting element such as a laser diode.

The plurality of first component electrodes 112 are disposed on the first surface 110a of the optical component 110.

The plurality of second component electrodes 113 are disposed on the second surface 110b of the optical component 110. The plurality of second component electrodes 113 are secured to board electrodes 121 of the board 120 with joining material 122.

The board 120 includes the plurality of board electrodes 121, the joining material 122, and insulating films 123. Although examples of the board 120 may include printed circuit boards of middle to large size apparatuses such as printed circuit boards of a super computer server system, a network system apparatus, and so forth, it is needless to say that the board 120 is also applicable to boards other than these.

The insulating films 123 are formed on the board 120 in regions around the board electrodes 121 and an optical waveguide 130.

The optical waveguide 130 includes a core 131 and a clad 132 and placed on the board 120.

The core 131 has reflective surfaces 131a and 131b formed at both ends thereof such that the reflective surfaces 131a and 131b are inclined relative to the core 131 (light traveling direction in the core 131) by 45 degrees. The one reflective surface 131a, which opposes the optical element 111 of the optical component 110, functions as an incident surface. The other reflective surface 131b functions as a light exit surface. Light L that has exited the reflective surface 131b is detected by a photodetector 30. A placement position of the optical component 110 may be adjusted in accordance with the intensity of the Light L detected by the photodetector 30.

The optical element 111 may be a light receiving element. In this case, a light source is provided instead of the photodetector 30. In the case where the light source is used, the light amount is detected on the placement apparatus 1 side. The photodetector 30 is provided, for example, in the placement apparatus 1, or may instead be provided as a device separated from the placement apparatus 1.

Among FIGS. 2A to 20B, figures with a suffix "A" such as FIGS. 2A, 3A, . . . , 20A are side views illustrating the suction nozzle 10 and the optical component 110, and figures with a suffix "B" such as FIGS. 2B, 3B, . . . , 20B are bottom views illustrating the suction nozzle 10. In figures with a suffix "B" out of FIGS. 2A to 20B, the two-dot chain line represents a plan view of the optical component 110 including three first component electrodes 112.

FIG. 2A is a view of a structure illustrated in FIG. 1 seen in the IIA direction in FIG. 1. The suction nozzle 10 illustrated in FIG. 2A is the same as the suction nozzle 10 illustrated in FIG. 1. Thus, detailed description of the suction nozzle 10 is omitted.

In a first suction nozzle 10-1 illustrated in FIGS. 2A and 2B, the nozzle main body 11 is electrically non-conductive. The nozzle main body 11 may be configured such that, among portions of the nozzle main body 11, at least portions in contact with the nozzle electrodes 12 and the wires 13 are electrically non-conductive and other portions are electrically conductive. In the present embodiment, examples of electrically non-conductive materials include ceramic, resin such as plastic, and the like.

The wires 13 are disposed on the outer peripheral surface of the nozzle main body 11. The wires 13 are electrically connected to the nozzle electrodes 12. It is desirable that the thickness of the nozzle electrodes 12 be increased in the case where the electrical contact resistance of the nozzle electrodes 12 is large or wear on the nozzle electrodes 12 is significant. In order to reduce electrical contact resistance, the nozzle electrodes 12 and the joining material 122 may be scrubbed.

An example of the method of forming the wires 13 is a method in which three films are attached on the outer peripheral surface of the nozzle main body 11 such that the films are spaced apart from one another, the wires 13 are formed in the gaps between the films by, for example, vapor deposition, sputtering, plating, or the like, and the films are removed.

In another example of the method of forming the wire 13, a thin film is formed over the entirety of the outer peripheral surface of the nozzle main body 11 by, for example, vapor deposition, sputtering, or plating, and portions of the thin film other than the wires 13 are shaved.

In still another method of forming the wire 13, the wires 13 are formed with an electrically conductive adhesive through processes such as, for example, drawing and baking, or a patterned electrically conductive sheet is bonded.

In a second suction nozzle 10-2 illustrated in FIGS. 3A and 3B, electrically conductive elastic bodies 12a, which are an example of the projecting portions of the nozzle electrodes 12, are added to the first suction nozzle 10-1 illustrated in FIGS. 2A and 2B.

The elastic bodies 12a function as the projecting portions that project from the suction surface 11b of the nozzle main body 11. The elastic bodies 12a are formed of an electrically conductive rubber disposed, for example, over the entirety of the contact portions of the nozzle electrodes 12 to be brought into contact with the first component electrodes 112. The elastic bodies 12a may constitute the entire nozzle electrodes 12. In this case, the elastic bodies 12a are electrically connected to the wires 13. In the present embodiment, the elastic body 12a may instead be disposed at part of each of the contact portions of the nozzle electrodes 12 to be brought into contact with the first component electrodes 112. The elastic bodies 12a may be formed of an elastic body other than rubber.

Figure 21A:
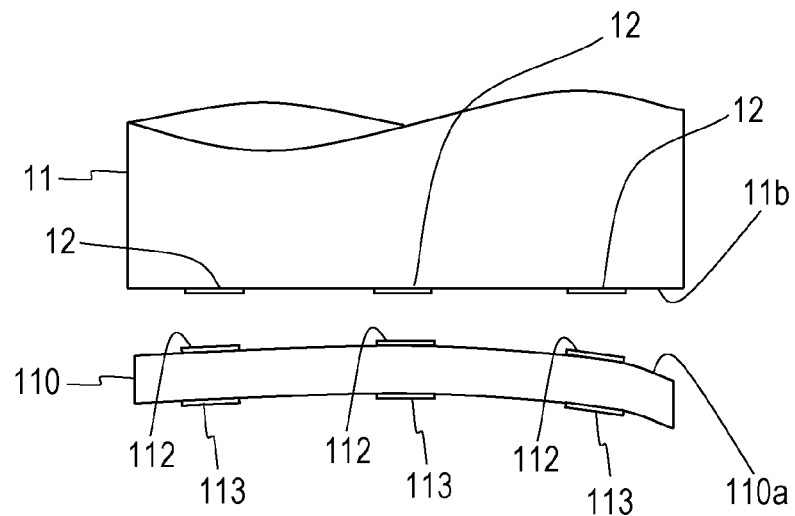
FIG. 21A is a first explanatory view of nozzle electrodes without projecting portions, illustrating an example of a state in which the nozzle electrodes without the projecting portions to be brought into contact with first component electrodes oppose the first component electrodes.
Figure 21B:
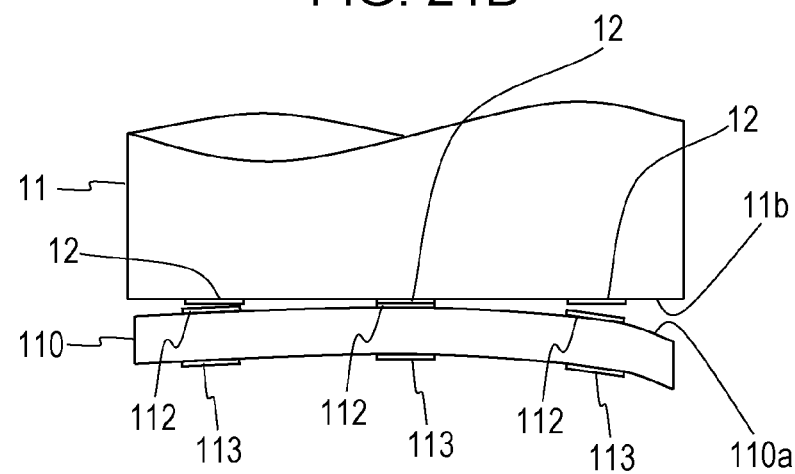
FIG. 21B is a second explanatory view of the nozzle electrodes without the projecting portions, illustrating an example of a state in which the nozzle electrodes without the projecting portions and the first component electrodes are in contact with one another.

In the case where the optical component 110 is packaged, the optical component 110 may warp, for example, as illustrated in FIG. 21A due to the size being large or the internal structure being complex. In particular, when the optical component 110 warps such that the shape of the optical component 110 becomes wavy or such that only one of the corners of the optical component 110 is lifted up, the gaps may be formed between the first component electrodes 112 and the nozzle electrodes 12 as illustrated in FIG. 21B, resulting in poor contact of the first component electrodes 112 and the nozzle electrodes 12 with each other.

Figure 22A:
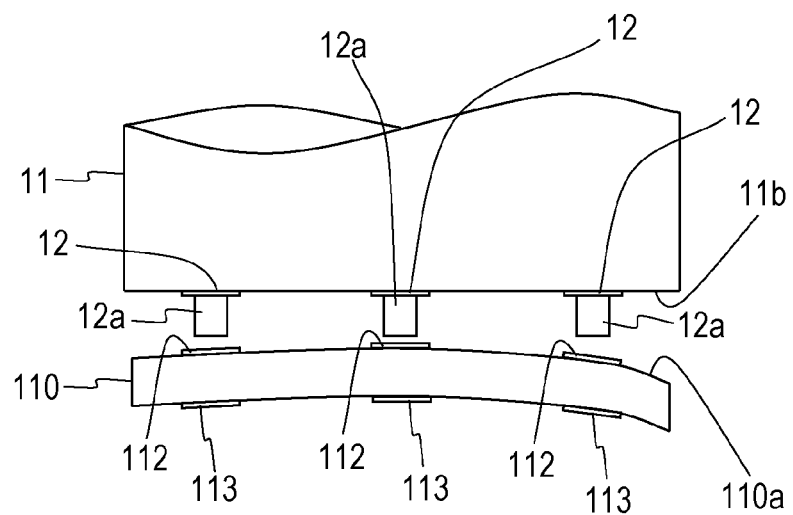
FIG. 22A is a first explanatory view of nozzle electrodes with elastic bodies, illustrating an example of a state in which the nozzle electrodes with the elastic bodies to be brought into contact with the first component electrodes oppose the first component electrodes.
Figure 22B:
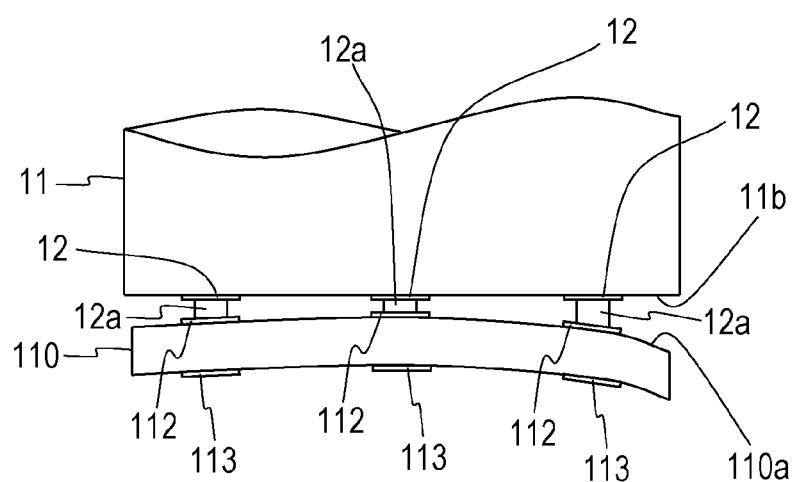
FIG. 22B is a first explanatory view of the nozzle electrodes with the elastic bodies, illustrating an example of a state in which the nozzle electrodes with the elastic bodies and the first component electrodes are in contact with one another.

In contrast, as illustrated in FIG. 22A, when the nozzle electrodes 12 are provided with the elastic bodies 12a, the elastic bodies 12a are compressed as illustrated in FIG. 22B. Thus, even when the optical component 110 warps, it may be ensured that the first component electrodes 112 and the nozzle electrodes 12 are brought into contact with each other.

In a third suction nozzle 10-3 illustrated in FIGS. 4A and 4B, a plurality of through holes 11c that extend parallel to the suction hole 11a and open at the suction surface 11b are formed in the nozzle main body 11. The nozzle main body 11 is electrically non-conductive.

A plurality of wires 14 are inserted into the respective through holes 11c. The wires 14 may be fitted into the through holes 11c. The numbers of the through holes 11c and the wires 14 are, for example, three, the same number as that of the nozzle electrodes 12.

The wires 14 are electrically connected to the nozzle electrodes 12. When each of the wires 14 and a corresponding one of the nozzle electrodes 12 are integral with each other or connected to each other through another member such as an electrically conductive member, the wires 14 are inserted into the through holes 11c from the suction surface 11b side. The wires 14 may be inserted into the through holes 11c when the nozzle main body 11 is molded in production.

The size of a contact surfaces of the nozzle electrodes 12 to be brought into contact with the first component electrodes 112 is larger than the sectional area of the through holes 11c parallel to the contact surfaces. In the case where the electrical contact resistance of the nozzle electrodes 12 is large due to the nozzle electrodes 12 being formed of the same material as that of the wires 14, it is desirable that the nozzle electrodes 12 be, for example, gold-plated so as to reduce the electrical contact resistance of the nozzle electrodes 12.

The nozzle main body 11 may be configured such that, among portions of the nozzle main body 11, at least portions of the through holes 11c in contact with the wires 14 are electrically non-conductive and other portions are electrically conductive. When the wires 14 are coated with an electrically non-conductive material, the portions of the through holes 11c in contact with the wires 14 may be electrically conductive.

In a fourth suction nozzle 10-4 illustrated in FIGS. 5A and 5B, electrically conductive elastic bodies 12a, which are the example of the projecting portions of the nozzle electrodes 12, are added to the third suction nozzle 10-3 illustrated in FIGS. 4A and 4B.

The elastic bodies 12a function as the projecting portions that project from the suction surface 11b of the nozzle main body 11. The elastic bodies 12a are formed of an electrically conductive rubber disposed, for example, over the entirety of the contact portions of the nozzle electrodes 12 to be brought into contact with the first component electrodes 112. The elastic bodies 12a may constitute the entire nozzle electrodes 12. In this case, the elastic bodies 12a are electrically connected to the wires 14.

Figure 6B:
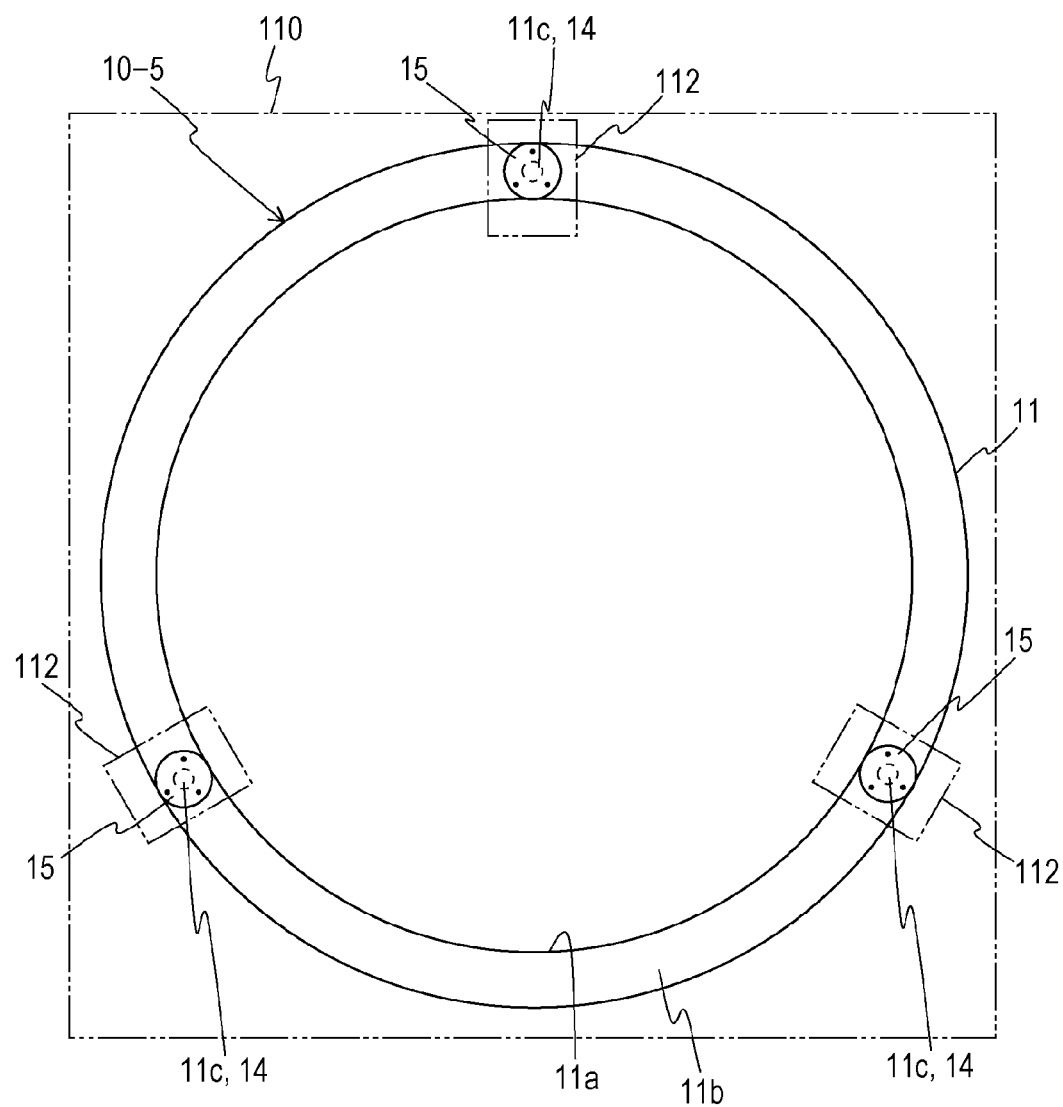
FIG. 6B is a fifth bottom view illustrating the suction nozzle.

In a fifth suction nozzle 10-5 illustrated in FIGS. 6A and 6B, nozzle electrodes 15, which include projecting portions that project from the suction surface 11b, are provided instead of the nozzle electrodes 12 of the third suction nozzle 10-3 illustrated in FIGS. 4A and 4B.

The nozzle electrodes 15 are electrically connected to the wires 14. In the nozzle electrodes 15, contact portions to be brought into contact with the first component electrodes 112 each have irregularities. When the contact portions of the nozzle electrodes 15 to be brought into contact with the first component electrodes 112 have irregularities, the electrical contact resistance against the first component electrodes 112 is reduced and frictional forces are increased compared to those generated when the contact portions are flat.

The nozzle electrodes 15 each include, for example, a plurality of projecting pieces having a tapered shape or a needle shape. The contact portions of irregularities of the nozzle electrodes 15 may be, for example, plated.

Since the nozzle electrodes 15 are disposed at three positions spaced apart from one another on the suction surface 11b, the three nozzle electrodes 15 and the three first component electrodes 112 may be more easily brought into contact with one another due to the three-point contact principle.

Desirably, the three nozzle electrodes 15 are not positioned on a straight line. Although it is desirable that the three nozzle electrodes 15 be equally spaced apart from one another, the three nozzle electrodes 15 are not necessarily equally spaced apart from one another.

Figure 7B:
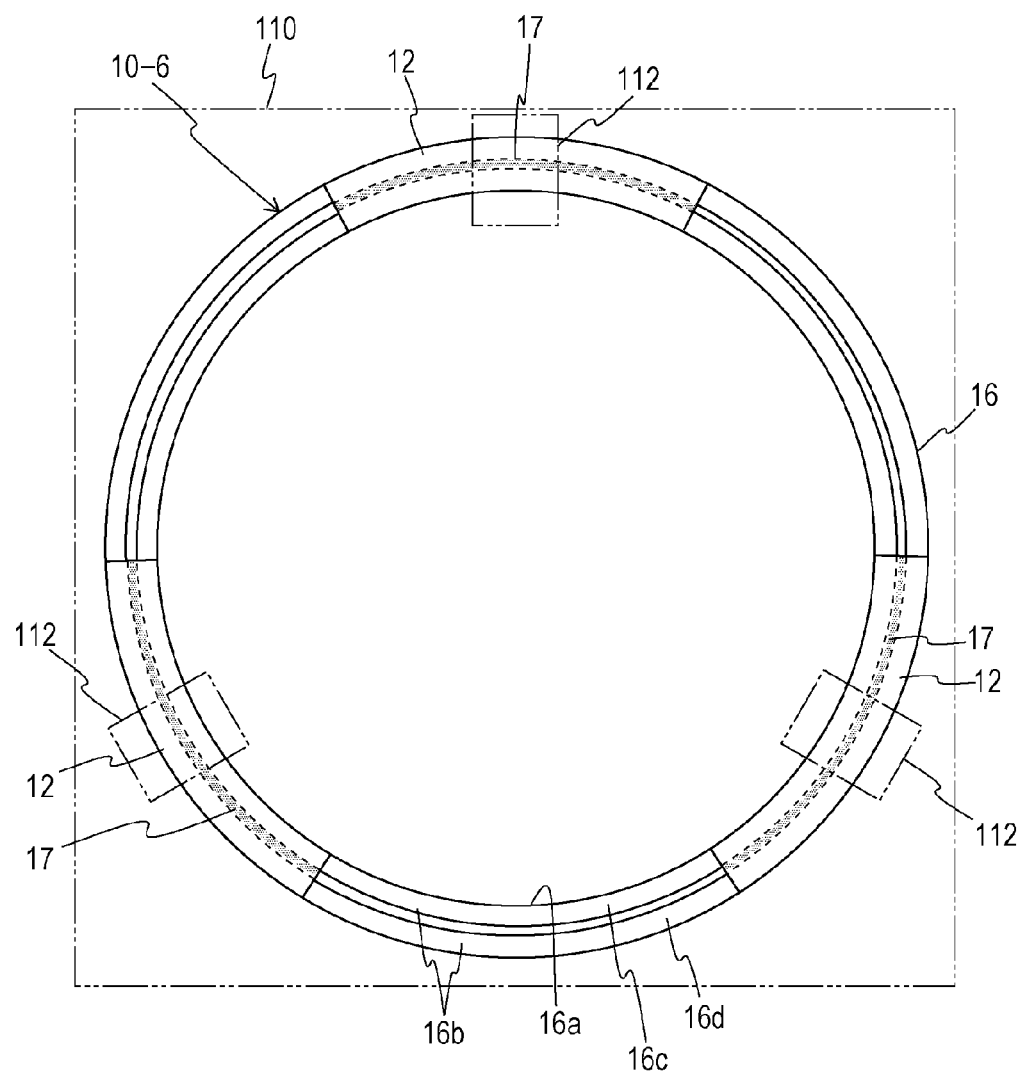
FIG. 7B is a sixth bottom view illustrating the suction nozzle.

In a sixth suction nozzle 10-6 illustrated in FIGS. 7A and 7B, a nozzle main body 16 includes an inner member 16c and an outer member 16d.

The inner member 16c is positioned radially outside a suction hole 16a. The outer member 16d is positioned radially outside the inner member 16c. Both the inner member 16c and the outer member 16d have respective cylindrical shapes that surround the suction hole 16a. A structure in which only one of the inner member 16c and the outer member 16d has a cylindrical shape that surrounds the suction hole 16a is possible.

Although the tips of both the inner member 16c and the outer member 16d function as suction surfaces 16b, a case in which only one of the inner member 16c and the outer member 16d functions as the suction surface 16b may be allowable when the tip of one of the inner member 16c and the outer member 16d is closer to the optical component 110 than those of the other.

A plurality of sheet-shaped wires 17 are disposed between the inner member 16c and the outer member 16d . In terms of the peripheral direction of the nozzle electrodes 12, the length of the suction hole 16a is the same as that of the wires 17.

The nozzle main body 16 is electrically non-conductive. The nozzle main body 16 may be configured such that, among portions of the inner member 16c and the outer member 16d, portions in contact with the wires 17 are electrically non-conductive and other portions are electrically conductive.

In order to assemble the nozzle main body 16, for example, the wires 17 are initially attached to (for example, bonded to) the outer peripheral surface of the inner member 16c as illustrated in FIGS. 23A to 23C. After that, as illustrated in FIGS. 23D and 23E, a plurality of separate pieces of the outer member 16d are disposed outside the wires 17.

Figure 8A:
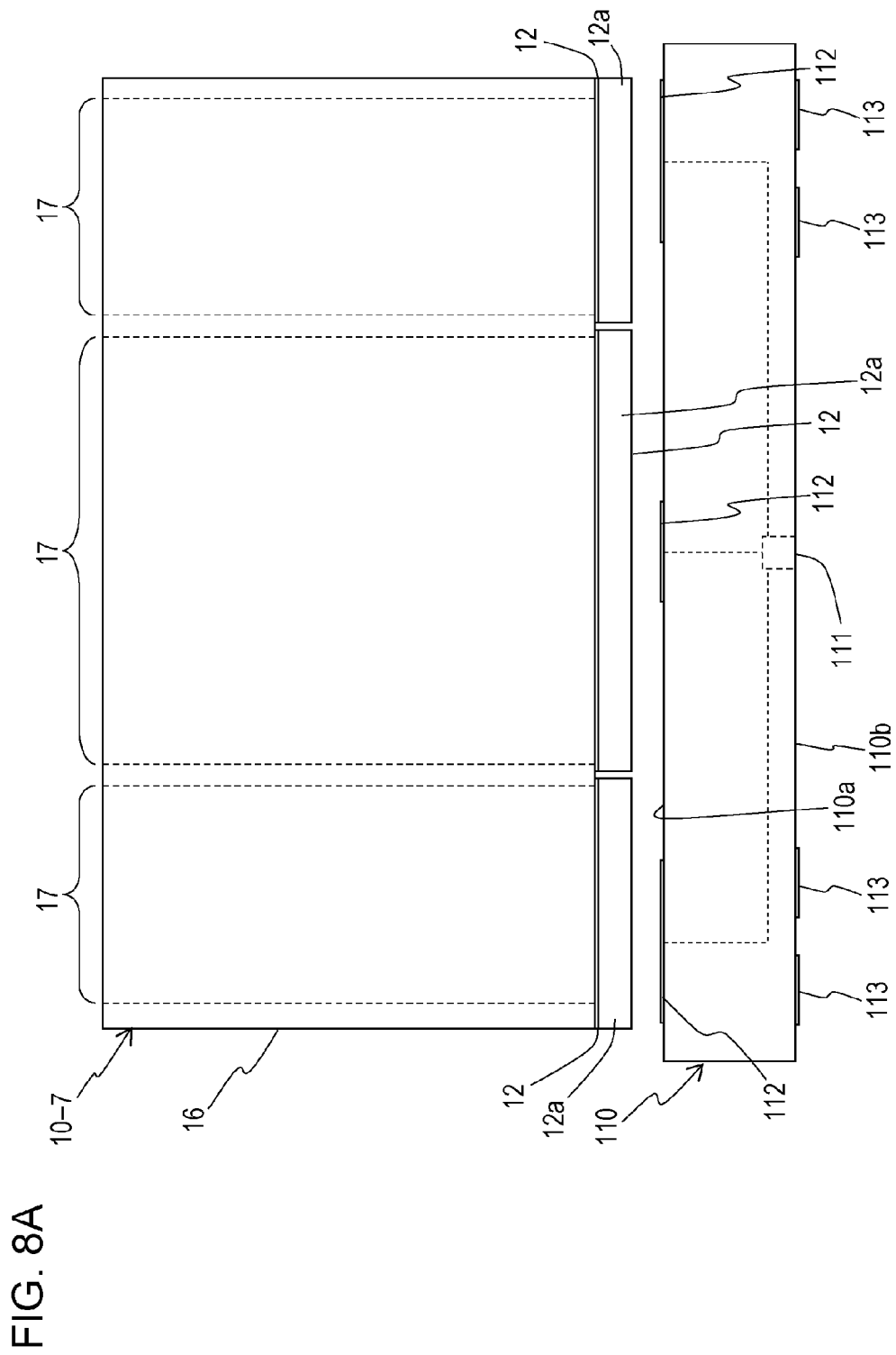
FIG. 8A is a seventh side view illustrating a suction nozzle and the optical component.
Figure 8B:
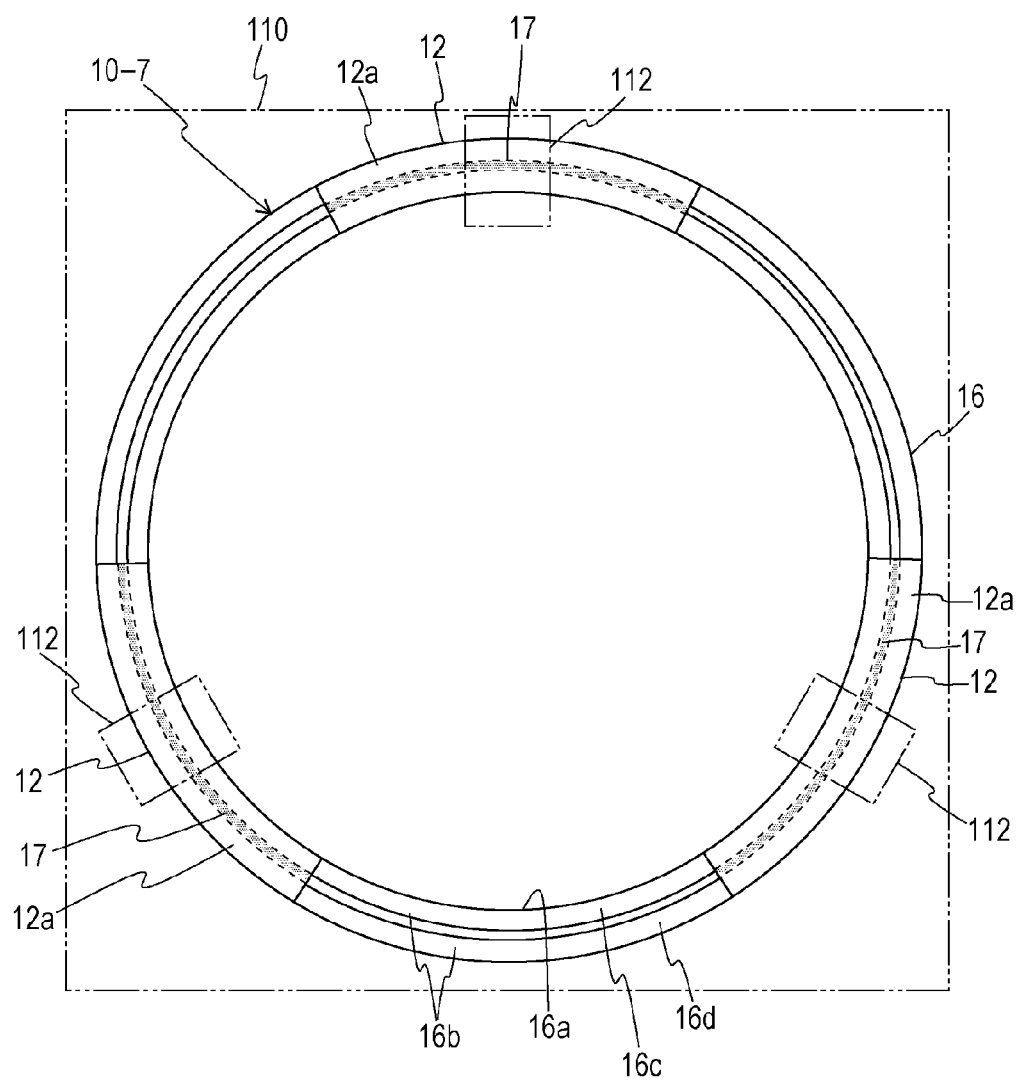
FIG. 8B is a seventh bottom view illustrating the suction nozzle.

In a seventh suction nozzle 10-7 illustrated in FIGS. 8A and 8B, the electrically conductive elastic bodies 12a, which are the example of the projecting portions of the nozzle electrodes 12, are added to the sixth suction nozzle 10-6 illustrated in FIGS. 7A and 7B.

The elastic bodies 12a function as the projecting portions that project from the suction surfaces 16b of the nozzle main body 16. The elastic bodies 12a are formed of an electrically conductive rubber disposed, for example, over the entirety of the contact portions of the nozzle electrodes 12 to be brought into contact with the first component electrodes 112. The elastic bodies 12a may constitute the entire nozzle electrodes 12. In this case, the elastic bodies 12a are electrically connected to the wires 17. Instead of the elastic bodies 12a, the projecting portions may be those of the nozzle electrodes 15 as illustrated in FIGS. 6A and 6B.

Figure 9B:
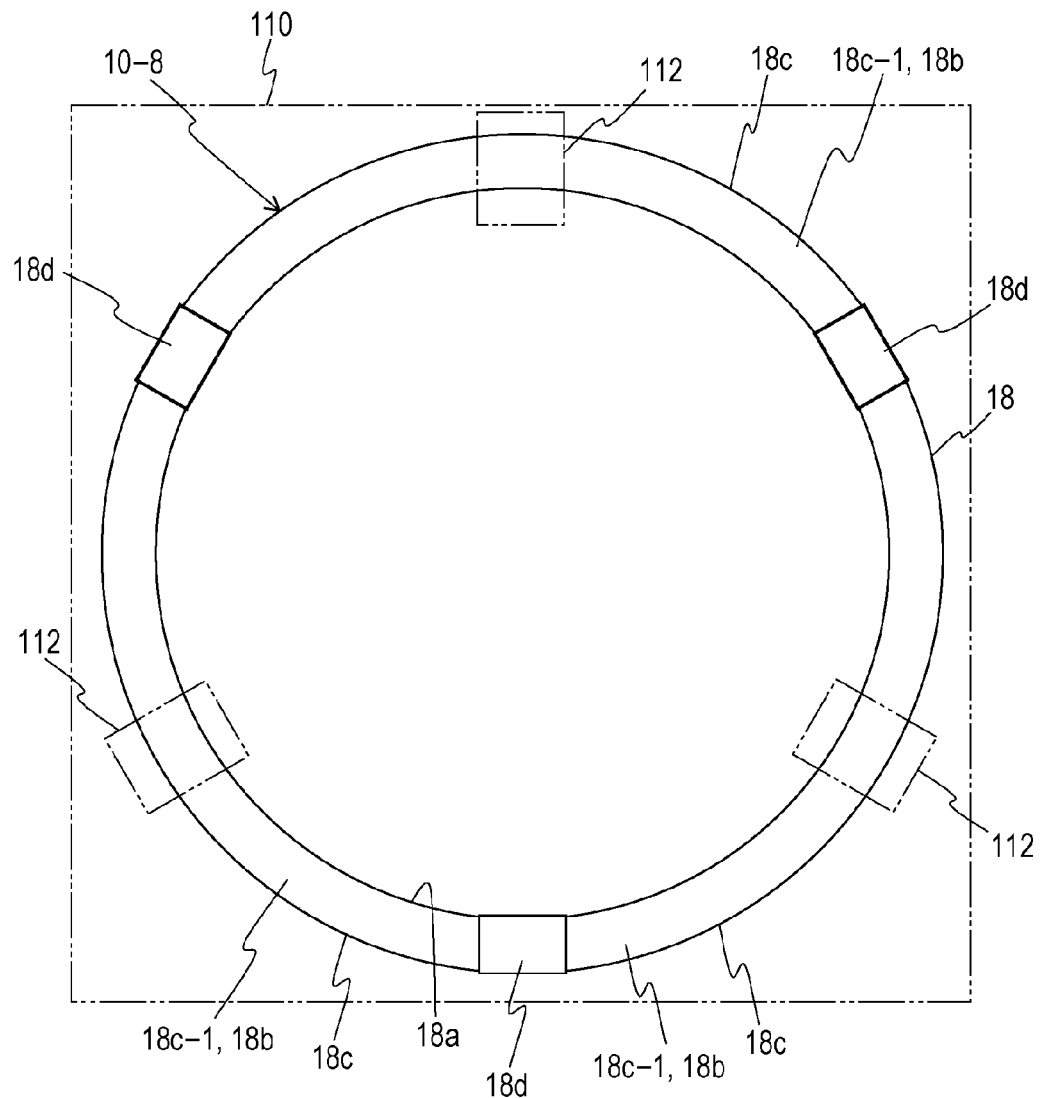
FIG. 9B is an eighth bottom view illustrating the suction nozzle.

In an eighth suction nozzle 10-8 illustrated in FIGS. 9A and 9B, a nozzle main body 18 includes, for example, three electrically conductive members 18c and, for example, three electrically non-conductive connecting members 18d.

Three connecting members 18d are disposed between three electrically conductive members 18c. The connecting members 18d connect the electrically conductive members 18c to one another. The connecting members 18d are formed of, for example, an electrically non-conductive adhesive. The electrically conductive members 18c are formed of, for example, a metal. The numbers of the electrically conductive members 18c and the connecting members 18d may be two, or four or more.

The plurality of electrically conductive members 18c and the plurality of connecting members 18d are arranged to collectively form a cylindrical shape that surrounds a suction hole 18a.

Nozzle electrodes 18c-1, which are the tips of the plurality of electrically conductive members 18c, function as suction surfaces 18b. The tips of the connecting members 18d are recessed relative to the nozzle electrodes 18c-1 of the electrically conductive members 18c, that is, positioned further away from the first surface 110a of the optical component 110 than the nozzle electrodes 18c-1.

The nozzle electrodes 18c-1 of the plurality of electrically conductive members 18c are each brought into contact with a corresponding one of the plurality of first component electrodes 112 so as to establish electrical conduction between each of the plurality of nozzle electrodes 18c-1 and a corresponding one of the plurality of first component electrodes 112. The electrically conductive members 18c, which are integral with the respective nozzle electrodes 18c-1, may be said to be electrically connected to the nozzle electrodes 18c-1.

Since the nozzle electrodes 18c-1 are integral with the electrically conductive members 18c and formed of the same material as that of the electrically conductive members 18c, the electrical contact resistance of the nozzle electrodes 18c-1 may be large. In this case, contact portions (nozzle electrodes 18c-1) of the electrically conductive members 18c to be brought into contact with the first component electrodes 112 may be, for example, plated with gold so as to reduce the electrical contact resistance.

Figure 10B:
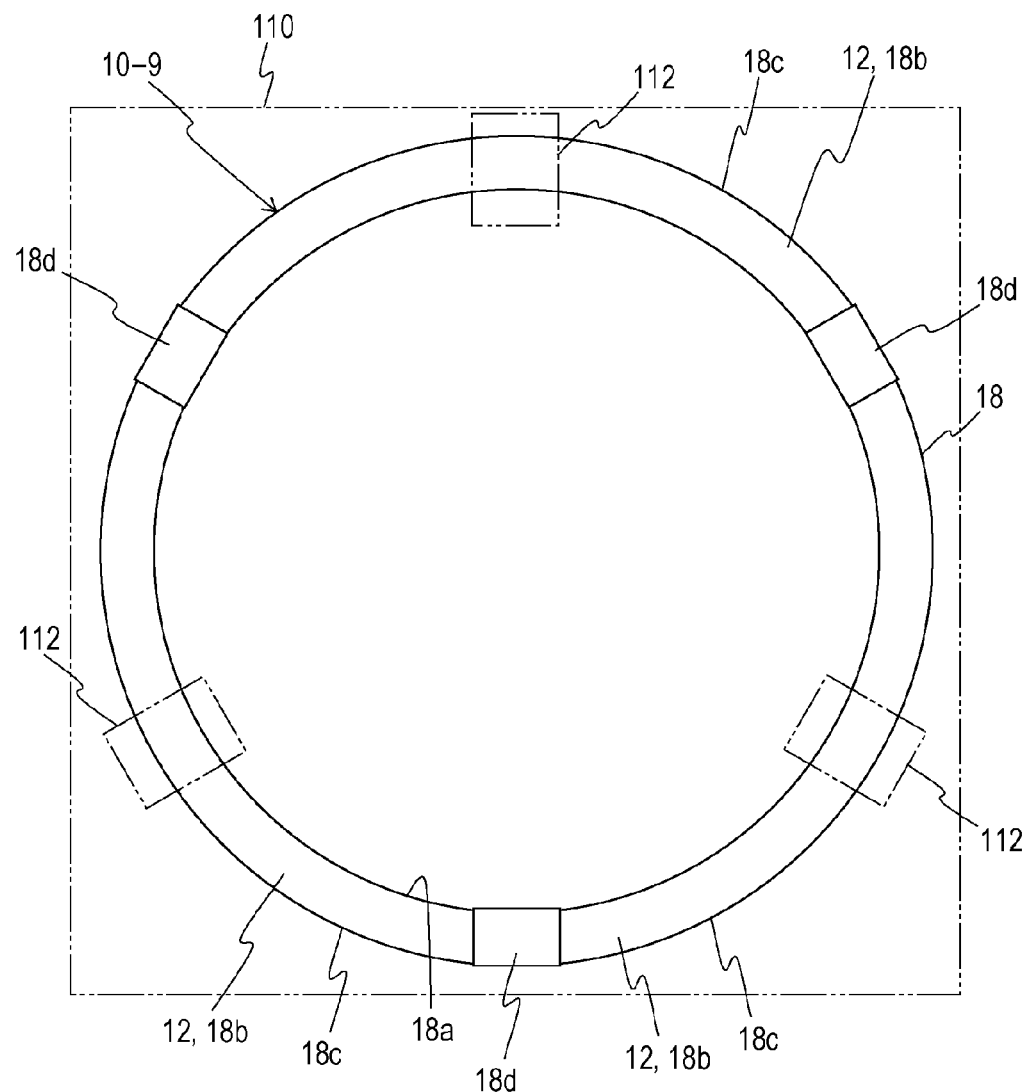
FIG. 10B is a ninth bottom view illustrating the suction nozzle.

In a ninth suction nozzle 10-9 illustrated in FIGS. 10A and 10B, the nozzle electrodes 12 are added to the eighth suction nozzle 10-8 illustrated in FIGS. 9A and 9B.

The nozzle electrodes 12 are disposed over the entirety of the contact portions of the suction surfaces 18b of the electrically conductive members 18c to be brought into contact with the first component electrodes 112. The nozzle electrodes 12 may be partly disposed on the respective suction surfaces 18b of the electrically conductive members 18c.

Figure 11B:
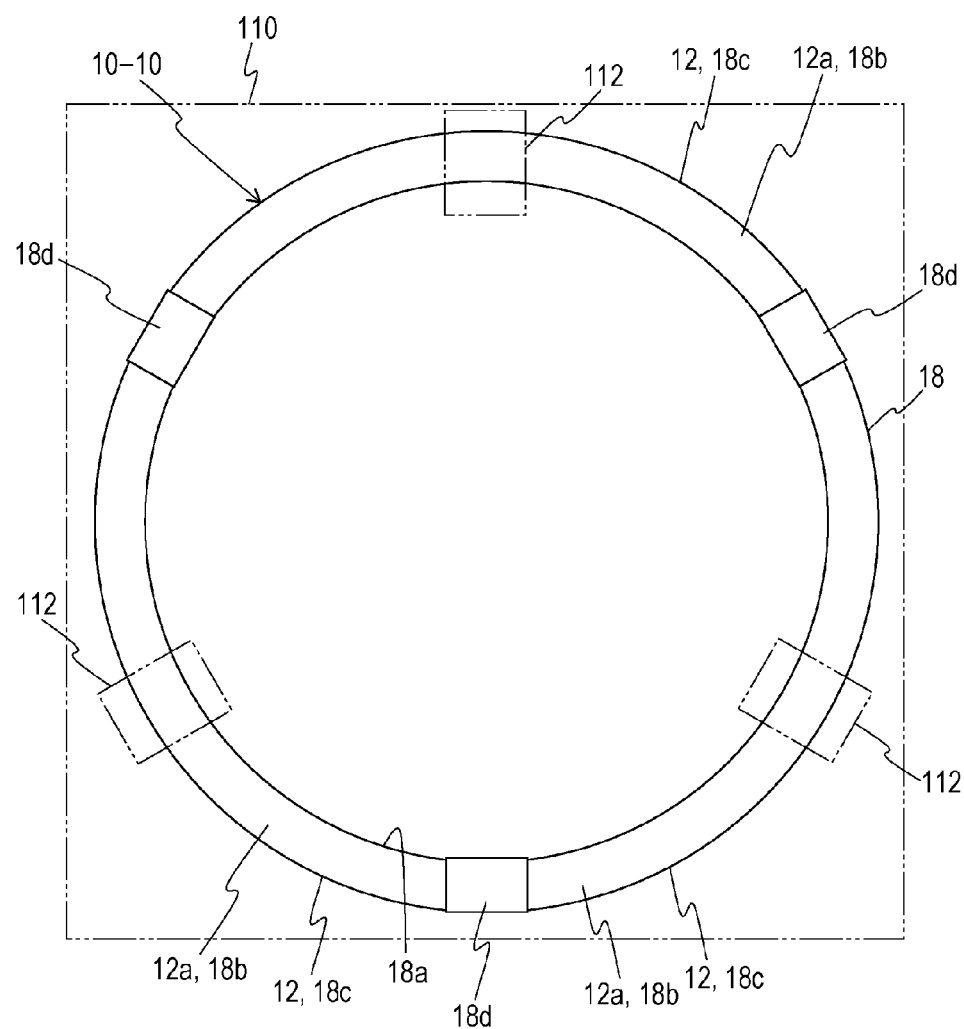
FIG. 11B is a tenth bottom view illustrating the suction nozzle.

In a tenth suction nozzle 10-10 illustrated in FIGS. 11A and 11B, the electrically conductive elastic bodies 12a, which are the example of the projecting portions of the nozzle electrodes 12, are added to the ninth suction nozzle 10-9 illustrated in FIGS. 10A and 10B.

The elastic bodies 12a function as the projecting portions that project from the suction surfaces 18b of the nozzle main body 18. The elastic bodies 12a are formed of an electrically conductive rubber disposed, for example, over the entirety of the contact portions of the nozzle electrodes 12 to be brought into contact with the first component electrodes 112. The elastic bodies 12a may constitute the entire nozzle electrodes 12. In this case, the elastic bodies 12a are electrically connected to the electrically conductive members 18c.

Figure 12B:
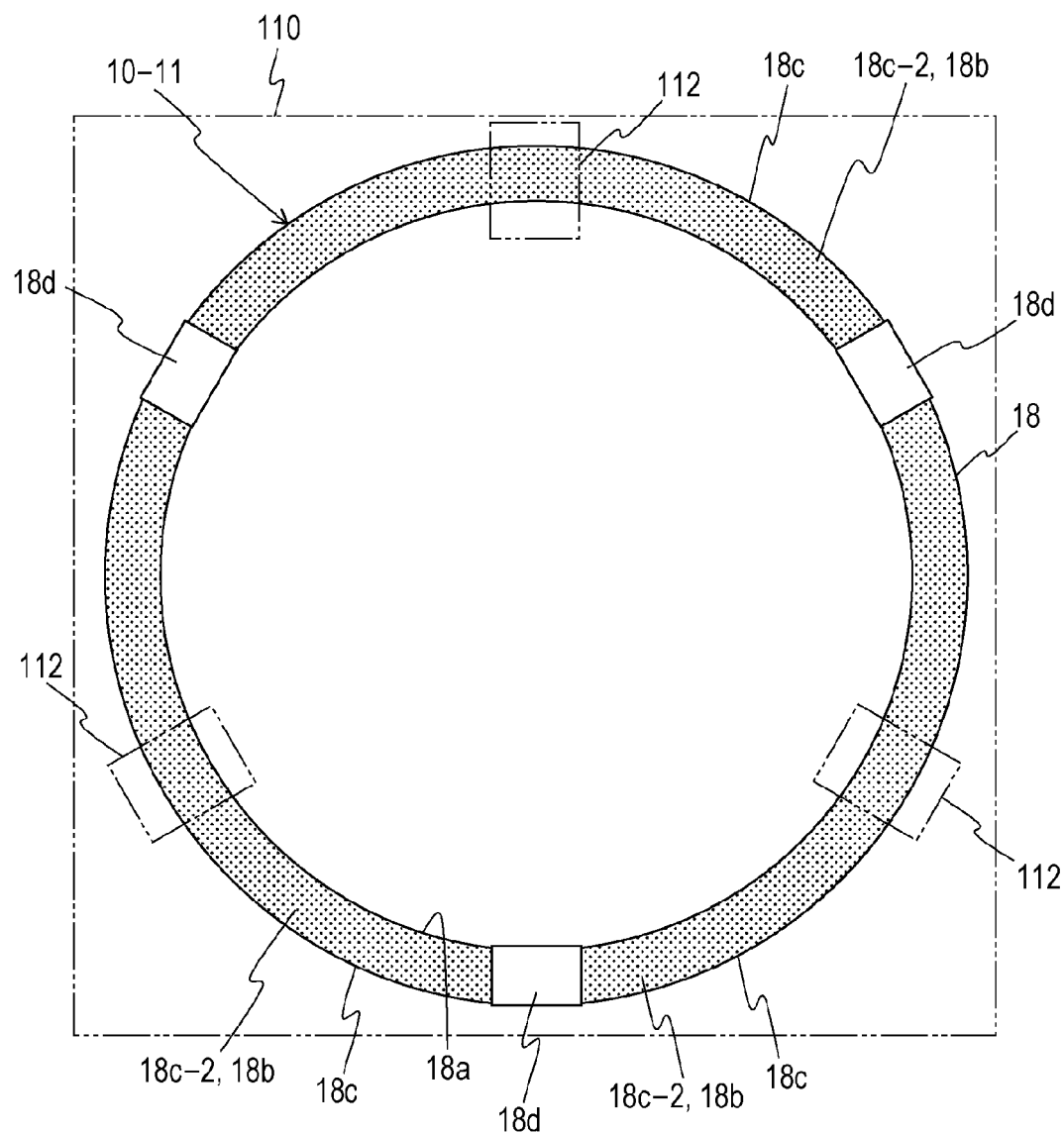
FIG. 12B is an eleventh bottom view illustrating the suction nozzle.

An eleventh suction nozzle 10-11 illustrated in FIGS. 12A and 12B includes nozzle electrodes 18c-2, which function as the projecting portions, instead of the nozzle electrodes 18c-1 of the electrically conductive members 18c of the eighth suction nozzle 10-8 illustrated in FIGS. 9A and 9B.

The nozzle electrodes 18c-2 are the tips of the electrically conductive members 18c. In the nozzle electrodes 18c-2, contact portions to be brought into contact with the first component electrodes 112 each have irregularities. The nozzle electrodes 18c-2 each include, for example, a plurality of projecting pieces having a tapered shape or a needle shape.

Figure 13B:
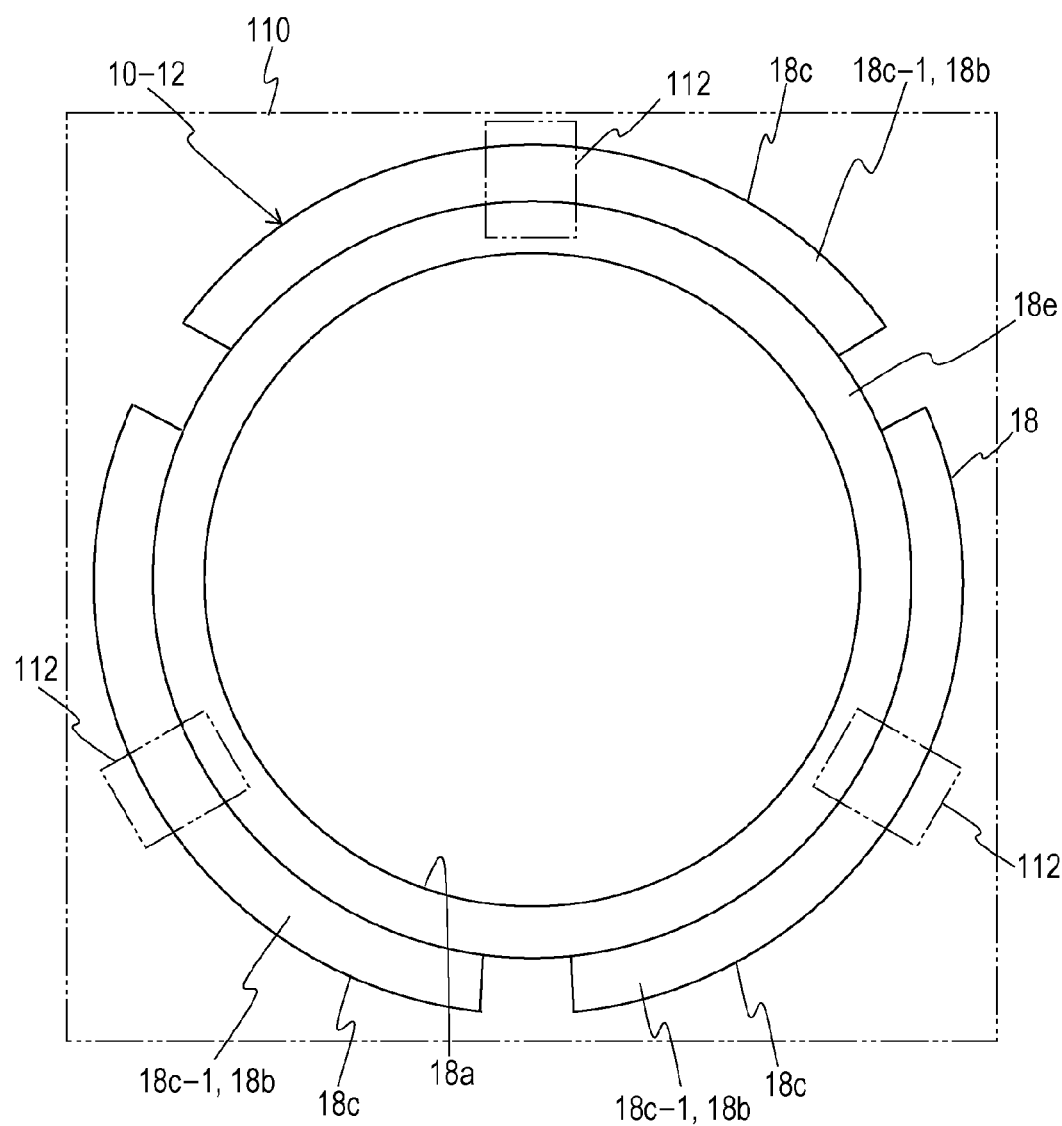
FIG. 13B is a twelfth bottom view illustrating the suction nozzle.

A twelfth suction nozzle 10-12 illustrated in FIGS. 13A and 13B includes a single electrically non-conductive cylindrical connecting member 18e instead of the plurality of electrically non-conductive connecting members 18d of the eighth suction nozzle 10-8 illustrated in FIGS. 9A and 9B.

The connecting member 18e has a cylindrical shape that surrounds the suction hole 18a. The above-described, for example, three electrically conductive members 18c are disposed, for example, on an outer peripheral surface of the connecting member 18e. Thus, the connecting member 18e is connected to, for example, three electrically conductive members 18c. Alternatively, the plurality of electrically conductive members 18c may be disposed on an inner peripheral surface of the connecting member 18e.

Similarly to the plurality of connecting members 18d of the eighth suction nozzle 10-8 illustrated in FIGS. 9A and 9B, the connecting member 18e is recessed relative to the nozzle electrodes 18c-1 of the electrically conductive members 18c.

Figure 14B:
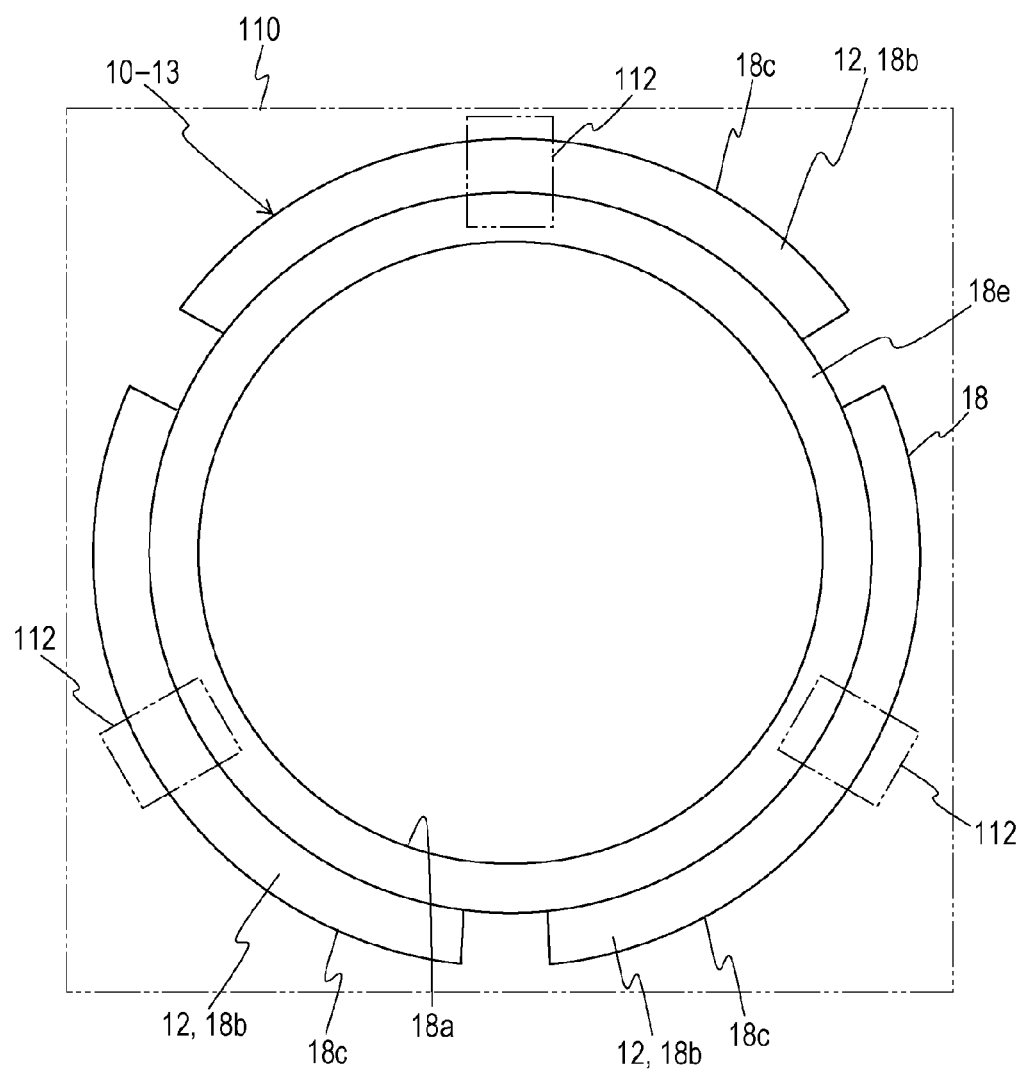
FIG. 14B is a thirteenth bottom view illustrating the suction nozzle.

In a thirteenth suction nozzle 10-13 illustrated in FIGS. 14A and 14B, the nozzle electrodes 12 are added to the twelfth suction nozzle 10-12 illustrated in FIGS. 13A and 13B.

The nozzle electrodes 12 are disposed over the entirety of the contact portions of the suction surfaces 18b of the electrically conductive members 18c to be brought into contact with the first component electrodes 112. The nozzle electrodes 12 may be partly disposed on the respective suction surfaces 18b of the electrically conductive members 18c.

Figure 15B:
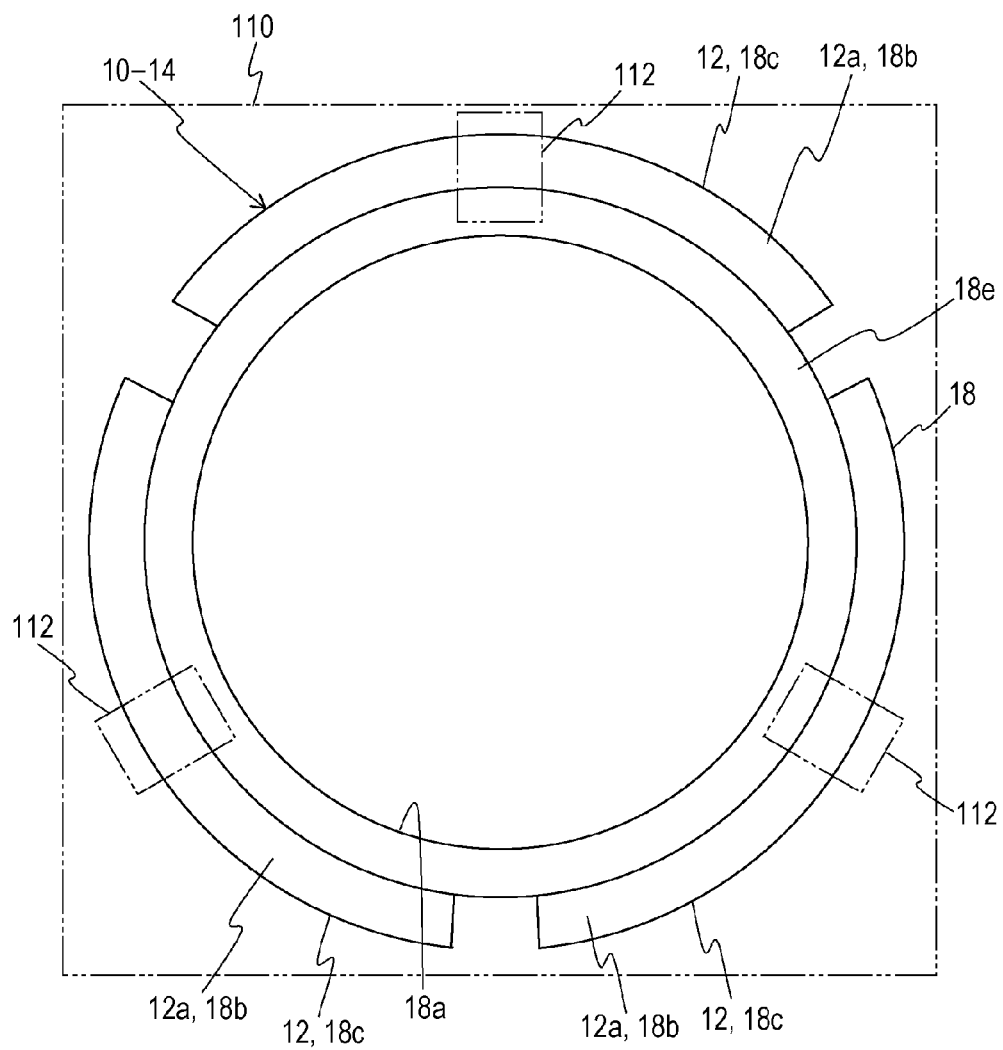
FIG. 15B is a fourteenth bottom view illustrating the suction nozzle.

In a fourteenth suction nozzle 10-14 illustrated in FIGS. 15A and 15B, the electrically conductive elastic bodies 12a, which are the example of the projecting portions of the nozzle electrodes 12, are added to the thirteenth suction nozzle 10-13 illustrated in FIGS. 14A and 14B.

The elastic bodies 12a function as the projecting portions that project from the suction surfaces 18b of the nozzle main body 18. The elastic bodies 12a are formed of an electrically conductive rubber disposed, for example, over the entirety of the contact portions of the nozzle electrodes 12 to be brought into contact with the first component electrodes 112. The elastic bodies 12a may constitute the entire nozzle electrodes 12. In this case, the elastic bodies 12a are electrically connected to the electrically conductive members 18c.

A fifteenth suction nozzle 10-15 illustrated in FIGS. 16A and 16B includes the nozzle electrodes 18c-2, which function as the projecting portions, instead of the nozzle electrodes 18c-1 of the electrically conductive members 18c of the twelfth suction nozzle 10-12 illustrated in FIGS. 13A and 13B.

The nozzle electrodes 18c-2 are the tips of the electrically conductive members 18c. In the nozzle electrodes 18c-2, the contact portions to be brought into contact with the first component electrodes 112 each have irregularities. The nozzle electrodes 18c-2 each include, for example, a plurality of projecting pieces having a tapered shape or a needle shape.

Figure 17B:
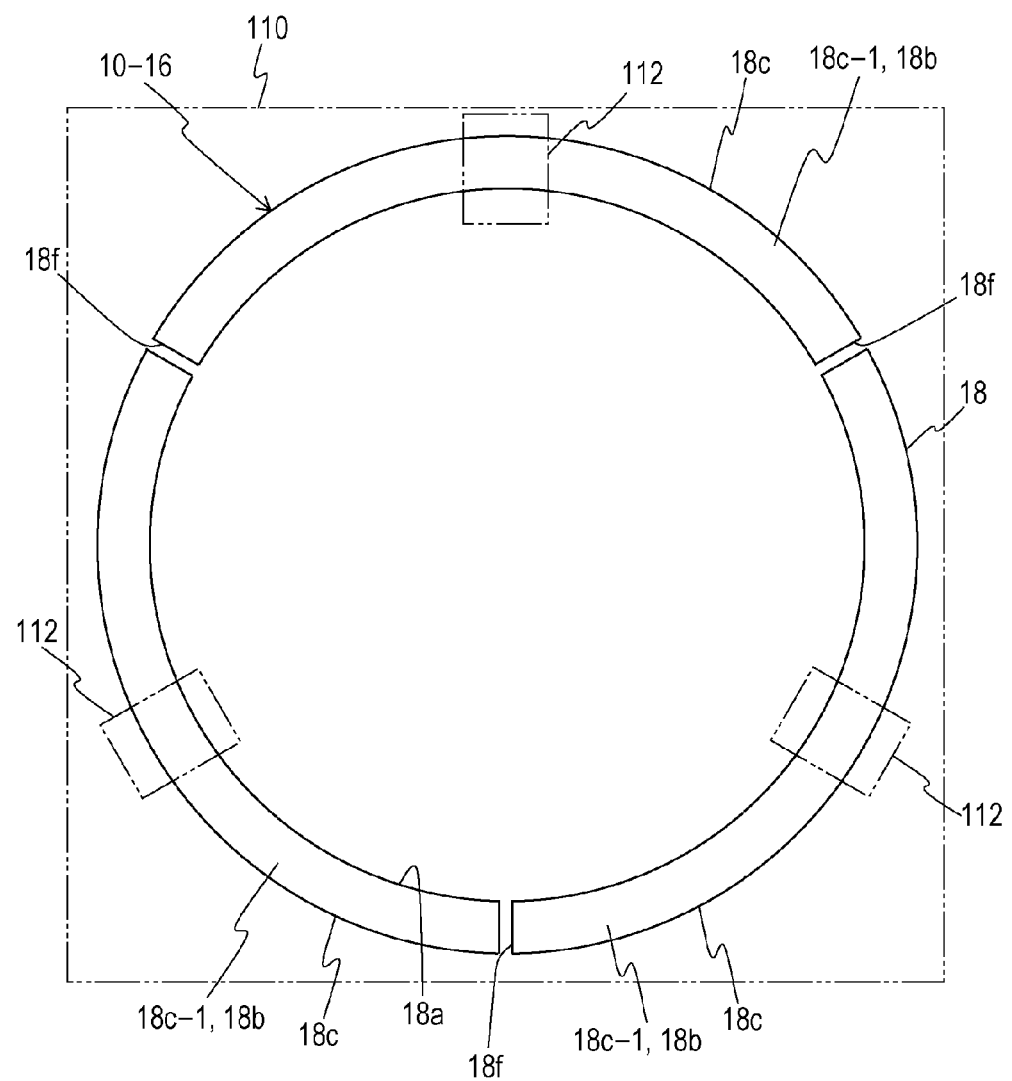
FIG. 17B is a sixteenth bottom view illustrating the suction nozzle.

In a sixteenth suction nozzle 10-16 illustrated in FIGS. 17A and 17B, for example, the three electrically conductive members 18c of the eighth suction nozzle 10-8 illustrated in FIGS. 9A and 9B are spaced apart from one another with gaps 18f formed therebetween.

The three electrically conductive members 18c are each secured to the placement apparatus main body 20 illustrated in FIG. 1. Although the width of the gaps 18f is determined in consideration of a suction force of the suction device, the diameter of the suction hole 18a, and the like, the width of the gaps 18f may be, for example, equal to or more than several μm. The three electrically conductive members 18c and the gaps 18f are arranged to collectively form a cylindrical shape that surrounds the suction hole 18a.

Figure 18A:
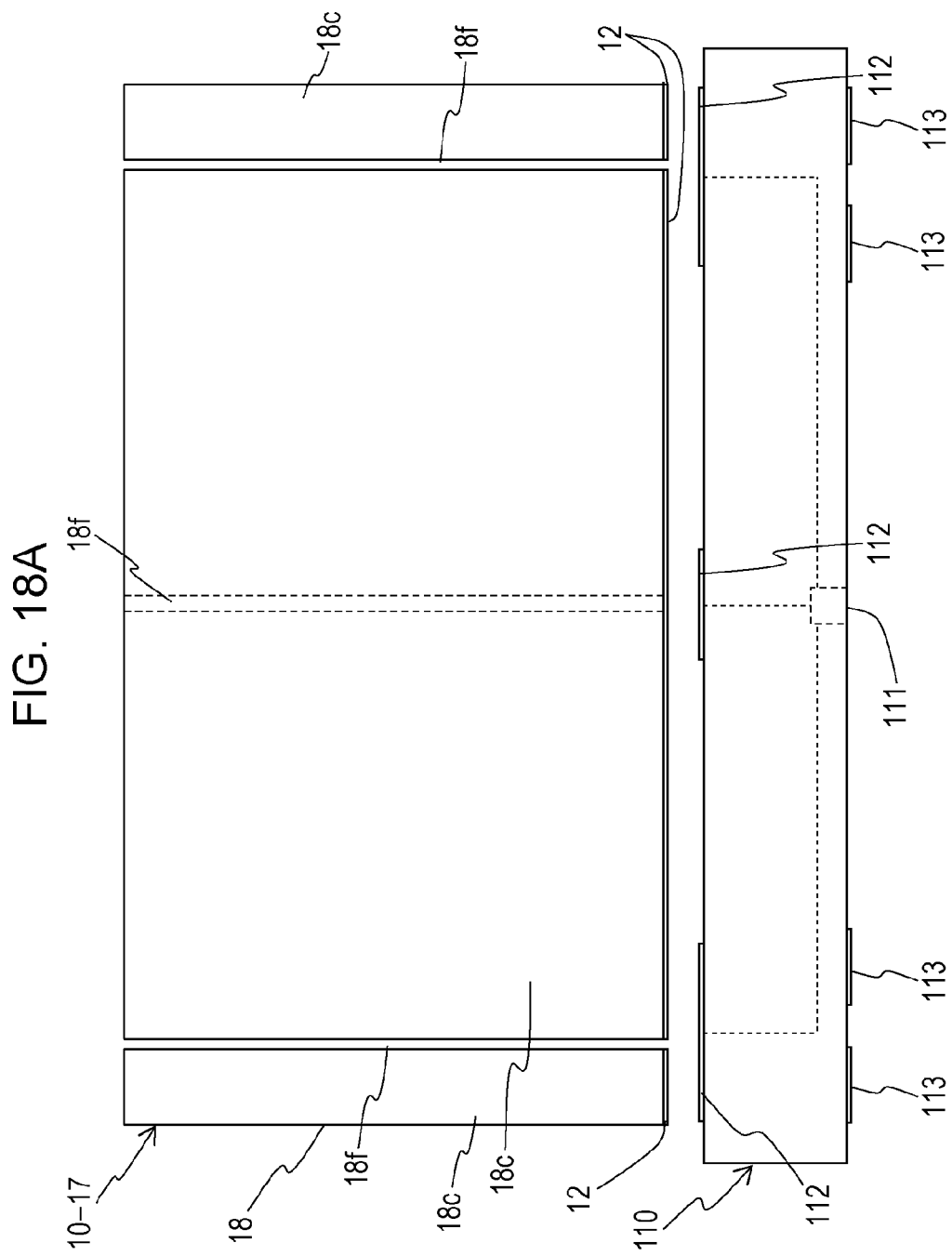
FIG. 18A is a seventeenth side view illustrating a suction nozzle and the optical component.
Figure 18B:
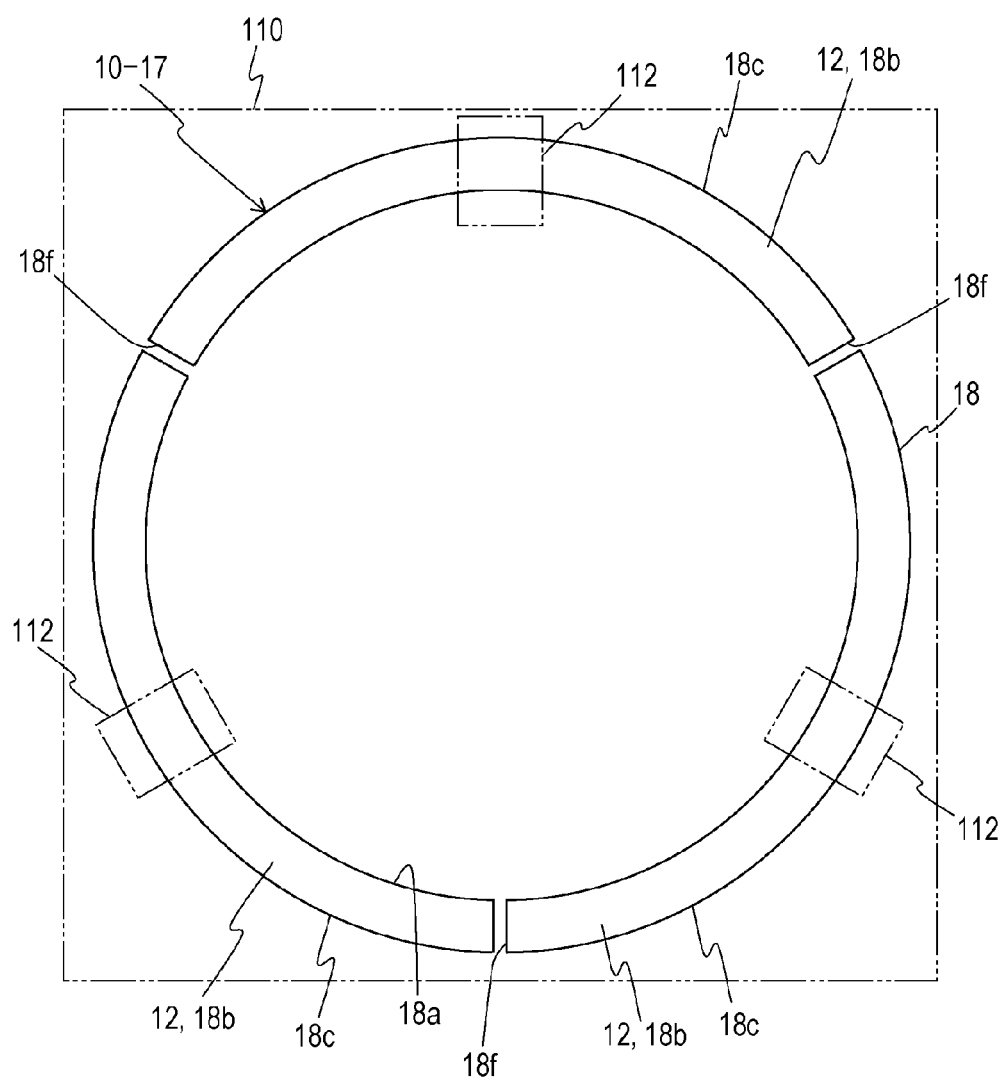
FIG. 18B is a seventeenth bottom view illustrating the suction nozzle.

In a seventeenth suction nozzle 10-17 illustrated in FIGS. 18A and 18B, the nozzle electrodes 12 are added to the sixteenth suction nozzle 10-16 illustrated in FIGS. 17A and 17B.

The nozzle electrodes 12 are disposed over the entirety of the contact portions of the suction surfaces 18b of the electrically conductive members 18c to be brought into contact with the first component electrodes 112. The nozzle electrodes 12 may be partly disposed on the respective suction surfaces 18b of the electrically conductive members 18c.

Figure 19B:
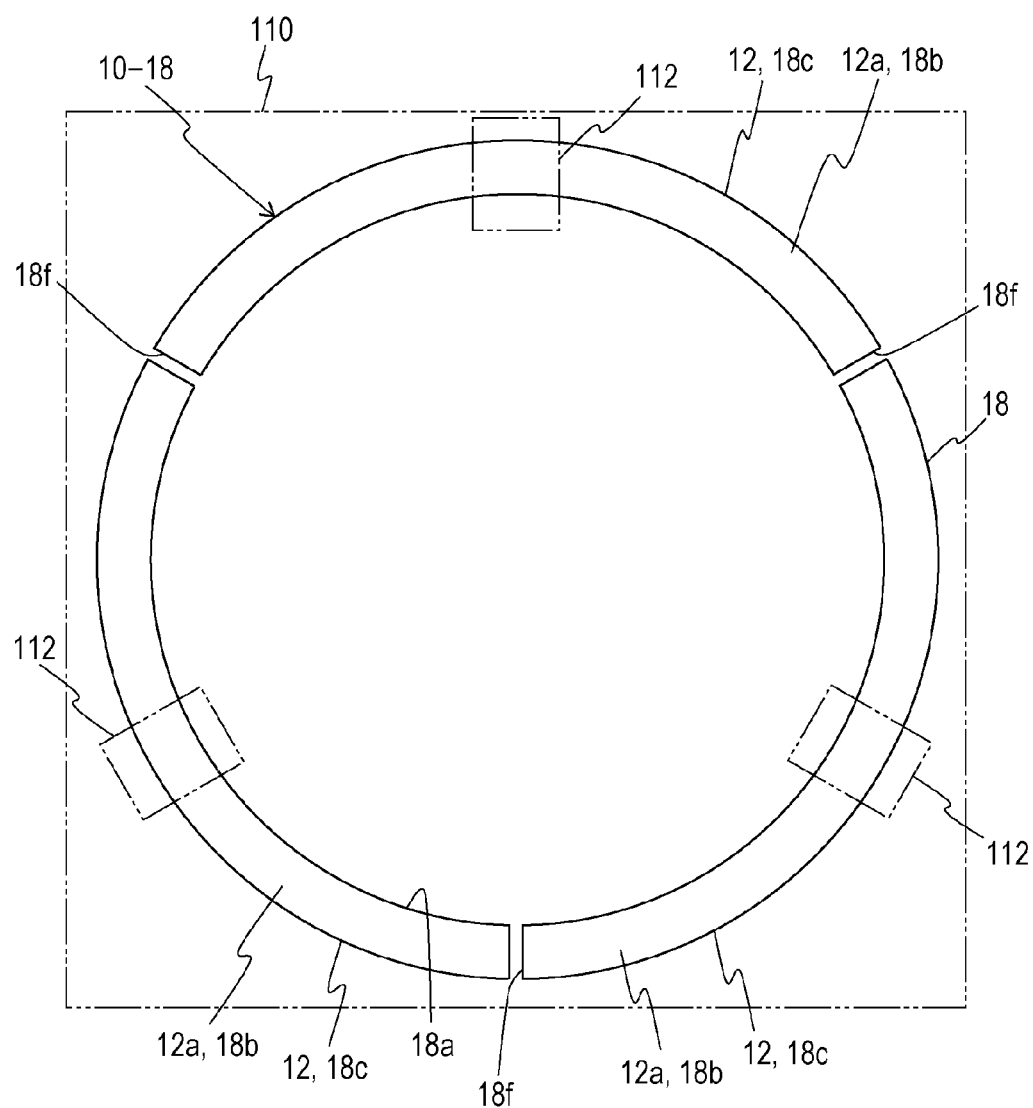
FIG. 19B is an eighteenth bottom view illustrating the suction nozzle.

In an eighteenth suction nozzle 10-18 illustrated in FIGS. 19A and 19B, the electrically conductive elastic bodies 12a, which are the example of the projecting portions of the nozzle electrodes 12, are added to the seventeenth suction nozzle 10-17 illustrated in FIGS. 18A and 18B.

The elastic bodies 12a function as the projecting portions that project from the suction surfaces 18b of the nozzle main body 18. The elastic bodies 12a are formed of an electrically conductive rubber disposed, for example, over the entirety of the contact portions of the nozzle electrodes 12 to be brought into contact with the first component electrodes 112. The elastic bodies 12a may constitute the entire nozzle electrodes 12. In this case, the elastic bodies 12a are electrically connected to the electrically conductive members 18c.

Figure 20B:
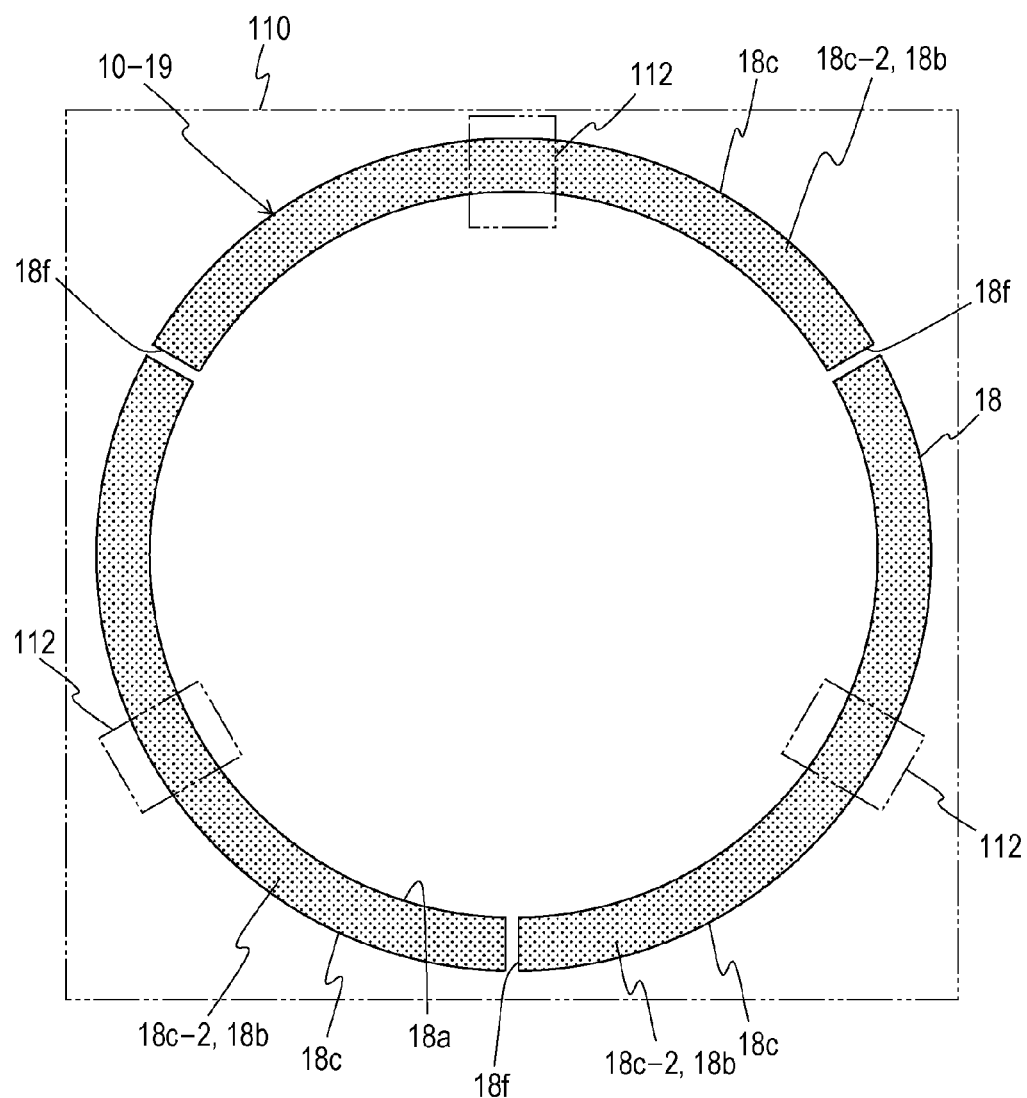
FIG. 20B is a nineteenth bottom view illustrating the suction nozzle.

A nineteenth suction nozzle 10-19 illustrated in FIGS. 20A and 20B includes the nozzle electrodes 18c-2, which function as projecting portions, instead of the nozzle electrodes 18c-1 of the sixteenth suction nozzle 10-16 illustrated in FIGS. 17A and 17B.

The nozzle electrodes 18c-2 are the tips of the electrically conductive members 18c. In the nozzle electrodes 18c-2, the contact portions to be brought into contact with the first component electrodes 112 each have irregularities. The nozzle electrodes 18c-2 each include, for example, a plurality of projecting pieces having a tapered shape or a needle shape.

Figure 24:
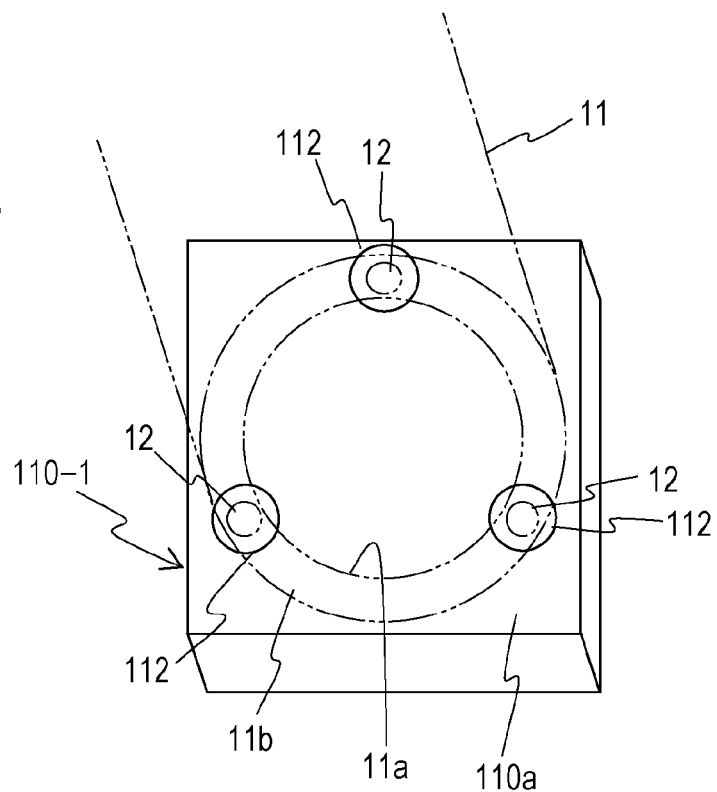
FIG. 24 is a first perspective view of a first surface of the optical component.

FIG. 24 is a perspective view illustrating the first surface 110a of a first optical component 110-1.

Figure 25:
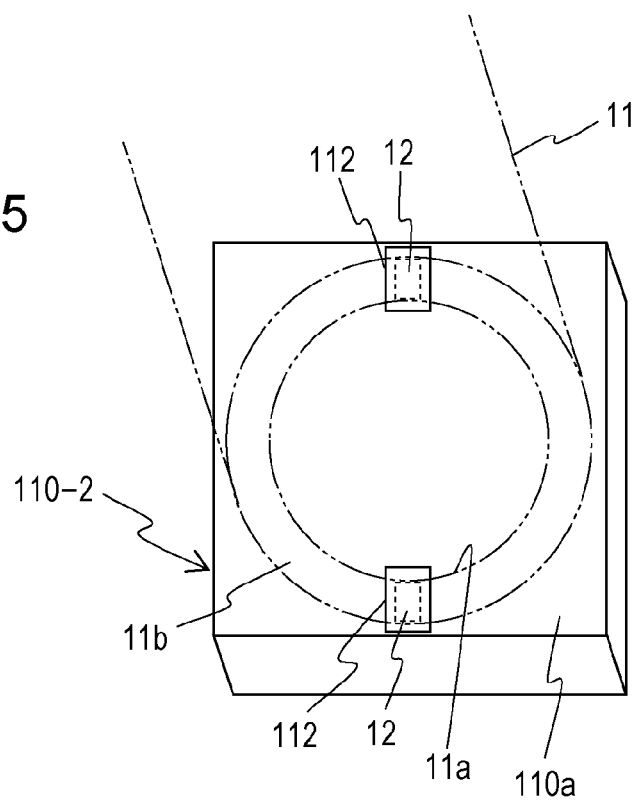
FIG. 25 is a second perspective view of the first surface of the optical component.

FIG. 25 is a perspective view illustrating the first surface 110a of a second optical component 110-2.

The two-dot chain lines in FIGS. 24 and 25 represent the nozzle main body 11 having the suction hole 11a and the nozzle electrodes 12 disposed on the suction surface 11b.

In the first optical component 110-1 illustrated in FIG. 24, as mentioned before, three first component electrodes 112 are disposed on the first surface 110a. The three first component electrodes 112 are each brought into contact with a corresponding one of the three nozzle electrodes 12 so as to establish electrical conduction between each of the three nozzle electrodes 12 and a corresponding one of the three first component electrodes 112.

In the second optical component 110-2 illustrated in FIG. 25, two first component electrodes 112 are disposed on the first surface 110a. The two first component electrodes 112 are each brought into contact with a corresponding one of the two nozzle electrodes 12. The two nozzle electrodes 12, between which a potential difference exits, are used for power supply. When there are two nozzle electrodes 12, the nozzle electrode 12 for power supply control is not provided. Thus, power is constantly supplied to the optical component 110 while the optical component 110 is being sucked.

Figure 26:
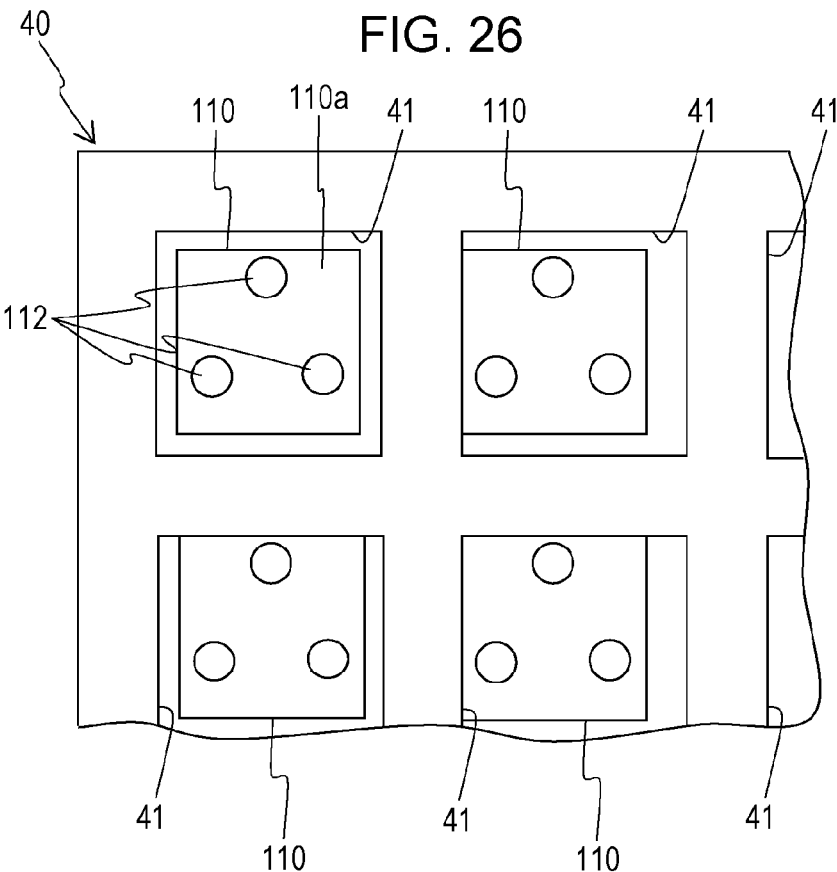
FIG. 26 is a plan view illustrating a tray that contains the optical components.

FIG. 26 is a plan view illustrating a tray 40 that contains the optical components 110.

Figure 27:
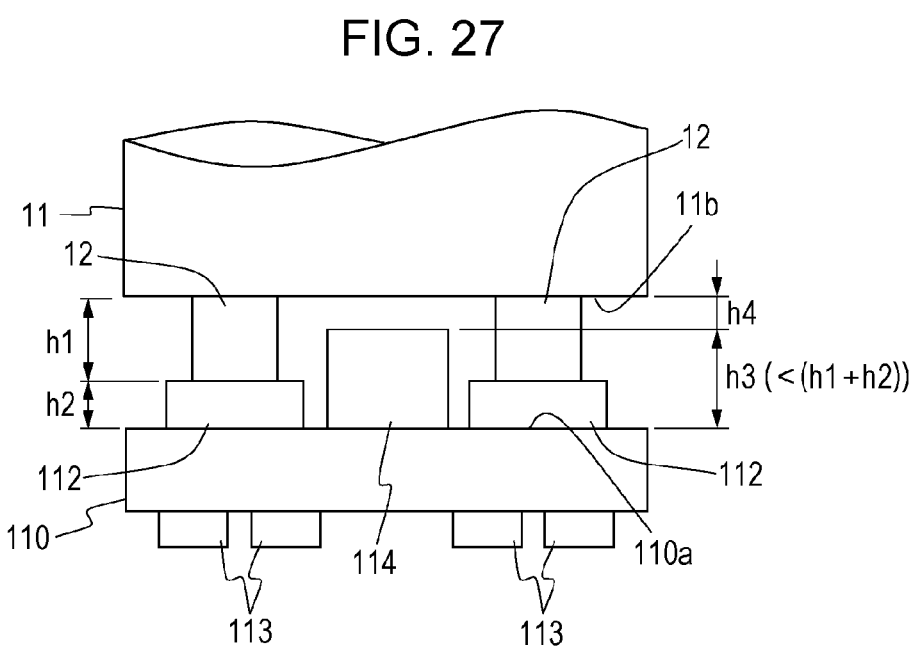
FIG. 27 is a first front view illustrating the nozzle electrodes and the first component electrodes.
Figure 28:
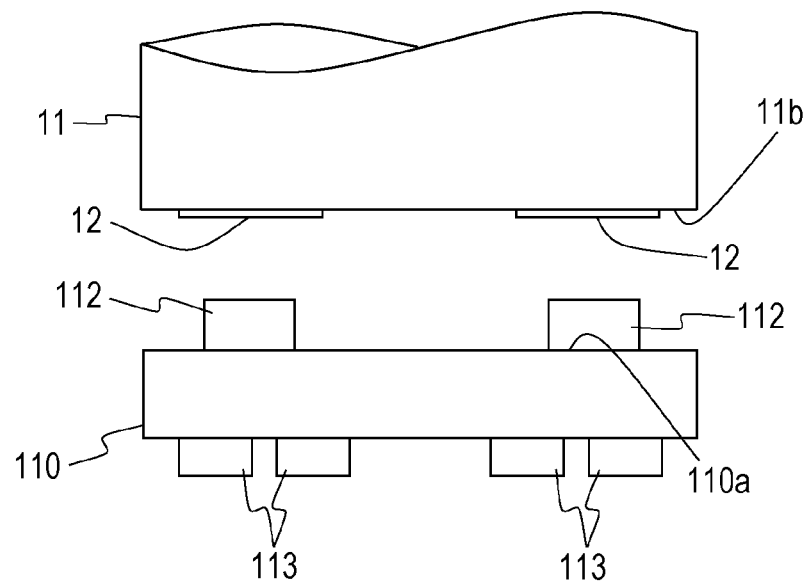
FIG. 28 is a second front view illustrating the nozzle electrodes and the first component electrodes.
Figure 29:
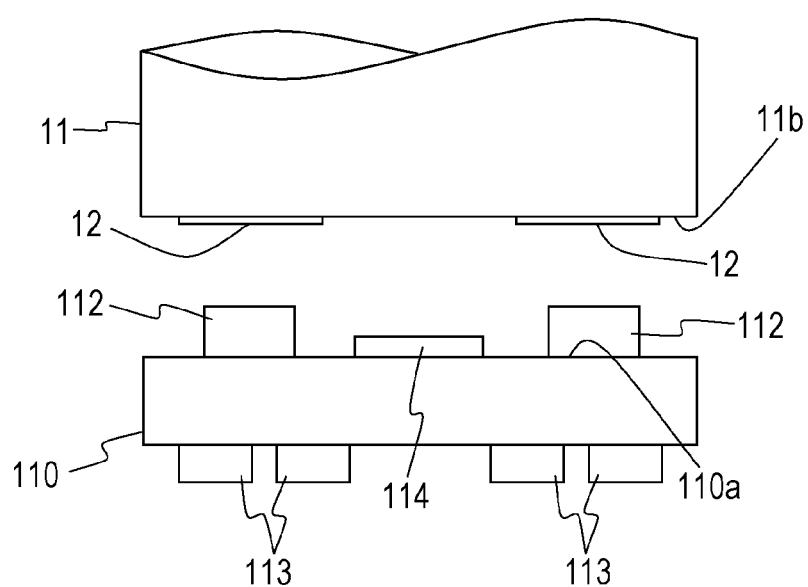
FIG. 29 is a third front view illustrating the nozzle electrodes and the first component electrodes.

FIGS. 27 to 29 are front views illustrating the nozzle electrodes 12 and the first component electrodes 112.

The placement apparatus 1 illustrated in FIG. 1 sucks the optical components 110 contained in, for example, the tray 40 illustrated in FIG. 26. The tray 40 has a plurality of pockets 41 each defined by a recess. Each of the plurality of the pockets 41 contains the optical component 110.

When the optical component 110 is moved due to a gap in the pocket 41, a suction position at which the optical component 110 is sucked to the suction nozzle 10 is shifted. Since the suction position at which the optical component 110 is sucked to the suction nozzle 10 may be shifted as described above, it is desirable that the nozzle electrodes 12 and the first component electrodes 112 have sizes sufficient to accommodate a shift in suction position in a direction parallel to the direction of the first surface 110a of the optical component 110.

In an example illustrated in FIG. 27, the nozzle electrodes 12 project from the suction surface 11b. An insulator 114 is disposed on the first surface 110a of the optical component 110.

A projection height h3, by which the insulator 114 projects from the first surface 110a, is smaller than the sum of a projection height h1, by which the nozzle electrodes 12 project from the suction surface 11b, and a projection height h2, by which the first component electrodes 112 project from the first surface 110a.

With this structure, a gap of a height h4 may be formed between the insulator 114 and the suction surface 11b. Desirably, the areas of contact portions of the first component electrodes 112 are larger than the areas of the contact portions of the respective nozzle electrodes 12 so that the above-described shift in the suction position may be allowed.

The projecting portions that project from the first surface 110a of the first component electrodes 112 may include the elastic bodies 12a similarly to the nozzle electrodes 12. Alternatively, the contact portions of the first component electrodes 112 to be brought into contact with the nozzle electrodes 12 may have irregularities.

In examples illustrated in FIGS. 28 and 29, the nozzle electrodes 12 are, for example, plated portions, and accordingly, do not project from the suction surface 11b. In the example illustrated in FIG. 28, the insulator 114 illustrated in FIG. 27 is not provided on the first surface 110a of the optical component 110. In the example illustrated in FIG. 29, a projecting height of the insulator 114 by which the insulator 114 projects from the first surface 110a is lower than that of the example illustrated in FIG. 27.

The first component electrodes 112 project from the first surface 110a. Desirably, the areas of contact portions of the nozzle electrodes 12 are larger than the areas of the contact portions of the respective first component electrodes 112 so that the above-described shift in the suction position may be allowed.

FIGS. 30 to 34 illustrate steps of methods of producing the electronic device 101.

The methods of producing the electronic device 101 will be described below with reference to FIG. 1 and FIGS. 30 to 34. The suction nozzle 10 may be one of the first to nineteenth suction nozzles 10-1 to 10-19 illustrated in FIGS. 2A to 20B. Alternatively, the suction nozzle 10 may be a suction nozzle other than the suction nozzles 10-1 to 10-19 as long as the nozzle includes the nozzle main body 11 and the plurality of nozzle electrodes 12.

Figure 30:
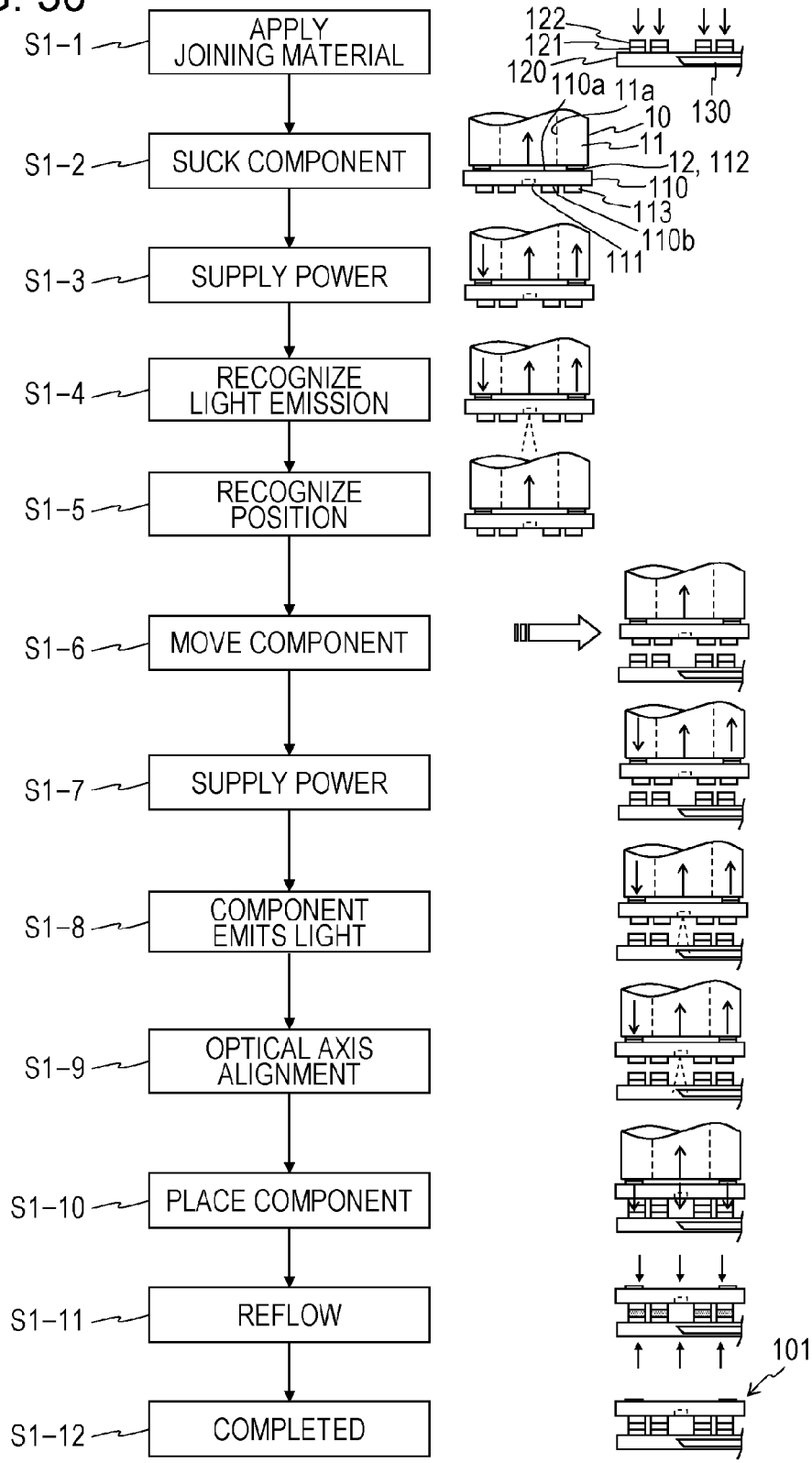
FIG. 30 is a first chart illustrating steps of a method of producing an electronic device.

Referring to FIG. 30, steps of the method of producing the electronic device 101 are described.

As illustrated in FIG. 30, the joining material 122 is initially applied to the board electrodes 121 disposed on the board 120 (step S1-1). As mentioned before, the optical waveguide 130 is placed on the board 120.

The first surface 110a is sucked to the suction nozzle 10, thereby the optical component 110 is sucked (step S1-2).

The plurality of nozzle electrodes 12 are each brought into contact with a corresponding one of the plurality of first component electrodes 112 disposed on the first surface 110a of the optical component 110 so as to establish electrical conduction between each of the plurality of nozzle electrodes 12 and a corresponding one of the plurality of first component electrodes 112. Thus, power is supplied to the optical component 110 only through the suction nozzle 10 (step S1-3).

The optical element 111 emits light when power is supplied thereto. The emitted light is detected by a detector for recognizing light emission (step S1-4). As mentioned before, the optical element 111 may be a light receiving element. In this case, the optical element 111 receives light instead of emitting light also in the following steps.

After the position of the optical component 110 has been recognized (step S1-5), the suction nozzle 10 is moved to a preset placement position of the optical component 110 (step S1-6).

Power is supplied again to the optical component 110 only through the suction nozzle 10 (step S1-7), and accordingly, the optical element 111 emits light (step S1-8).

The photodetector 30 illustrated in FIG. 1 detects the light emitted from the optical element 111 through the optical waveguide 130. Through a fine movement of the suction nozzle 10 toward a position where the amount of the light is large, optical axis alignment on the optical element 111 is performed. Thus, the placement position of the optical component 110 relative to the board 120 is adjusted (step S1-9).

The optical component 110 sucked to the suction nozzle 10 is placed on the board 120 (step S1-10) while each of the plurality of second component electrodes 113 disposed on the second surface 110b of the optical component 110 is in contact with a corresponding one of the plurality of board electrodes 121. Optical axis alignment performed on the optical element 111 (step S1-9) in accordance with the light emitted from the optical element 111 (step S1-8) is continued until the optical component 110 is placed on the board 120. Desirably, the placement apparatus 1 controls the height of the suction nozzle 10.

The suction nozzle 10 is moved away from a position where the suction nozzle 10 has placed the optical component 110, and the optical component 110 is transferred to, for example, a reflow oven. In the reflow oven, the joining material 122, which is, for example, solder paste, melts (step S1-11).

When the joining material 122 is solidified, the optical component 110 is secured to the board 120. Thus, the electronic device 101 is obtained (step S1-12).

Figure 31:
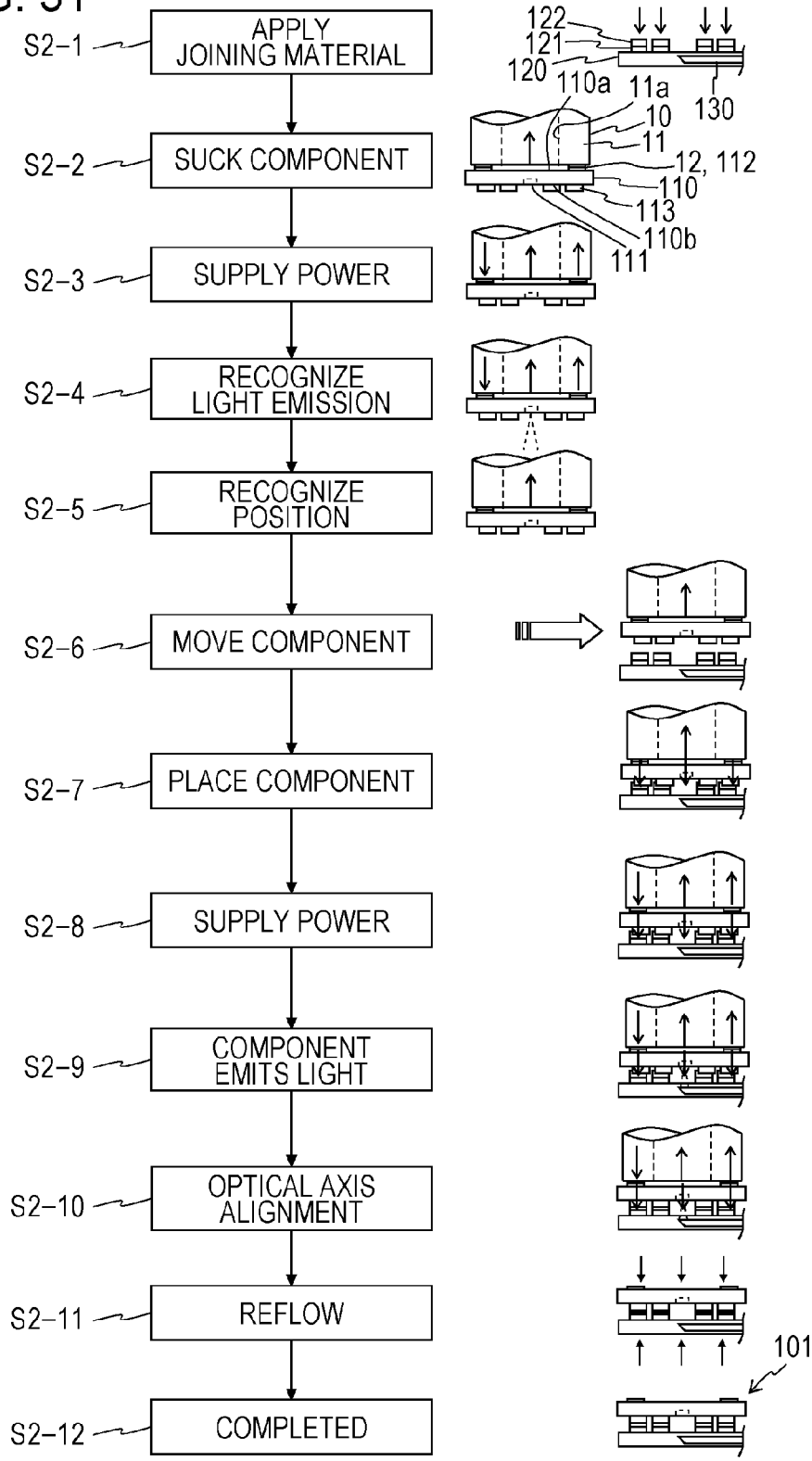
FIG. 31 is a second chart illustrating steps of a method of producing the electronic device.

Next, referring to FIG. 31, steps of the method of producing the electronic device 101 are described.

Steps S2-1 to S2-6 illustrated in FIG. 31 are similar to steps S1-1 to S1-6 illustrated in FIG. 30, and description thereof is omitted.

After the optical component 110 has been moved to the placement position (step S2-6), the optical component 110 sucked to the suction nozzle 10 is placed on the board 120 (step S2-7), while each of the plurality of second component electrodes 113 is in contact with a corresponding one of the plurality of board electrodes 121.

A load is applied to the optical component 110 in a direction toward the board 120 through the suction surface 11b of the suction nozzle 10. Desirably, the load is continued to be applied until optical axis alignment, which is to be performed later (step S2-10), is completed. In the case where the pitch of the first component electrodes 112 and the pitch of the nozzle electrodes 12 are small, bridging of pieces of the joining material 122, which is, for example, solder paste, may occur, and accordingly, a short-circuit may be caused between the pieces of the joining material 122 when the joining material 122 is heated (step S2-11). Heating of the joining material 122 will be described later. Thus, desirably, the placement apparatus 1 controls the load applied through the suction nozzle 10.

Power is supplied to the optical component 110 only through the suction nozzle 10 (step S2-8), and accordingly, the optical element 111 emits light (step S2-9).

By performing the above-described optical axis alignment on the optical element 111, the placement position of the optical component 110 relative to the board 120 is adjusted (step S2-10) while the optical component 110 is placed on the board 120.

The suction nozzle 10 is moved away from a position where the optical component 110 has been placed, and the optical component 110 is transferred to, for example, the reflow oven. In the reflow oven, the joining material 122, which is, for example, solder paste, melts (step S2-11). When the joining material 122 is solidified, the electronic device 101 is obtained (step S2-12).

Figure 32:
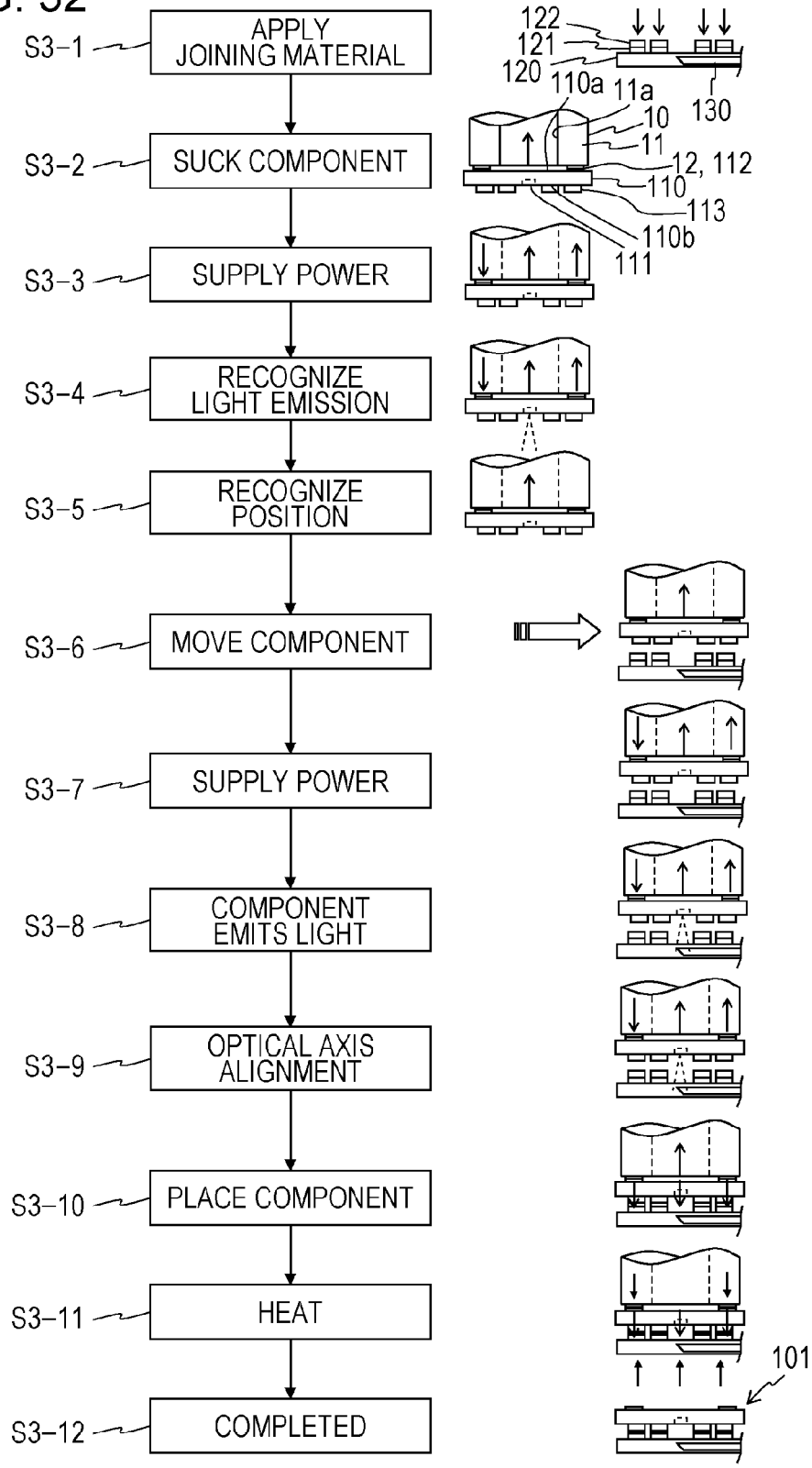
FIG. 32 is a third chart illustrating steps of a method of producing the electronic device.

Next, referring to FIG. 32, steps of the method of producing the electronic device 101 are described.

Steps S3-1 to S3-10 illustrated in FIG. 32 are similar to steps S1-1 to S1-10 illustrated in FIG. 30, and description thereof is omitted. In the method illustrated in any of FIGS. 32 to 34, a heating step (step S3-11, S4-11, or S5-10) is performed by the placement apparatus 1 instead of the reflow step (step S1-11 or S2-11) performed by the reflow oven. Examples of the placement apparatus 1 that performs the heating step include, for example, a flip chip bonder.

After the optical component 110 sucked to the suction nozzle 10 has been placed on the board 120 (step S3-10), the load is continued to be applied to the optical component 110 in a direction toward the board 120 through the suction surface 11b of the suction nozzle 10.

Next, the joining material 122 is heated (step S3-11) by heat conducted through, for example, the suction nozzle 10 or through a stage side, the stage being a stage on which the board 120 is positioned. This causes the joining material 122, which is, for example, solder paste, to melt. When the nozzle main body 11 of the suction nozzle 10 is electrically non-conductive, the nozzle main body 11 may be formed of, for example, a ceramic, a resin having a high thermal conductivity, or the like so as to conduct heat through the suction nozzle 10.

When the joining material 122 is solidified, the optical component 110 is secured to the board 120. Thus, the electronic device 101 is obtained (step S3-12).

Figure 33:
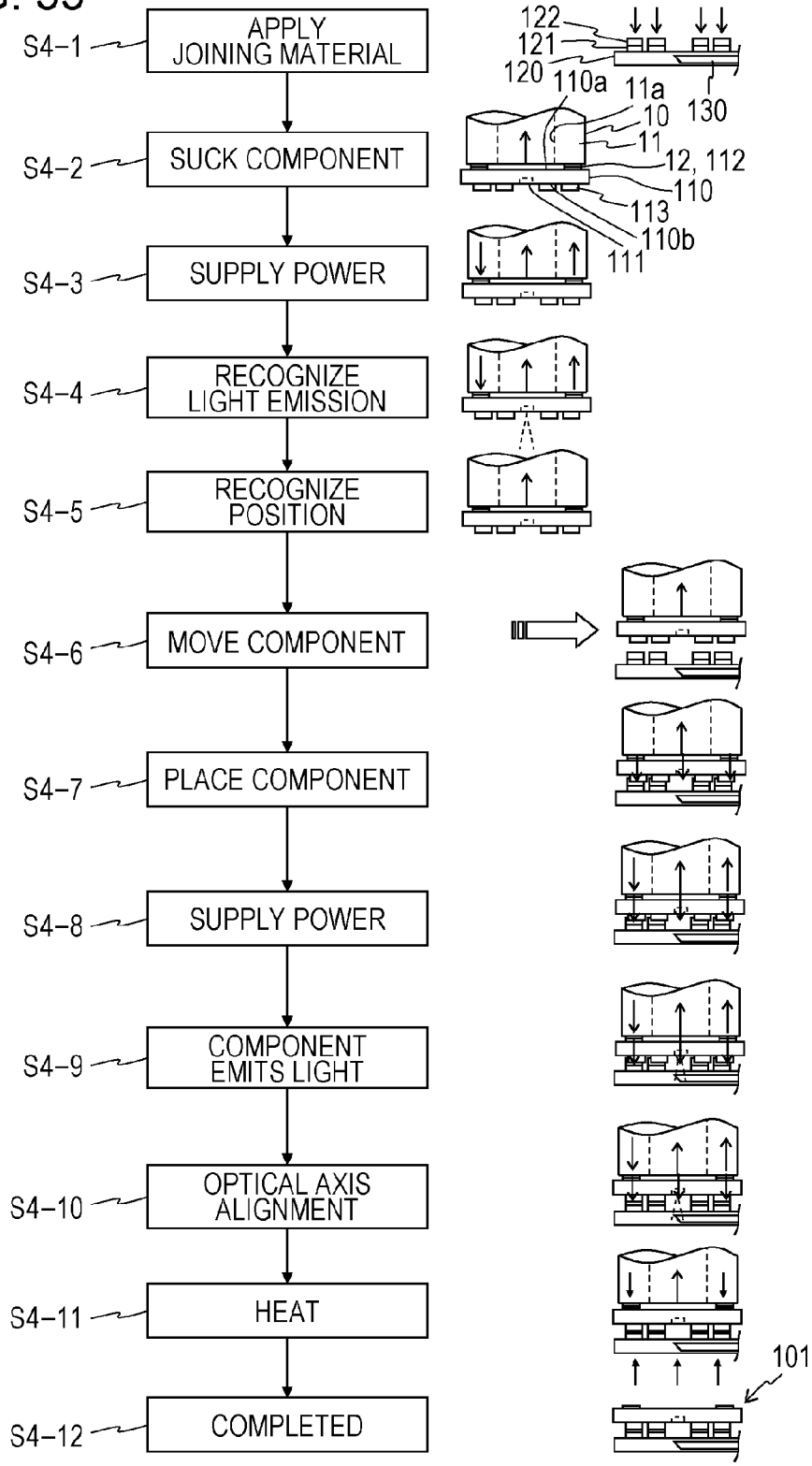
FIG. 33 is a fourth chart illustrating steps of a method of producing the electronic device.

Next, referring to FIG. 33, steps of the method of producing the electronic device 101 are described.

Steps S4-1 to S4-6 illustrated in FIG. 33 are similar to those in the methods of producing the electronic device 101 illustrated in FIGS. 30 to 32.

After the optical component 110 has been moved to the placement position (step S4-6), the optical component 110 sucked to the suction nozzle 10 is placed on the board 120 (step S4-7) while each of the plurality of second component electrodes 113 is in contact with a corresponding one of the plurality of board electrodes 121.

A load is applied to the optical component 110 in a direction toward the board 120 through the suction surface 11b of the suction nozzle 10. Desirably, the load is continued to be applied until optical axis alignment, which is to be performed later (step S4-10), is completed. Desirably, the placement apparatus 1 controls the load applied through the suction nozzle 10.

Power is supplied to the optical component 110 only through the suction nozzle 10 (step S4-8), and accordingly, the optical element 111 emits light (step S4-9).

By performing the above-described optical axis alignment on the optical element 111, the placement position of the optical component 110 relative to the board 120 is adjusted (step S4-10) while the load is applied to the optical component 110 in a direction toward the board 120.

The joining material 122 is heated (step S4-11) by heat conducted through the suction nozzle 10 or through a stage side, the stage being a stage on which the board 120 is positioned. This causes the joining material 122, which is, for example, solder paste, to melt.

When the joining material 122 is solidified, the optical component 110 is secured to the board 120. Thus, the electronic device 101 is obtained (step S4-12).

Figure 34:
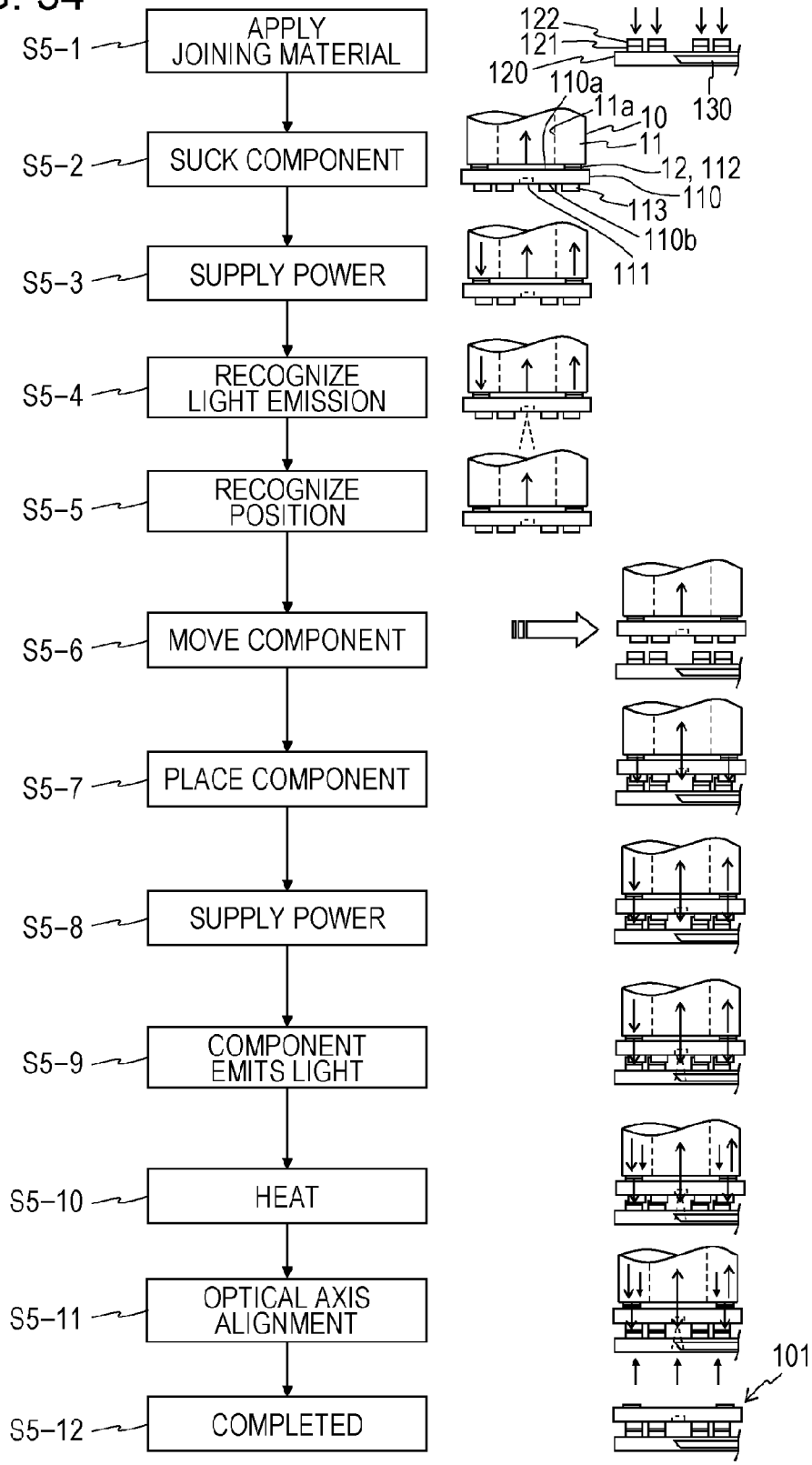
FIG. 34 is a fifth chart illustrating steps of a method of producing the electronic device.

Next, referring to FIG. 34, steps of the method of producing the electronic device 101 are described.

Steps S5-1 to S5-9 illustrated in FIG. 34 are similar to those in the method of producing the electronic device 101 illustrated in FIG. 33.

Before the optical axis alignment is performed on the optical element 111 (S5-11), the joining material 122 is heated (step S5-10) by heat conducted, for example, through the suction nozzle 10 or through the stage side, the stage being a stage on which the board 120 is positioned. This causes the joining material 122, which is, for example, solder paste, to melt.

After that, by performing optical axis alignment on the optical element 111, the placement position of the optical component 110 relative to the board 120 is adjusted (step S5-11) while the load is applied to the optical component 110 in a direction toward the board 120. Power supply to the optical component 110 (step S5-8) and light emission from the optical element 111 (step S5-9) may also be performed before heating the joining material 122 (S5-10).

When the joining material 122 is solidified, the optical component 110 is secured to the board 120. Thus, the electronic device 101 is obtained (step S5-12).

In the foregoing present embodiment, the plurality of nozzle electrodes 12 are disposed on the suction surface or surfaces 11b, 16b, 18b of the nozzle main body 11, 16, 18, and each brought into contact with a corresponding one of the plurality of first component electrodes 112 of the optical component 110 so as to establish electrical conduction between each of the plurality of nozzle electrodes 12 and a corresponding one of the plurality of first component electrodes 112. Thus, power may be supplied to the optical component 110.

Accordingly, power supply to the optical component 110 and suction of the optical component 110 may be performed only through the nozzle main body 11, 16, 18. Thus, while the size of the optical component 110 is decreasing, a suction area of the optical component 110 may be reliably allocated. Furthermore, a suction force may be applied to the optical component 110, and, when the optical component 110 is placed on the board 120, the horizontality of the optical component 110 may be reliably maintained by uniformly pressing the suction nozzle 10 against the optical component 110.

Thus, according to the present embodiment, when adjusting the placement position, the optical component 110 may be reliably sucked while the optical component 110 is emitting or receiving light. When power is supplied to the optical component 110 through a separate member other than the nozzle main body 11 (for example, probe), the suction area of the optical component 110 used to suck the optical component 110 to the nozzle main body 11 is not necessarily reliably allocated. Furthermore, when the separate member is brought into contact with the optical component 110, the sucked optical component 110 may be removed. In addition, operation in which the separate member is brought into contact with the optical component 110 takes time.

In some examples of the present embodiment, the plurality of nozzle electrodes 12, 15, 18-c2 include the projecting portions 12a that project from the suction surface or surfaces 11b, 16b, 18b of the nozzle main body 11, 16, 18. Thus, even when the optical component 110 warps, the nozzle electrodes 12, 15, 18c-2 may be reliably brought into contact with the first component electrodes 112 of the optical component 110.

In the present embodiment, the nozzle electrodes 12 include the electrically conductive elastic bodies 12a, which are the example of the projecting portions that project from the suction surface 11b. Thus, even when the optical component 110 warps, the nozzle electrodes 12, 15, 18c-2 may be more reliably brought into contact with the first component electrodes 112 of the optical component 110 due to the elastic bodies 12a projecting from the suction surface 11b and being compressed.

In some examples of the present embodiment, contact portions of the nozzle electrodes 15, 18c-2 that include projecting portions, the contact portions to be brought into contact with the first component electrodes 112 of the nozzle electrodes 15, 18c-2, have irregularities. Thus, electrical contact resistance of the nozzle electrodes 15, 18c-2 with the first component electrodes 112 may be reduced, and frictional forces generated between the nozzle electrodes 15, 18c-2 against the first component electrodes 112 may be increased.

In some examples of the present embodiment, the number of the plurality of nozzle electrodes 12, 15, 18c-1, 18c-2 are three. Thus, the nozzle electrodes 12, 15, 18c-1, 18c-2 and the first component electrodes 112 are easily positioned with respect to one another and brought into contact with one another.

In some examples of the present embodiment, the plurality of wires 13, 14, 17 are, for example, disposed in the electrically non-conductive nozzle main body 11, 16 and each electrically connected to a corresponding one of the plurality of nozzle electrodes 12, 15. Thus, the suction nozzle 10 may have a simple structure.

In some examples of the present embodiment, the plurality of wires 13 are disposed on the outer peripheral surface of the nozzle main body 11. Thus, the suction nozzle 10 may have a simpler structure.

In some examples of present embodiment, the plurality of through holes 11c of the nozzle main body 11 extend parallel to the suction hole 11a and open at the suction surface 11b. The plurality of wires 14 are inserted into the respective through holes 11c. Thus, the wires 14 may be simply formed.

In some examples of the present embodiment, the nozzle main body 16 includes the inner member 16c positioned radially outside the suction hole 16a and the outer member 16d positioned radially outside the inner member 16c. The plurality of wires 17 are disposed between the inner member 16c and the outer member 16d. Thus, the wires 17 may be simply formed.

In some examples of the present embodiment, each of the plurality of electrically conductive members 18c of the nozzle main body 18 is electrically connected to a corresponding one of the plurality of nozzle electrodes 12, 18c-1, 18c-2. Thus, the suction nozzle 10 may have a simple structure.

In some examples of the present embodiment, the plurality of connecting members 18d of the nozzle main body 18 are disposed between the plurality of the electrically conductive members 18c, thereby connecting the plurality of electrically conductive members 18c to each other. The plurality of electrically conductive members 18c and the plurality of connecting members 18d are arranged to collectively form a cylindrical shape that surrounds the suction hole 18a. Thus, the nozzle main body 18 may have a simple structure.

In some examples of the present embodiment, the electrically non-conductive connecting member 18e of the nozzle main body 18 surrounds the suction hole 18a and connects the plurality of electrically conductive members 18c to one another. Thus, the nozzle main body 18 may be simply formed.

In some examples of the present embodiment, the plurality of electrically conductive members 18c are spaced apart from one another with the gaps 18f formed therebetween. Thus, the electrically non-conductive connecting members 18d, 18e may be omitted, and accordingly, the nozzle main body 18 may have a simple structure.

In some examples of the present embodiment, the first surface 110a of the optical component 110 is sucked to the suction nozzle 10 that includes the nozzle main body 11 having the suction surface 11b and the plurality of nozzle electrodes 12 disposed on the suction surface 11b. The plurality of nozzle electrodes 12 are each brought into contact with a corresponding one of the plurality of first component electrodes 112 disposed on the first surface 110a of the optical component 110 so as to establish electrical conduction between each of the plurality of nozzle electrodes 12 and a corresponding one of the plurality of first component electrodes 112. Thus, the optical component 110 emits or receives light at the second surface 110b. The placement position of the optical component 110 relative to the board 120 is adjusted while the optical component 110 is emitting or receiving the light. The optical component 110 is secured to the board 120 while each of the plurality of second component electrodes 113 disposed on the second surface 110b of the optical component 110 is in contact with a corresponding one of the plurality of board electrodes 121. Thus, during adjustment of the placement position, the optical component 110 may be reliably sucked while the optical component 110 is emitting or receiving the light, and placement accuracy of the optical component 110 relative the board 120 may be improved.

In some examples of the present embodiment, when the optical component 110 is secured to the board 120, the joining material 122 in contact with the optical component 110 and the board 120 is solidified. The placement position is adjusted in a state in which a load is applied to the optical component 110 through the suction surface 11b in a direction toward the board 120 while the joining material 122 is in contact with the optical component 110 and the board 120 and before the joining material 122 is solidified. Thus, the placement accuracy of the optical component 110 relative the board 120 may be further improved.

In some examples of the present embodiment, the first component electrodes 112 include the projecting portions that project from the second surface 110b. Thus, even when the optical component 110 warps, the nozzle electrodes 12, 15, 18c-2 may be reliably brought into contact with the first component electrodes 112 of the optical component 110.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A placement apparatus for an optical component, comprising:
    a suction nozzle that includes
        a nozzle main body having a suction surface having a suction port, an optical component being sucked to the suction port,
        a plurality of nozzle electrodes disposed on the suction surface, each of the nozzle electrodes being brought into contact with a corresponding one of a plurality of component electrodes provided on the optical component so as to establish electrical conduction between each of the plurality of nozzle electrodes and a corresponding one of the plurality of component electrodes.

2. The placement apparatus for an optical component according to claim 1,
    wherein the plurality of nozzle electrodes include projecting portions that project from the suction surface of the nozzle main body.

3. The placement apparatus for an optical component according to claim 2,
    wherein the projecting portions are electrically conductive elastic bodies.

4. The placement apparatus for an optical component according to claim 2,
    wherein the projecting portions have contact portions to be brought into contact with the component electrodes, the contact portions having irregularities.

5. The placement apparatus for an optical component according to claim 1,
    wherein the plurality of nozzle electrodes include three nozzle electrodes.

6. The placement apparatus for an optical component according to claim 1,
    wherein the suction nozzle further includes a plurality of wires disposed in the nozzle main body, the plurality of wires each being electrically connected to a corresponding one of the plurality of nozzle electrodes.

7. The placement apparatus for an optical component according to claim 6,
    wherein the plurality of wires are disposed on an outer peripheral surface of the nozzle main body.

8. The placement apparatus for an optical component according to claim 6,
    wherein the nozzle main body has a suction hole that extends to the suction port and a plurality of through holes that extend parallel to the suction hole and open at the suction surface, and
    wherein the plurality of wires are each inserted into a corresponding one of the plurality of through holes.

9. The placement apparatus for an optical component according to claim 6,
    wherein the nozzle main body has a suction hole that extends to the suction port,
    wherein the nozzle main body further includes an inner member positioned outside the suction hole, and an outer member positioned outside the inner member, and wherein the plurality of wires are disposed between the inner member and the outer member.

10. The placement apparatus for an optical component according to claim 1, wherein the nozzle main body further includes a plurality of electrically conductive members each electrically connected to a corresponding one of the plurality of nozzle electrodes.

11. The placement apparatus for an optical component according to claim 10, wherein the nozzle main body has a suction hole that extends to the suction port, wherein the nozzle main body further includes a plurality of electrically non-conductive connecting members, the plurality of connecting members being disposed between the plurality of electrically conductive members, the plurality of connecting members connecting the plurality of electrically conductive members to one another, and wherein the plurality of electrically conductive members and the plurality of connecting members are arranged to collectively form a cylindrical shape that surrounds the suction hole.

12. The placement apparatus for an optical component according to claim 10, wherein the nozzle main body has a suction hole that extends to the suction port, wherein the nozzle main body further includes an electrically non-conductive connecting member, the connecting member having a cylindrical shape that surrounds the suction hole, and the connecting member connecting the plurality of electrically conductive members to one another.

13. The placement apparatus for an optical component according to claim 10, the plurality of electrically conductive members are spaced apart from one another with gaps formed therebetween.

14. A suction nozzle for an optical component, comprising:

a nozzle main body having a suction surface having a suction port, an optical component being sucked to the suction port, and a plurality of nozzle electrodes disposed on the suction surface, each of the nozzle electrodes being brought into contact with a corresponding one of a plurality of component electrodes provided on the optical component so as to establish electrical conduction between each of the plurality of nozzle electrodes and a corresponding one of the component electrodes.

* * * * *